(12) United States Patent
Nakayama et al.

(10) Patent No.: US 6,998,939 B2
(45) Date of Patent: Feb. 14, 2006

(54) NOISE FILTER AND ELECTRONIC DEVICE USING NOISE FILTER

(75) Inventors: Shogo Nakayama, Miyazaki (JP); Takeshi Orita, Neyagawa (JP); Eiichi Uriu, Hirakata (JP); Kazuo Oishi, Hirakata (JP); Tomoyuki Washizaki, Miyazaki (JP); Koji Nishimura, Miyazaki-gun (JP); Kazutoshi Matsumura, Kobe (JP)

(73) Assignee: Matsushita Electric Industrial Co., Ltd., (JP)

( * ) Notice: Subject to any disclaimer, the term of this patent is extended or adjusted under 35 U.S.C. 154(b) by 409 days.

(21) Appl. No.: 10/220,700

(22) PCT Filed: Mar. 7, 2001

(86) PCT No.: PCT/JP01/01764

§ 371 (c)(1),
(2), (4) Date: Oct. 22, 2002

(87) PCT Pub. No.: WO01/67470

PCT Pub. Date: Sep. 13, 2001

(65) Prior Publication Data

US 2003/0134612 A1   Jul. 17, 2003

(30) Foreign Application Priority Data

| Mar. 8, 2000 | (JP) | ............................. 2000-062885 |
| Mar. 16, 2000 | (JP) | ............................. 2000-073837 |
| Mar. 23, 2000 | (JP) | ............................. 2000-081233 |

(51) Int. Cl.
  *H01H 7/00* (2006.01)
  *H01F 17/00* (2006.01)

(52) U.S. Cl. .................. 333/181; 333/185; 336/200

(58) Field of Classification Search ............ 333/181, 333/184, 185, 177; 336/200
See application file for complete search history.

(56) References Cited

U.S. PATENT DOCUMENTS

| 4,918,417 A | * | 4/1990 | Sakamoto | .................. 336/200 |
| 5,583,470 A | * | 12/1996 | Okubo | .................. 333/185 |
| 6,294,976 B1 | * | 9/2001 | Imada et al. | .................. 336/200 |
| 6,317,965 B1 | * | 11/2001 | Okamoto et al. | .......... 333/181 |

FOREIGN PATENT DOCUMENTS

| JP | 5-101950 | | 4/1993 |
| JP | 7-99123 | | 4/1995 |
| JP | 08138941 A | * | 5/1996 |
| JP | 8-148354 | | 6/1996 |
| JP | 08-335517 | | 12/1996 |
| JP | 11-214229 | | 8/1999 |

* cited by examiner

Primary Examiner—Seungsook Ham
(74) Attorney, Agent, or Firm—Steptoe & Johnson LLP

(57) ABSTRACT

Comprising a magnetic member 32 formed by laminating magnetic sheets 24, 28, 30, 31 a first impedance element 21 formed in the magnetic member 32, and a second impedance element 25 formed above the first impedance element 21, the first impedance element 21 includes a first normal impedance element 22 and a first common impedance element 23, and the second impedance element 25 includes a second common impedance element 26 and a second normal impedance element 27.

25 Claims, 32 Drawing Sheets

Normal mode

Common mode

First conductor

- 22a
- 22c
- 22b

Third conductor

- 26a
- 26c
- 26b

Second conductor

- 23c
- 23b
- 23a

Fourth conductor

- 27c
- 27b
- 27a

Pattern see-through diagram (first conductor and second conductor

- 22a
- 22c
- 22b, 23b
- 23a
- 23c

Pattern see-through diagram (third conductor and Fourth conductor

- 26a
- 26b, 27b
- 27c
- 27a
- 26c

TDMA carrier: 900MHz

Burst frequency 217Hz

Signal line

Noise filter

FIG. 20(a)
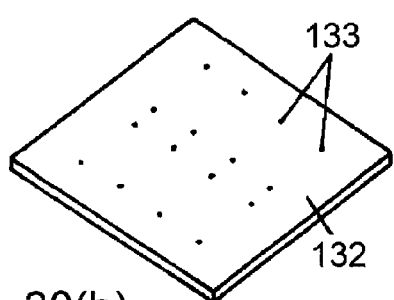
FIG. 20(b)
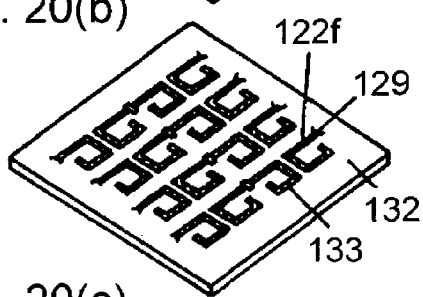
FIG. 20(c)
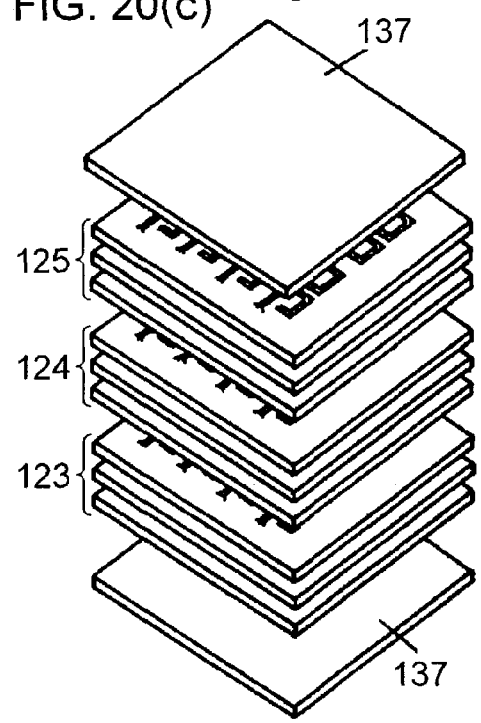
FIG. 20(d)
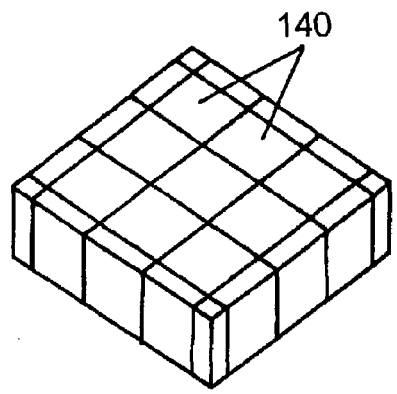
FIG. 20(e)
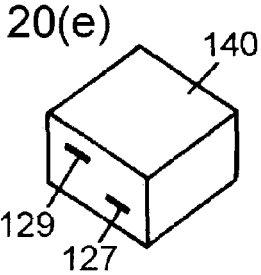
FIG. 20(f)
FIG. 20(g)
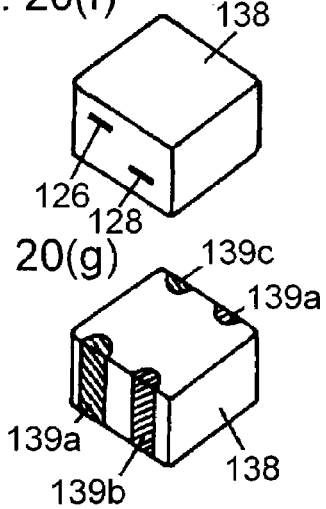

TDMA carrier: 900MHz

Burst frequency 217Hz

Signal line

Noise filter

NOISE FILTER AND ELECTRONIC DEVICE USING NOISE FILTER

TECHNICAL FIELD

The present invention relates to a noise filter used as noise countermeasure in cellular phone or other information devices, and an electronic device using this noise filter.

BACKGROUND ART

A conventional noise filter is disclosed, for example, in Japanese Laid-open Patent No. 8-335517.

FIG. 35 is a perspective exploded view of the conventional noise filter (laminated common mode choke coil). A first coil 1 and a second coil 2 formed above the first coil 1 are spirally formed, and made of silver.

An insulating sheet 3 is formed beneath the first coil 1, and is provided with two via holes 4, 5. A second insulating sheet 6 is formed between the first coil 1 and second coil 2, and is provided with one via hole 7. The first insulating sheet 3 and second insulating sheet 6 are made of insulating material such as polyimide.

A first external electrode 8 disposed at one end of the first coil 1, and a first via electrode 8a at other end of the first coil 1 are formed on the same plane as the first coil 1. A second external electrode 9 is formed beneath the first insulating sheet 3. A second via electrode 9a is formed beneath the first insulating sheet 3, and the second external electrode 9 is connected to the first via electrode 8a through the via hole 4 provided in the first insulating sheet 3, second via electrode 9a, and a first leading-out portion 10 formed beneath the first insulating sheet 3.

A third external electrode 11 provided at one end of the second coil 2, and a third via electrode ha provided at other end of the second coil 2 are formed on a same plane as the second coil 2.

A fourth external electrode 12 is provided beneath the first insulating sheet 3. A fourth via electrode 12a is formed beneath the first insulating sheet 3, and the fourth external electrode 12 is connected to the second coil 2 through the via hole 7 formed in the second insulating sheet 6, via hole 5 formed in the first insulating sheet 3, fourth via electrode 12a, and a second leading-out portion 13 formed beneath the first insulating sheet 3. That is, the second external electrode 9 and fourth external electrode 12 are formed on a same plane. The first external electrode 8, second external electrode 9, third external electrode 11, and fourth external electrode 12 are partly exposed to the end surface of the first insulating sheet 3 and second insulating sheet 6.

A specified number of third insulating sheets 14 are formed beneath the second external electrode 9 and fourth external electrode 12 and above the first coil 1, and are made of ferrite.

In this conventional noise filter, when a common mode noise is applied to the first coil 1 and second coil 2, the impedance values of the coils 1, 2 are raised, and the common mode noise is removed.

In the conventional noise filter, however, the common mode impedance cannot be raised higher.

That is, end portions of the first coil 1 and second coil 2 (the second external electrode 9 connected to the first coil 1 and fourth external electrode 12 connected to the second coil 2) are drawn out in the same direction (downward). It hence leads to possibility of short-circuiting of the via holes 5 and 7 for connecting the first via electrode 8a formed in the first coil 1, second coil 2, fourth via electrode 12a, and fourth external electrode 12. If short-circuited, the first coil 1 and second coil 2 are electrically connected, and the common mode noise removing characteristic may not be obtained. It is therefore necessary to keep a certain spacing 15 between the first via electrode 8a and via hole 7, and a conductor extending from the first coil 1 cannot be provided in this spacing 15 and the first coil 1 and second coil 2 cannot be overlaid in the area corresponding to the spacing 15, and the overlapping region of the first coil 1 and second coil 2 cannot be increased further.

Moreover, if the current flow directions are reverse in the first coil 1 and second coil 2, the magnetic fluxes generated in the first and second coils cancel each other, and the impedance of normal mode cannot be raised.

A different conventional common mode noise filter is disclosed, for example, in Japanese Utility Model Publication No. 7-45932.

FIG. 36 is a perspective exploded view of the conventional common mode noise filter (laminated coil).

In a main body 201, a first coil and a second coil are formed. Upper and lower electrodes 202 and 203 are disposed on both sides of the main body 201. Magnetic shield layers 204, 205 are provided in the outermost layer of the common mode noise filter. That is, the conventional common mode noise filter is composed of the main body 201, electrodes 202, 203, and magnetic shield layers 204, 205.

The main body 201 is composed of plural magnetic sheets for first coil 206, 207, 208, and magnetic sheets for second coil 209, 210, 211. The magnetic sheets for first coil 206 to 208 and magnetic sheets for second coil 209 to 211 are alternately disposed.

Specifically, the magnetic sheet for second coil 211, magnetic sheet for first coil 208, magnetic sheet for second coil 210, magnetic sheet for first coil 207, magnetic sheet for second coil 209, and magnetic sheet for first coil 206 are laminated sequentially from the bottom.

On the top of the magnetic sheets 206 to 211, conductor patterns for forming the first coil 212, 213, 214, and conductor patterns for forming the second coil 215, 216, 217 are printed in a square shape of nearly one turn.

A terminal end 212b of the conductor pattern 212 formed in the magnetic sheet 206 is electrically connected to an initial end 213a of the conductor pattern 213 formed in the magnetic sheet 207 by way of a through-hole 212c of the terminal end 212b and a through-hole 209a of the magnetic sheet 209.

Also, a terminal end 213b of the conductor pattern 213 formed in the magnetic sheet 207 is electrically connected to an initial end 214a of the conductor pattern 214 formed in the magnetic sheet 208 by way of a through-hole 213c of the terminal end 213b and a through-hole 210a of the magnetic sheet 210.

Similarly, a terminal end 215b of the conductor pattern 215 formed in the magnetic sheet 209 is electrically connected to an initial end 216a of the conductor pattern 216 formed in the magnetic sheet 210 by way of a through-hole 215c of the terminal end 215b and a through-hole 207a of the magnetic sheet 207.

Further, a terminal end 216b of the conductor pattern 216 formed in the magnetic sheet 210 is electrically connected to an initial end 217a of the conductor pattern 217 formed in the magnetic sheet 211 by way of a through-hole 216c of the terminal end 216b and a through-hole 214a of the magnetic sheet 208.

In this way, the first coil composed of conductor patterns 212 to 214 of magnetic sheets 206 to 208, and the second coil composed of conductor patterns 215 to 217 of magnetic sheets 209 to 211, in the same phase and same number of turns as the first coil, are formed in every other layer.

The upper electrode 202 is composed of magnetic sheets 218, 219, and 220. On the magnetic sheets 218 to 220, leading-out electrode conductor patterns 221a, 221b, 221c, 222a, 222b, 222c are formed respectively.

The leading-out electrode conductor patterns 221a to 221c are mutually connected by way of through-hole, and are further connected with the initial end 212a of the conductor pattern 212 of the magnetic pattern 206 for forming the first coil.

Similarly, the leading-out electrode conductor patterns 222a to 222c are mutually connected by way of through-hole, and are further connected with the initial end 215a of the conductor pattern 215 of the magnetic pattern 209 for forming the second coil.

In this manner, on the upper electrode 202, a first coil leading-out electrode terminal T1a, and a second coil leading-out electrode terminal T2a are formed.

Further, the lower electrode 203 is composed of magnetic sheets 223, 224, and 225. On the magnetic sheets 223 to 225, leading-out electrode conductor patterns 226a, 226b, 226c, 227a, 227b, 227c are formed respectively. (227b, 227c are not shown.)

The leading-out electrode conductor patterns 226a to 226c are mutually connected by way of through-hole, and are further connected with the terminal end 214b of the conductor pattern 214 of the magnetic pattern 208 for forming the first coil.

Similarly, the leading-out electrode conductor patterns 227a to 227c are mutually connected by way of through-hole, and are further connected with the terminal end 217b of the conductor pattern 217 of the magnetic pattern 211 for forming the second coil.

In this manner, on the lower electrode 203, a first coil leading-out electrode terminal T1b, and a second coil leading-out electrode terminal T2b are formed.

In this conventional common mode noise filter, when a common mode noise is applied in the first coil and second coil, the impedance values of the coils are raised, and the common mode noise is removed.

In the conventional common mode noise filter, however, the common mode impedance cannot be raised further.

That is, of the square-shaped conductor patterns 212 to 217, for example relating to the pattern 212 for composing the first coil, since the initial end 212a is formed inside of the terminal end 212b, the conductor pattern between the initial end 212a and the folded portion 212d of the conductor pattern 212 cannot be overlaid on the conductor pattern 215 for forming the second coil in the top view, and therefore the magnetic flux generated by the first coil and the magnetic flux generated by the second coil cannot reinforce each other efficiently.

SUMMARY OF THE INVENTION

The invention is intended to solve the problems of the prior art, and it is hence an object thereof to present a noise filter of high removing characteristic of both common mode noise and normal mode noise, capable of enhancing the impedance in both common mode and normal mode, and an electronic device using such noise filter.

It is also an object thereof to present a noise filter of high removing characteristic of common mode noise, capable of enhancing the impedance in the common mode further, and an electronic device using such common mode noise filter.

To achieve the objects, the noise filter in a first aspect of the invention (embodiments 1, 2 described below) comprises a magnetic member formed by laminating magnetic sheets in vertical direction, a first impedance element formed inside the magnetic member, a second impedance element formed above the first impedance element, and external electrodes formed at both ends of the magnetic member and connected electrically to each end of the first and second impedance elements, in which the first impedance element includes a first normal impedance element and a first common impedance element connected electrically to the first normal impedance element above the first normal impedance element, the second impedance element includes a second common impedance element and a second normal impedance element connected electrically to the second common impedance element above the second common impedance element, and the first common impedance element and second common impedance element are opposite to each other, and are insulated. In this configuration, the impedance value can be heightened in both common mode and normal mode.

To achieve the objects, the noise filter in a second aspect of the invention (embodiments 3, 4, 5 described below) comprises a magnetic member formed by laminating magnetic sheets in vertical direction, a first coil formed by laminating plural first inner conductors, a second coil formed by laminating plural second inner conductors, and external electrodes formed at both ends of the magnetic member and connected electrically to each end of the first and second coils, in which the magnetic member incorporates a first laminated body composed of the first inner conductors, a second laminated body formed on the top of the first laminated body, having the first inner conductors and second inner conductors laminated alternately, and a third laminated body formed on the top of the second laminated body, composed of the second inner conductors. In this configuration, the impedance value can be heightened in both common mode and normal mode.

To achieve the objects, the common mode noise filter in a third aspect of the invention (embodiment 6 described below) comprises a magnetic member formed by laminating magnetic sheets in vertical direction, a first coil formed by laminating plural first inner conductors, a second coil formed by laminating plural second inner conductors formed alternately with the first inner conductors, and overlapping with the first coil in a top view of the magnetic member, and plural via holes formed in the magnetic sheets for connecting the first inner conductors mutually or the second inner conductors mutually, in which the via holes for connecting the first inner conductors mutually overlap with the second coil in a top view of the magnetic member, the via holes for connecting the second inner conductors mutually overlap with the first coil in a top view of the magnetic member, and the first inner conductors and at least one of the second inner conductors adjacent to the first inner conductors are formed to overlap almost with each other in a top view of the magnetic member. In this configuration, the impedance value can be heightened more in common mode.

BRIEF DESCRIPTION OF THE DRAWINGS

FIGS. 12(a) to (d) are top views of other example of the noise filter;

FIGS. 20(a) to (g) are perspective views showing a manufacturing method of the noise filter;

BEST MODE FOR CARRYING OUT THE INVENTION (Embodiment 1)

A noise filter in embodiment 1 of the invention is explained by referring to the accompanying drawings.

Figure 1:
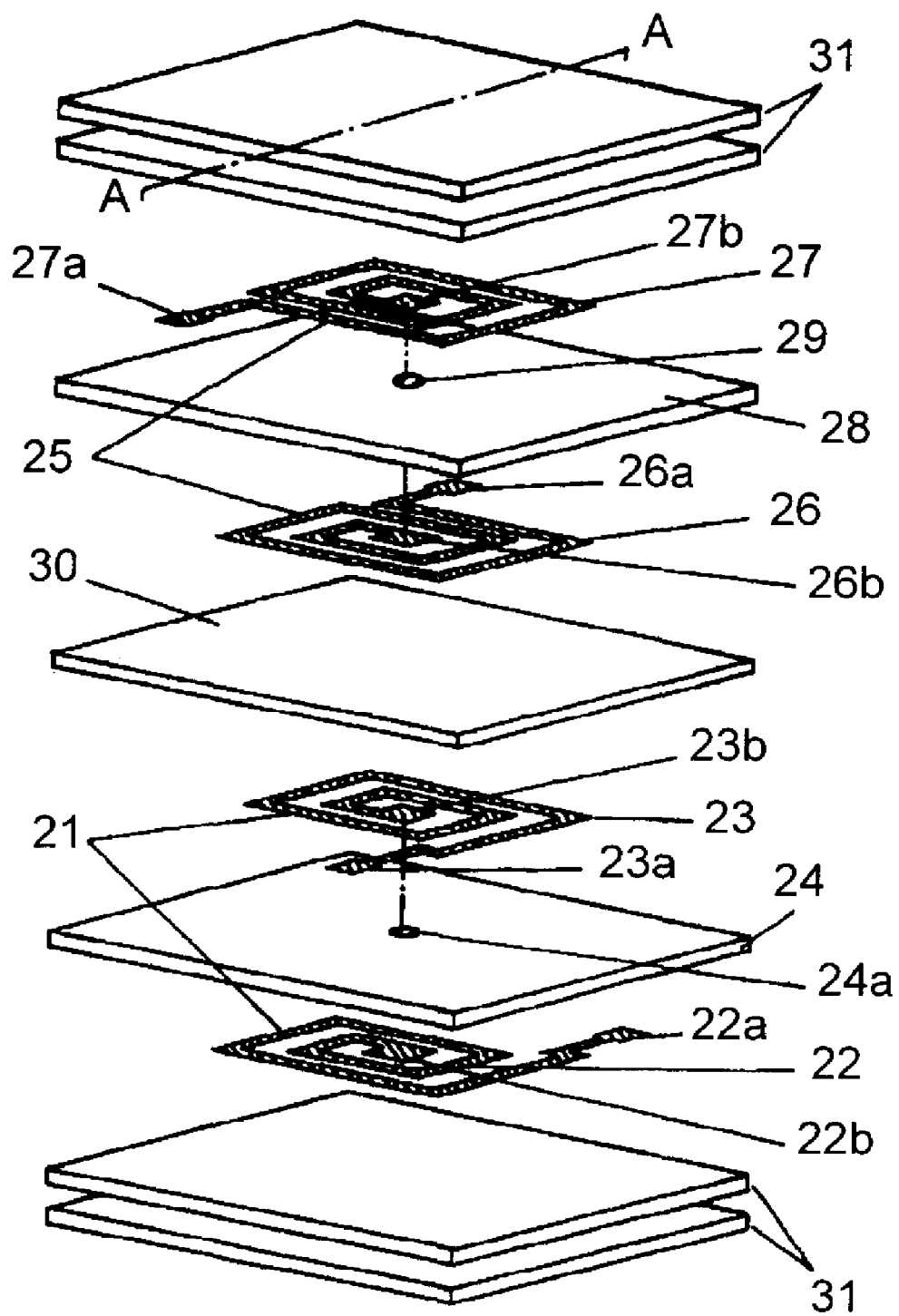
FIG. 1 is a perspective exploded view of a noise filter in embodiment 1 of the invention.
Figure 2A:
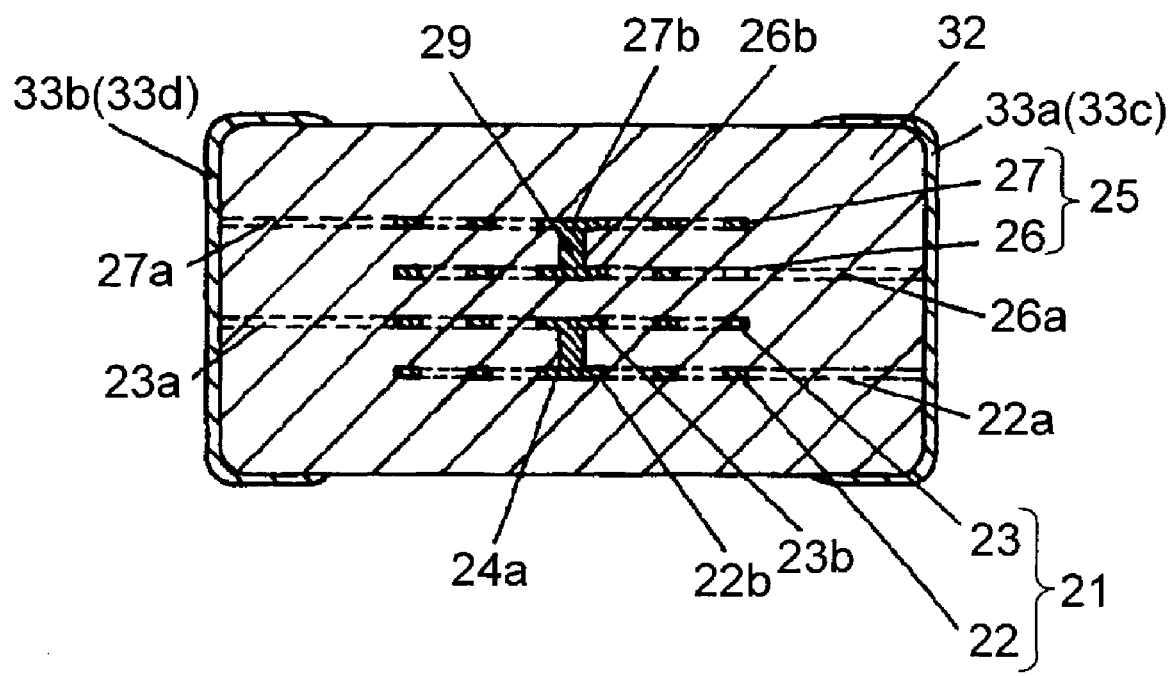
FIG. 2(a) is a sectional view along line A—A of the noise filter.
Figure 2B:
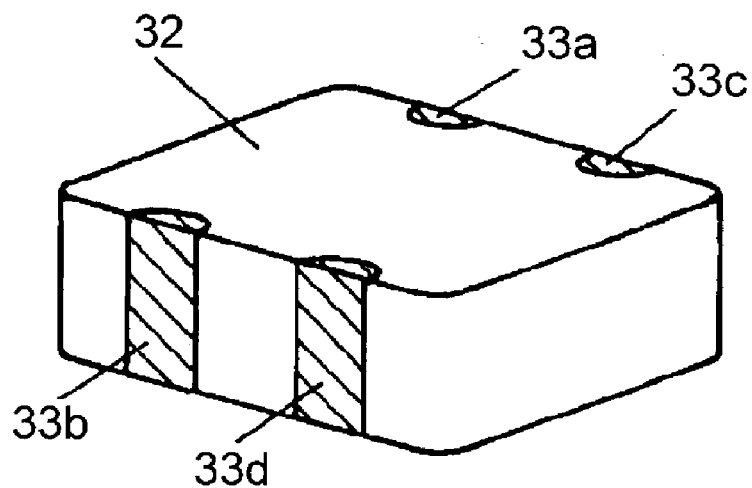
FIG. 2(b) is a perspective view of the noise filter.

FIG. 1 is a perspective exploded view of a noise filter in embodiment 1 of the invention, FIG. 2(a) is a sectional view along line A—A of the noise filter, and FIG. 2(b) is a perspective view of the noise filter.

Hereinafter, the first impedance element is supposed to be a first coil, the second impedance element to be a second coil, the first normal impedance element to be a first conductor, the first common impedance element to be a second conductor, the second common impedance element to be a third conductor, and the second normal impedance element to be a fourth conductor.

In FIG. 1 and FIG. 2, a first coil 21 is composed of a spiral first conductor 22 and a spiral second conductor 23 formed above the first conductor 22. The first conductor 22 includes a first leading-out portion 22a and a first via electrode 22b positioned in the center of the vortex, and the second conductor 23 includes a second leading-out portion 23a and a second via electrode 23b positioned in the center of the vortex. The first conductor 22 and second conductor 23 are formed so that, when a current flows in between the leading-out portions 22a, 23a, the current flowing in the first conductor 22 and second conductor 23 may be in the same direction (clockwise or counterclockwise) in a plan view as seen from above the second conductor 23. The leading-out portions 22a, 23a are formed at opposite positions to the mutually plane direction.

The square first magnetic sheet 24 is formed between the first conductor 22 and second conductor 23, and has a first via hole 24a. A first via electrode 22b and a second via electrode 23b are mutually connected through the first via hole 24a, and the first conductor 22 and second conductor 23 are connected, thereby forming the first coil 21.

A second coil 25 is composed of a spiral third conductor 26 and a spiral fourth conductor 27 formed above the third conductor 26. The third conductor 26 includes a third leading-out portion 26a and a third via electrode 26b positioned in the center of the vortex, and the fourth conductor 27 includes a fourth leading-out portion 27a and a fourth via electrode 27b positioned in the center of the vortex. The third conductor 26 and fourth conductor 27 are formed so that, when a current flows in between the leading-out portions 26a, 27a, the current flowing in the third conductor 26 and fourth conductor 27 may be in the same direction (clockwise or counterclockwise) in a plan view as seen from above the fourth conductor 27. The leading-out portions 26a, 27a are formed at opposite positions to the mutually plane direction, and in the same direction as the leading-out portions 26a, 22a.

The square second magnetic sheet 28 is formed between the third conductor 26 and fourth conductor 27, and has a second via hole 29. A third via electrode 26b and a fourth via electrode 27b are mutually connected through the second via hole 29, and the third conductor 26 and fourth conductor 27 are connected, thereby forming the second coil 25.

In FIG. 2(a), the first via hole 24a and second via hole 29 are nearly the same position in a top view, but they may be located at mutually deviated positions in a top view.

The conductors 22, 23, 26, 27 are made of conductive material such as silver or copper, and their length, width and thickness may be adjusted to conform to the specified characteristics. By using copper, the baking process mentioned below can be omitted, or by using silver, baking can be done in air atmosphere. The spiral conductors 22, 23, 26, 27 are formed on a same plane. The overall dimensions (vertical and lateral dimensions excluding the leading-out portions 22a, 23a, 26a, 27a), conductor pitch, and number of turns are nearly equal. That is, excluding the leading-out portions 22a, 23a, 26a, 27a, the conductors 22, 23, 26, 27 are nearly identical in shape. However, the outward direction from the center of the first spiral conductor 22 and third spiral conductor 26 is counterclockwise in a plan view as seen from above the fourth conductor 27, whereas the second conductor 23 and fourth conductor 27 are clockwise.

Further, the second conductor 23 and third conductor 26 are opposite to each other, and are mutually insulated. When a current flows from the leading-out portions 22a, 26a drawn in the same direction into the leading-out portions 23a, 27a, they are formed so that the current may flow in the same direction (clockwise or counterclockwise) in the second conductor 23 and third conductor 26 in a plan view as seen from above the fourth conductor 27 (above the magnetic member 32 mentioned below).

By forming the conductors 22, 23, 26, 27 in such configuration, one end (second via electrode 23b or third via electrode 26b) of the second conductor 23 or third conductor 26 is connected individually in the vertical direction (the second conductor 23 to the first conductor 22 beneath, the third conductor 26 to the fourth conductor 27 above), so that there is no possibility of short-circuiting of the second conductor 23 and third conductor 26. Accordingly, unlike the conventional noise filter, the second conductor 23 and third conductor 26 can be extended by a necessary portion, and further the second conductor 23 and third conductor 26 are formed spirally, so that the overlapping region of the second conductor 23 and third conductor 26 can be increased. As a result, when the current flows in the same direction in the second conductor 23 and third conductor 26, the magnetic fluxes generated in the second conductor 23 and third conductor 26 can be mutually reinforced, so that the impedance value in the common mode can be heightened.

Further, if the current flows in reverse directions in the second conductor 23 and third conductor 26 and the magnetic fluxes generated in the second conductor 23 and third conductor 26 cancel with each other, since the first conductor 22 and fourth conductor 27 are formed at remote positions from the second conductor 23 and third conductor 26, the magnetic fluxes generated in the first conductor 22 and fourth conductor 27 do not cancel each other, and the impedance value in the normal mode can be enhanced.

The square third magnetic sheet 30 is formed between the first coil 21 and second coil 25 (between the second conductor 23 and third conductor 26). By the third magnetic sheet 30, the second conductor 23 and third conductor 26 are insulated from each other. The square fourth magnetic sheet 31 is formed on the lower surface of the first coil 21 (lower surface of the first conductor 22) and the upper surface of the second coil 25 (upper surface of the fourth conductor 27).

The magnetic sheets 24, 28, 30, 31 are composed of a mixture of ferrite powder oxide and resin, and a resin composite material mixing resin and ferrite, glass ceramic, or other derivatives may be used. When using the resin, the baking process can be skipped as described below. Besides, by laminating in the vertical direction, a square and flat magnetic member 32 is formed. The magnetic member 32 may also have a certain thickness, not being limited to be flat. The magnetic member 32 is not always required to be square. The thickness may be adjusted properly depending on the required characteristics (impedance, withstand voltage, etc.), and the thickness may be adjusted by varying the thickness of the magnetic sheet itself, or by changing the number of magnetic sheets to be formed.

The magnetic member 32 is impregnated with fluorine silane coupling agent, and the water-repellent fluorine silane coupling agent permeates into fine pores in the magnetic member 32, so that the humidity resistance of the noise filter can be enhanced.

Of the external electrodes 33a, 33b, 33c, 33d formed at both ends of the magnetic member 32, 33a and 33c are formed at one end of the magnetic member 32, and 33b and 33d are formed at other end of the magnetic member 32. The external electrodes 33a, 33b, 33c, 33d are plated with low melting metal such as nickel, tin or solder on the surface of the conductors of silver or the like.

The both ends of the first coil 21, that is, the first leading-out portion 22a and second leading-out portion 23a are electrically connected to the external electrode 33a and external electrode 33b, respectively.

Similarly, in the second coil 25, the third leading-out portion 26a is electrically connected to the external electrode 33c, and the fourth leading-out portion 27a to the external electrode 33*d*. That is, the first conductor 22 and third conductor 26 are drawn out to one end of the magnetic member 32, and the second conductor 23 and fourth conductor 27 are drawn out to the other end of the magnetic member 32.

By forming the second conductor 23 and third conductor 26 in a spiral shape, the conductor length can be extended, and the overlap region of the second conductor 23 and third conductor 26 can be increased. As a result, by passing the current in the second conductor 23 and third conductor 26 in a same direction, the impedance in the common mode can be further heightened.

At least the second conductor 23 and third conductor 26 are formed by electrocasting method, and a smaller conductor width and narrower conductor pitch can be realized, and the length of the spiral second conductor 23 and third spiral conductor 26 can be further extended. As a result, the overlap region of the second conductor 23 and third conductor 26 is much increased, and by passing the current in the second conductor and third conductor in the same direction, the magnetic fluxes generated in the second conductor and third conductor can further reinforce each other, and the impedance in the common mode become much higher.

On the other hand, when the conductors are formed by printing, the precision of the mask is limited, and smaller conductor width and narrower conductor pitch are not realized, and the impedance in the common mode can be increased only to a certain extent.

Further, when the second conductor 23 and third conductor 26 are spiral and the current flows from the external electrodes 33*a*, 33*c* drawn out in the same direction to the external electrodes 33*b*, 33*d*, in a plan view from above the magnetic member 32, the current flows in the same direction (clockwise or counterclockwise) in the second conductor 23 and third conductor 26, and the impedance in the common mode is heightened in such configuration. Accordingly, there is no problem if the first conductor 22 and fourth conductor 27 are deviated in position in a plan view from above the magnetic member 32, or different in the winding direction with respect to the second conductor 23 and third conductor 26. Not limited to a spiral shape formed on a plane, spiral lamination, arch or other shape may be possible. In the vortical or spiral shape, however, the generated magnetic flux is strong. For heightening the impedance in the normal mode, the spiral shape is preferred. In the case of a linear shape, the generated magnetic flux is weak and it is not suited to the purpose of the invention.

Figure 3A:
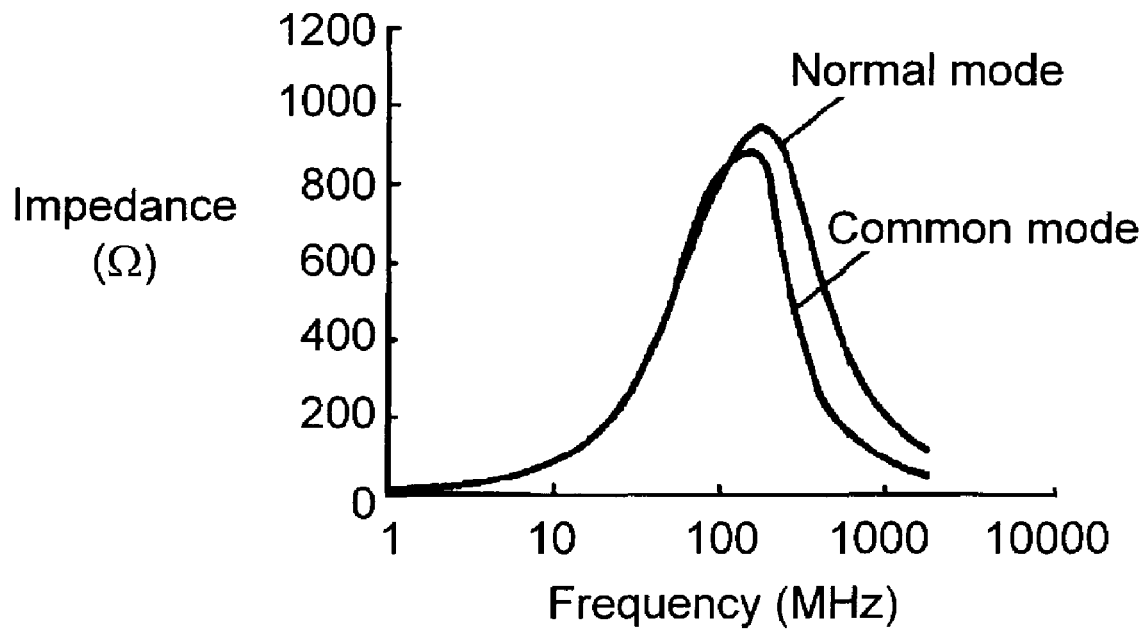
FIG. 3(a) is a diagram showing impedance characteristics when current of normal mode and common mode is applied to the noise filter.
Figure 3B:
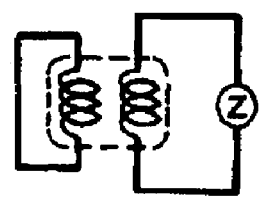
FIG. 3(b) is a diagram showing a measuring circuit of impedance characteristics when current of normal mode and common mode is applied to the noise filter.
Figure 3B:
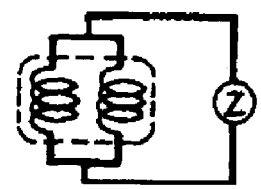
Figure 4A:
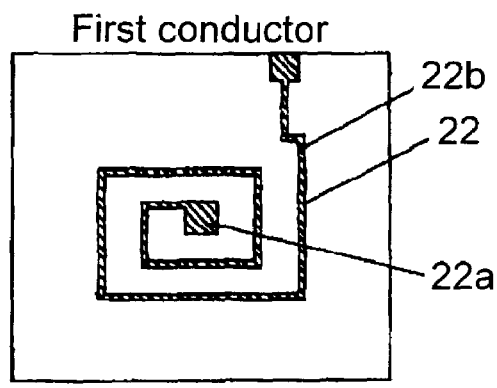
FIGS. 4(a) to (d) are top views of conductors in the noise filter.
Figure 4C:
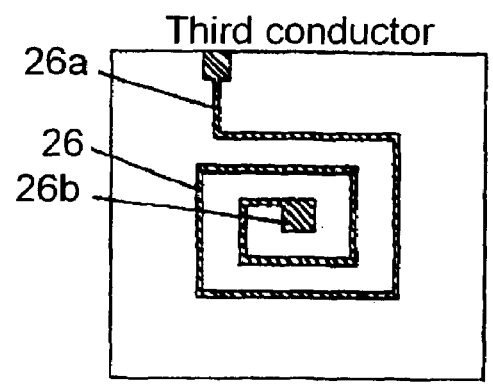
Figure 4B:
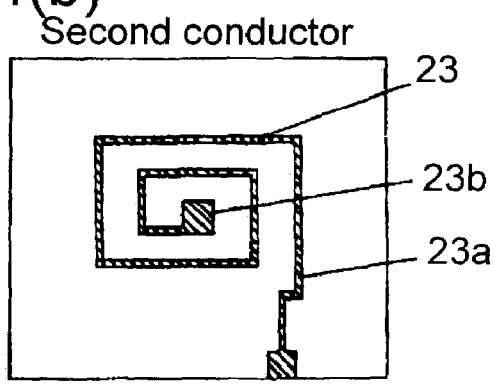
Figure 4D:
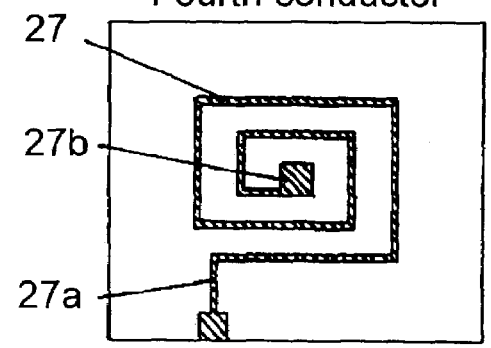
Figure 4E:
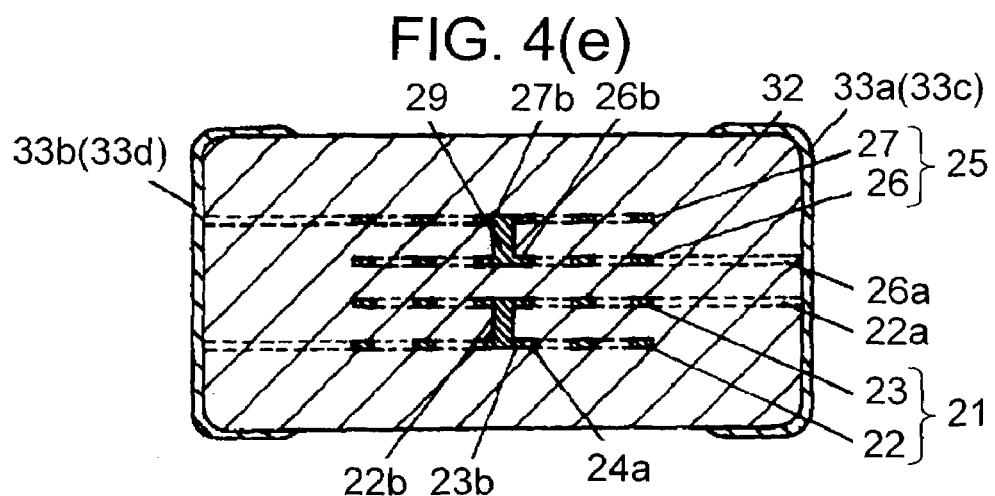
FIG. 4(e) is a sectional view of other example of the noise filter.

FIG. 3(*a*) is a diagram showing the impedance characteristic when normal mode and common mode current flows in the noise filter in embodiment 1 of the invention.

At this time, in each mode current, the frequency was varied, and the impedance between the input and output terminals was measured (the measuring circuit is shown in FIG. 3(*b*)). Samples were conductors 22, 23, 26, 27 measuring 600 μm×600 μm in overall dimensions (vertical and lateral dimensions excluding the leading-out portions 22*a*, 23*a*, 26*a*, 27*a*), with the number of turns of 4.

As clear from FIG. 3(*a*), the noise filter in embodiment 1 of the invention can heighten the impedance in both normal mode and common mode.

FIGS. 4(*a*) to (*d*) are top views of conductors 22, 23, 26, 27 of the noise filter in embodiment 1 of the invention.

If the first conductor 22 is replaced by the second conductor 23, the external electrodes 33*a* and 33*b* are formed at one end of the magnetic member 32, and the external electrodes 33*c* and 33*d* at other end. This pattern is called pattern B, and the pattern explained above is pattern A. The first conductor 22 and second conductor 23 are nearly identical in shape in a plan view as seen from above the magnetic member 32, except for the leading-out portions 22*a*, 23*a*, and therefore the characteristics are hardly changed (the sectional view at this time is shown in FIG. 4(*e*)).

The pattern A (embodiment 1 of the invention) is formed by laminating the first conductor 22, second conductor 23, third conductor 26, and fourth conductor 27 sequentially from the bottom, and pattern B is formed by laminating the second conductor 23, first conductor 22, third conductor 26, and fourth conductor 27 sequentially from the bottom.

Thus, if the vertical relation of the conductors 22, 23, 26, 27 is changed, their shapes are almost identical except for the leading-out portions 22*a*, 23*a*, 26*a*, 27*a*, and therefore it is not needed to inspect the vertical relation of the conductors 22, 23, 26, 27, so that the productivity may be enhanced.

Figure 5A:
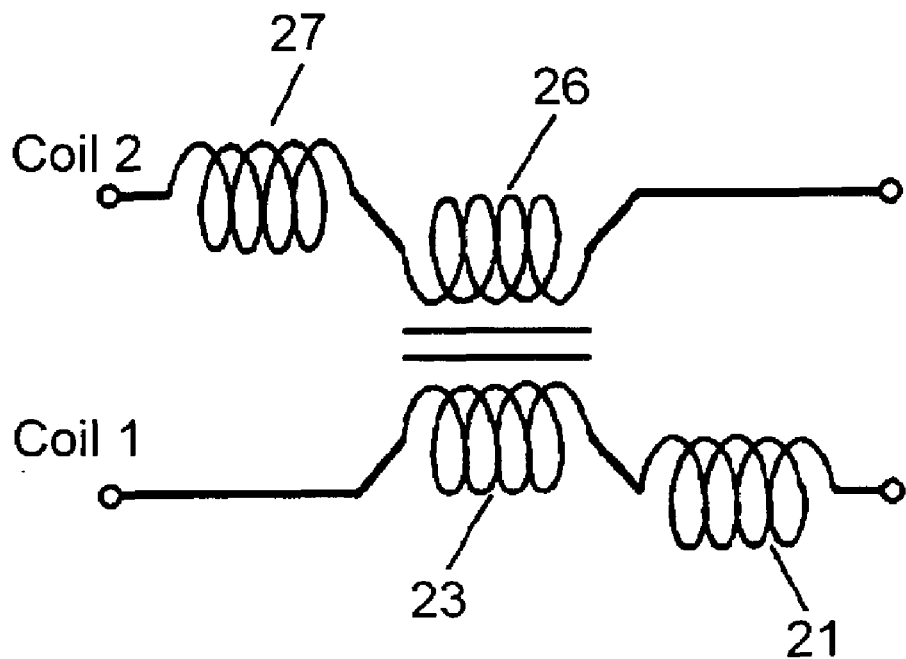
FIG. 5(a) is an equivalent circuit diagram of the noise filter (pattern A)

FIG. 5(*a*) is an equivalent circuit diagram of the noise filter (pattern A) in embodiment 1 of the invention, and FIG. 5(*b*) is an equivalent circuit diagram of the same noise filter (pattern B).

Figure 6A:
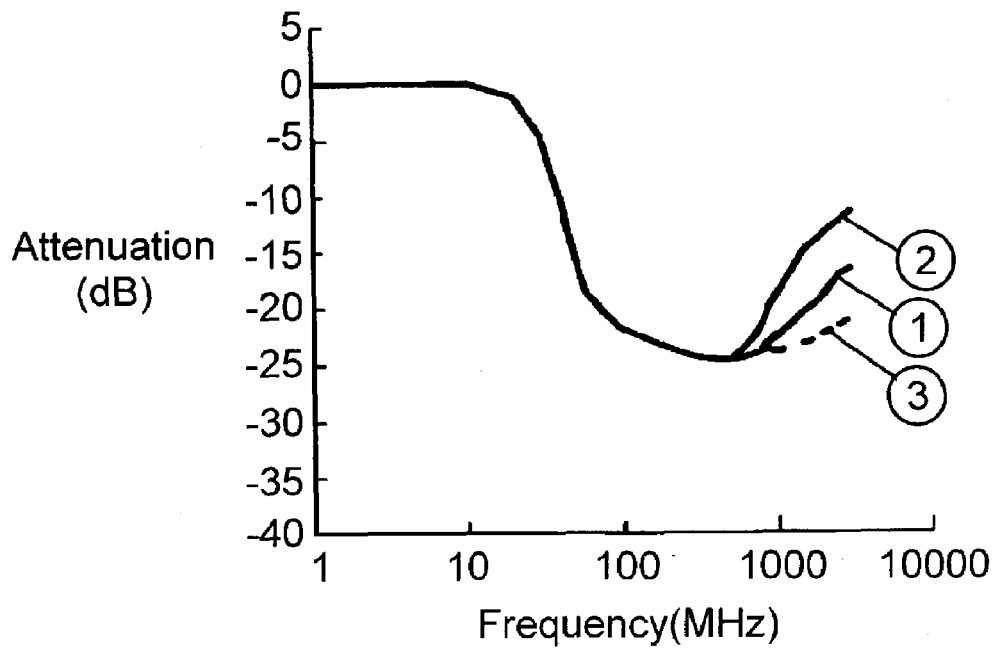
FIG. 6(a) is a diagram showing impedance characteristics (attenuation characteristics) when normal mode current is applied to the noise filter of pattern A and noise filter of pattern B.
Figure 6B:
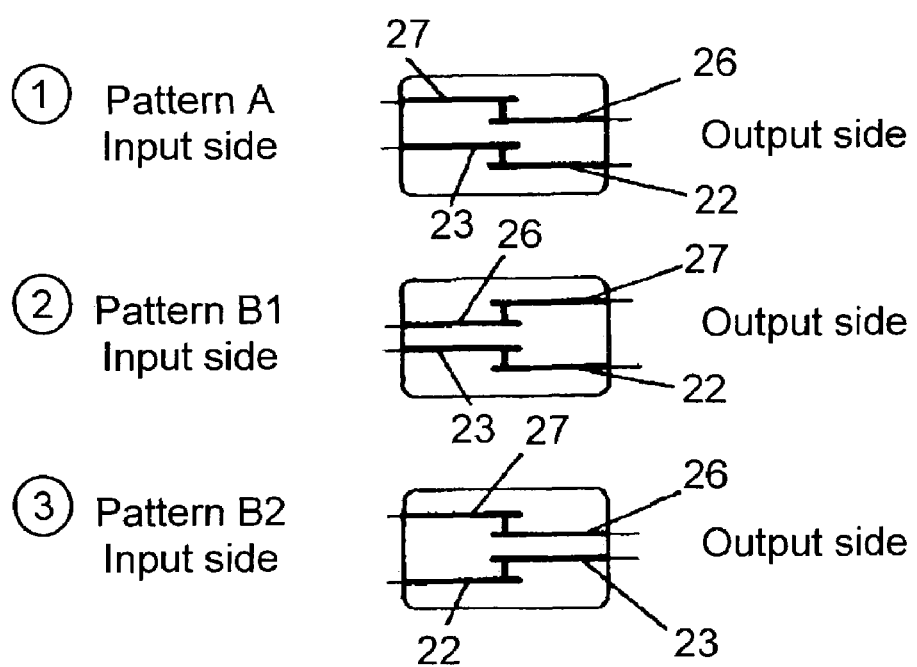
FIG. 6(b) is a diagram showing the direction of the current applied in each pattern, simulating noise filters of pattern A and pattern B.

FIG. 6(*a*) is a diagram showing the impedance characteristics (attenuation characteristics) when a normal mode current is applied to the noise filter of pattern A and noise filter of pattern B in embodiment 1 of the invention.

FIG. 6(*b*) is a diagram showing the direction of current applied to each pattern, simulating pattern A and pattern B (pattern B1, pattern B2). Samples are same as in FIG. 3.

It is known from FIG. 6 that the attenuation characteristics vary depending on the direction of the applied current in the case of pattern B.

This is because, in the noise filter (pattern A) in embodiment 1 of the invention, the distance between the external electrodes 33*a*, 33*c* formed at one end of the magnetic member 32 and the vicinity of junction (leading-out portions 22*a*, 26*a*) of the first conductor 22 and third conductor 26, and the distance between the external electrodes 33*b*, 33*d* formed at other end of the magnetic member 32 and the vicinity of junction (leading-out portions 23*a*, 27*a*) of the second conductor 23 and fourth conductor 27 are equal to each other, and if the applied direction of the normal mode current is different, the floating capacity generated in the magnetic member is invariable, and therefore if the mounting direction on the substrate is different, the attenuation characteristics are not changed. It is hence not necessary to specify the mounting direction on the substrate, and the steps of marking the product direction and others can be omitted.

In the case of pattern B, on the other hand, the distance between the external electrodes 33*a*, 33*d* formed at one end of the magnetic member 32 and the vicinity of junction (leading-out portions 22*a*, 27*a*) of the first conductor 22 and fourth conductor 27, and the distance between the external electrodes 33*b*, 33*c* formed at other end of the magnetic member 32 and the vicinity of junction (leading-out portions 23*a*, 26*a*) of the second conductor 23 and third conductor 26 are different. Therefore, if the applied direction of the normal mode current is different, the distance between the vicinities of junction (leading-out portion) close to the input and output parts is different, and the floating capacity generated in the magnetic member varies, and the attenuation characteristics are changed, and it is necessary to mark the product direction.

However, in the case of pattern B (the first conductor 22 formed immediately beneath the third conductor 26), the first conductor 22 and third conductor 26 are nearly identical in shape except for the leading-out portions 22*a*, 23*a*, 26*a*, 27a, and the direction from the center of vortex to the outer side is counterclockwise in a plan view as seen from above the magnetic member 32, so that they are formed to overlap in a plan view as seen from above the magnetic member 32. At this time, each overlap area can be increased to a maximum extent, and the generated magnetic fluxes are mutually reinforced, and the impedance of the common mode can be increased to a maximum extent.

In this embodiment 1, the external electrodes 33a to 33d are formed at both ends of the magnetic member 32, but same effects are obtained if formed at four corners in a top view of the magnetic member 32.

In the noise filter of embodiment 1 of the invention having such configuration, its manufacturing method is explained below by referring to the accompanying drawings.

FIGS. 7(a) to (f) show the manufacturing method of the noise filtering embodiment 1 of the invention.

First, from a mixture of oxide of ferrite powder and resin, square first magnetic sheet 24, second magnetic sheet 28, third magnetic sheet 30, and fourth magnetic sheet 31 are fabricated.

At specified positions of the first magnetic sheet 24 and second magnetic sheet 28, a first via hole 24a and a second via hole 29 are formed by laser, punching, or other drilling process. Preferably, when the via holes 24a, 29 are filled with silver or other conductive material, the connection of the first conductor 22 and second conductor 23, and that of the third conductor 26 and fourth conductor 27 are achieved more securely.

Figure 7A:
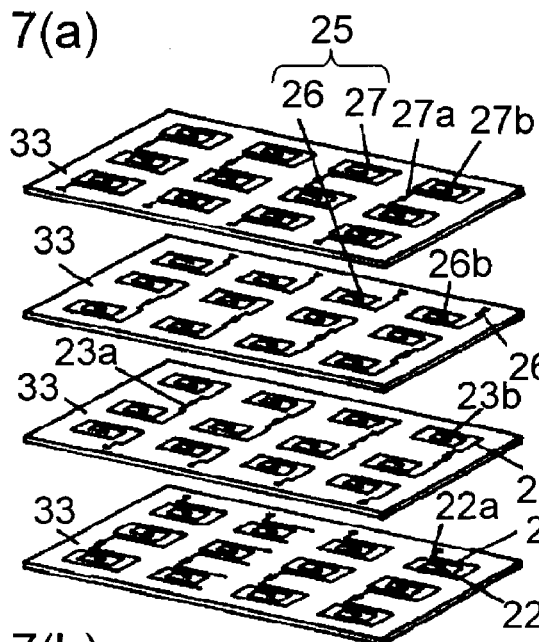
FIGS. 7(a) to (f) are perspective views showing a manufacturing method of the noise filter.

Next, as shown in FIG. 7(a), a mask is formed on a base plate 33 so as to expose patterns of conductors 22, 23, 26, 27, and the exposed portion is plated with silver and the mask is removed (electrocasting method), so that a plurality of spiral first conductor 22, second conductor 23, third conductor 26, and fourth conductor 27 made of silver or the like can be manufactured.

The conductors 22, 23, 26, 27 have a first via electrode 22b, a second via electrode 23b, a third via electrode 26b, and a fourth via electrode 27b, respectively, positioned in the center of vortex at one end, and have a first leading-out portion 22a, a second leading-out portion 23a, a third leading-out portion 26a, and a fourth leading-out portion 27a at the other end.

The conductors 22, 23, 26, 27 are almost identical in shape except for the leading-out portions 22a, 23a, 26a, 27a. The leading-out portions 22a, 23a, and 26a, 27a are disposed at mutually confronting positions in the horizontal direction, so that the leading-out portion 26a may face the same direction as the leading-out portion 22a.

Further, a plurality of first conductors 22 are formed on the top of the specified number of fourth magnetic sheets 31, the first magnetic sheet 24 having the first via hole 24a is provided on the top of the first conductors 22, and a plurality of second conductors 23 are provided on the top of the first magnetic sheets 24, thereby forming the first coil 21.

At this time, the first via electrode 22b and second via electrode 23b are connected through the first via hole 24a, and the first conductor 22 and second conductor 23 are electrically connected.

The third magnetic sheet 30 is formed on the top of the second conductors 23.

A plurality of third conductors 26 are formed on the top of the third magnetic sheets 30, the second magnetic sheet 28 having the second via hole 29 is provided on the top of the third conductors 26, and a plurality of fourth conductors 27 are provided on the top of the second magnetic sheets 28, thereby forming the second coil 25.

At this time, the third via electrode 26b and fourth via electrode 27b are connected through the second via hole 29, and the third conductor 26 and fourth conductor 27 are electrically connected.

The laminating method of the conductors 22, 23, 26, 27 is not limited to the above sequence, and, for example, the magnetic sheets may be laminated with each other after once forming on the magnetic sheets 24, 28, 30, 31 formed beneath the conductors 22, 23, 26, 27.

Figure 7B:
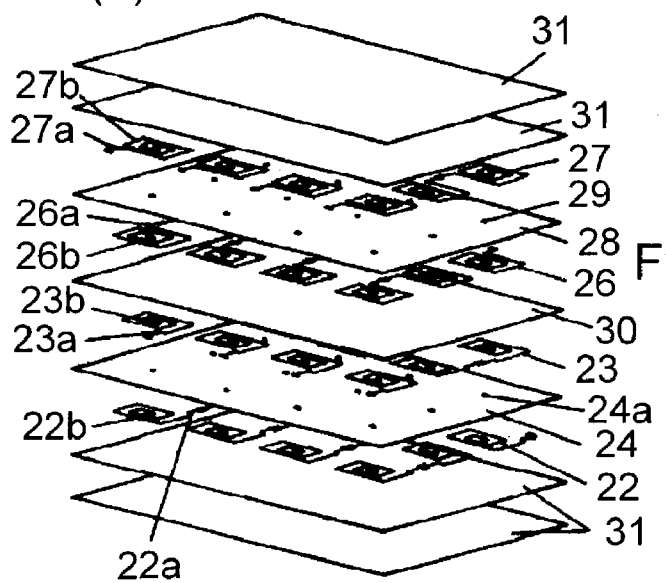

A specified number of fourth magnetic sheets 31 are formed on the top of the fourth conductors 27, and laminated in the configuration as shown in FIG. 7(b).

Figure 7C:
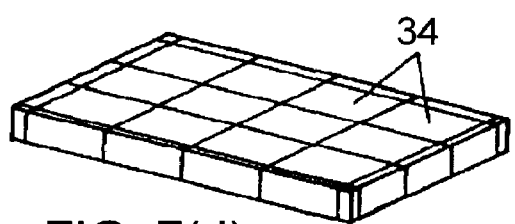
Figure 7D:
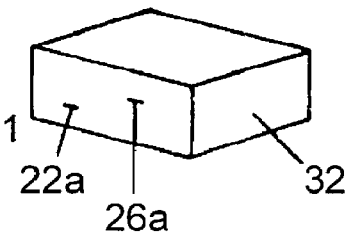

As shown in FIG. 7(c), in one noise filter, the conductors 22, 23, 26, 27 are cut off and incorporated by one piece each, and one laminated body 34 is obtained as shown in FIG. 7(d). At this time, the first leading-out portion 22a and third leading-out portion 26a are exposed from both ends of the laminated body 34, and the second leading-out portion 23a and fourth leading-out portion 27a are exposed at other ends.

This laminated body 34 is baked, and a magnetic member 32 is formed.

Figure 7E:
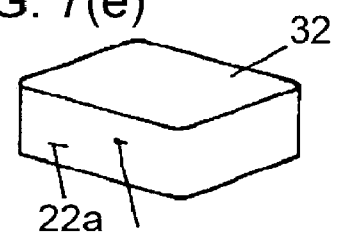

The magnetic member 32 is chamfered as shown in FIG. 7(e).

Figure 7F:
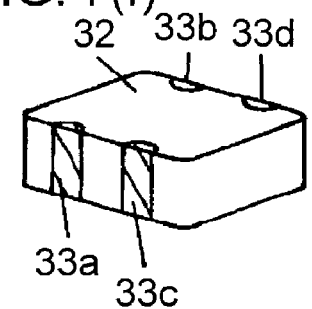

Finally, as shown in FIG. 7(f), silver or other conductors are formed in the leading-out portions 22a, 23a, 26a, 27a exposed at both ends of the magnetic member 32, and their surfaces are plated with low melting metal such as nickel, tin or solder. As a result, the external electrode 33a is formed in the first leading-out portion 22a, external electrode 33b is formed in the second leading-out portion 23a, external electrode 33c is formed in the third leading-out portion 26a, and external electrode 33d is formed in the fourth leading-out portion 27a, so that the noise filter in embodiment 1 of the invention is manufactured.

After forming silver or other conductors, and before nickel plating, the magnetic member 32 is impregnated in fluorine silane coupling agent in decompressed atmosphere.

In the noise filter in embodiment 1 of the invention, by shortening the distance between the second conductor 23 and third conductor 26 to have a large magnetic coupling, the impedance in common mode can be heightened, but if the distance between the second conductor 23 and third conductor 26 is too close, the withstand voltage between the second conductor 23 and third conductor 26 is impaired, and the second conductor 23 and third conductor 26 may be short-circuited.

Therefore the distance between the second conductor 23 and third conductor 26 (the thickness of the third magnetic sheet 30) should be specified within a specific range.

Figure 8:
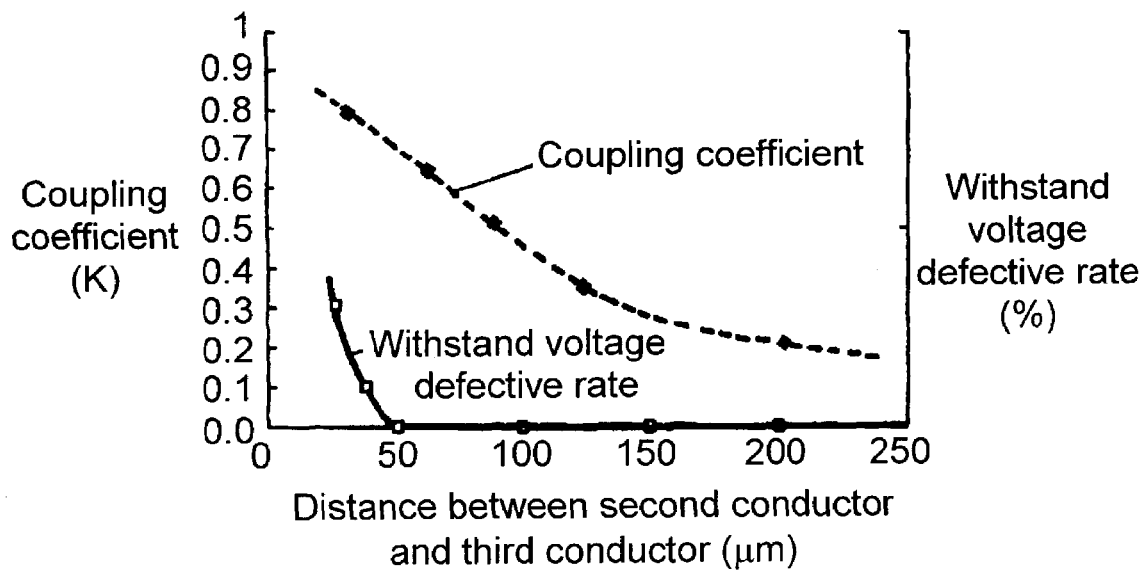
FIG. 8 is a diagram showing the relation of distance between second conductor and third conductor, coupling coefficient, and withstand voltage of the noise filter.

FIG. 8 is a diagram showing the relation of the distance, coupling coefficient, and withstand voltage between the second conductor 23 and third conductor 26 of the noise filter in embodiment 1 of the invention.

The withstand voltage is tested by applying a voltage of 100 V between the second conductor 23 and third conductor 26 for 1 minute, and the rate of conforming samples (insulation resistance 108 ohms or more) is expressed, and the axis of abscissas denotes the distance between the second conductor 23 and third conductor 26, and the axis of ordinates represents the coupling coefficient and withstand voltage defective percentage. Samples are conductors 22, 23, 26, 27 measuring 600 $\mu$m×600 $\mu$m in overall dimensions, with number of turns of 4.

As clear from FIG. 8, the distance between the second conductor 23 and third conductor 26 should be 50 microns or longer and 200 microns or shorter. Thus, the withstand voltage between the second conductor 23 and third conductor 26 is maintained, and the coupling coefficient between the second conductor 23 and third conductor 26 is enhanced, so that the impedance in common mode becomes higher.

The noise filter of this type generally measures 1.0 mm×1.0 mm×0.5 mm thick, and the vertical and lateral overall dimensions of the conductors 22, 23, 26, 27 are usually 500 μm to 800 μm, and therefore in relation to the vertical and lateral overall dimensions of the conductors 22, 23, 26, 27, the distance between the second conductor 23 and third conductor 26 is ¼ to ⅟₁₆.

In these conditions, a magnetic coupling coefficient of 0.2 to 0.7 is obtained as clear from FIG. 8. Fluctuations of the coupling coefficient are due to change in the distance between the second conductor 23 and third conductor 26 (when the conditions of the material of the magnetic member 32 and others are equal).

Further, the coupling coefficient also varies with the number of turns of the conductors 22, 23, 26, 27. For example, when the number of turns of the first conductor 22 and fourth conductor 27 is 1, and the number of turns of the second conductor 23 and third conductor 26 is 6, the coupling coefficient is 0.5 to 0.95. It is not realistic to have the difference in the number of turns by 6 times or more, in embodiment 1 of the invention, the coupling coefficient of the noise filter is 0.2 to 0.95. Hence, the impedance can be heightened in both common mode and normal mode.

Thus, by varying the distance between the second conductor 23 and third conductor 26 and the number of turns of each conductor, the coupling coefficient can be controlled to a desired value.

Figure 9:
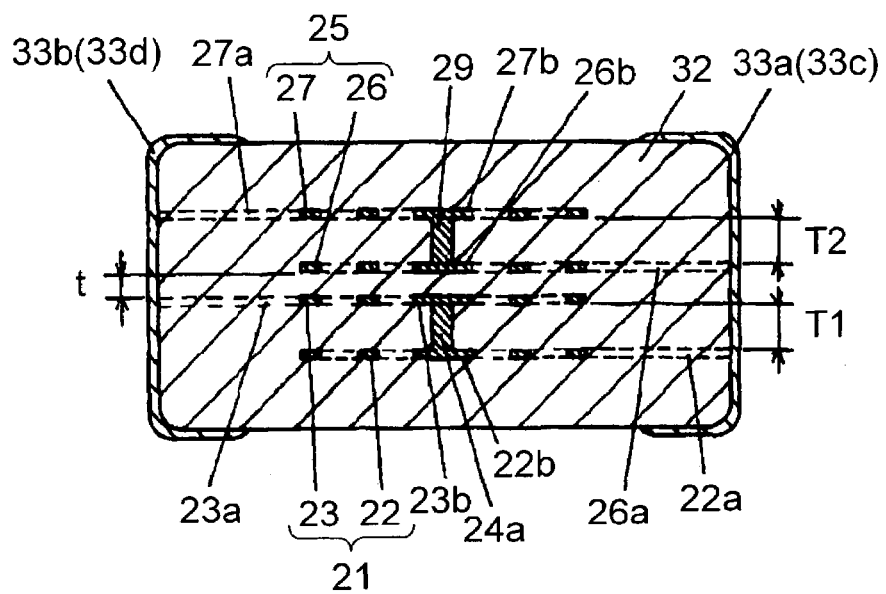
FIG. 9 is a sectional view of other example of the noise filter.

Or, as shown in FIG. 9, by setting in the relation of T1, T2>t, where T1 is the distance between the first conductor 22 and second conductor 23, T2 is the distance between the third conductor 26 and fourth conductor 27, and t is the distance between the second conductor 23 and third conductor 26, the floating capacity generated between the first conductor and second conductor, between the third conductor and fourth conductor, and between the first conductor and fourth conductor can be decreased. As a result, the impedance value elevates in the high frequency region, and the distance between the first and fourth conductors can be extended, and the magnetic fluxes generated in the first and fourth conductors do not cancel each other, so that the impedance in normal mode becomes higher.

Figure 10:
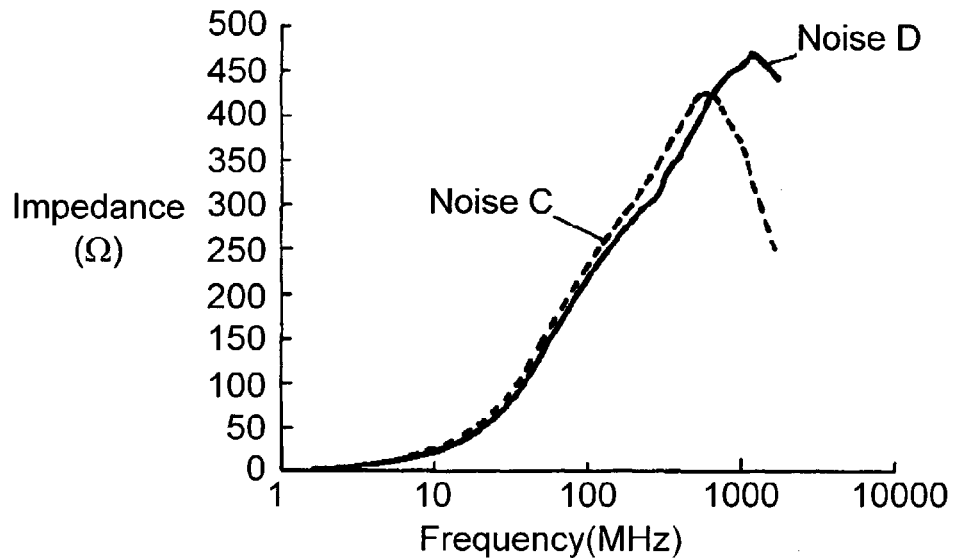
FIG. 10 is a diagram of frequency characteristics showing elevation of impedance value in high frequency region.

FIG. 10 is a diagram of frequency characteristic showing improvement of impedance value in the high frequency region.

In FIG. 10, frequency characteristic C shows the case in which the distance between the first conductor 22 and second conductor 23, and between the third conductor 26 and fourth conductor 27 is nearly same as the distance between the second conductor 23 and third conductor 26, and, as shown in FIG. 9, frequency characteristic D shows the case in which the distance between the first conductor 22 and second conductor 23, and between the third conductor 26 and fourth conductor 27 is longer than the distance between the second conductor 23 and third conductor 26, and the axis of ordinates represents the impedance, and the axis of abscissas shows the frequency of applied current.

As clear from FIG. 10, the frequency showing the peak impedance is higher in D than in C. That is, characteristic D has the noise removing property of higher frequency.

In the noise filter in embodiment 1 of the invention, other examples for enhancing the impedance in high frequency region are explained, but the frequency changing rate varies with each condition.

Figure 11A:
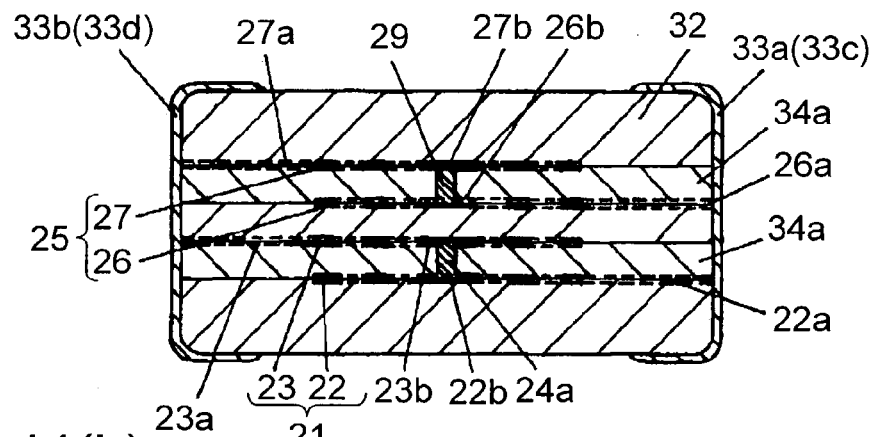
FIGS. 11(a), (b) are sectional views of other example of the noise filter.

Further, as shown in FIGS. 11(a) and (b), when a material 34a lower in permeability than the magnetic member 32 is disposed between the first conductor 22 and second conductor 23, and between the third conductor 26 and fourth conductor 27, the magnetic fluxes generated in the first conductor 22 and fourth conductor 27 do not cancel each other, so that the impedance in normal mode becomes higher.

As the material 34a lower in permeability, a non-magnetic material may be disposed between the first magnetic sheet 24 and second magnetic sheet 28, or part or whole of the first magnetic sheet 24 and second magnetic sheet 28 may be made of non-magnetic material, or the permeability may be lowered by changing the composition of the magnetic material.

Figure 11B:
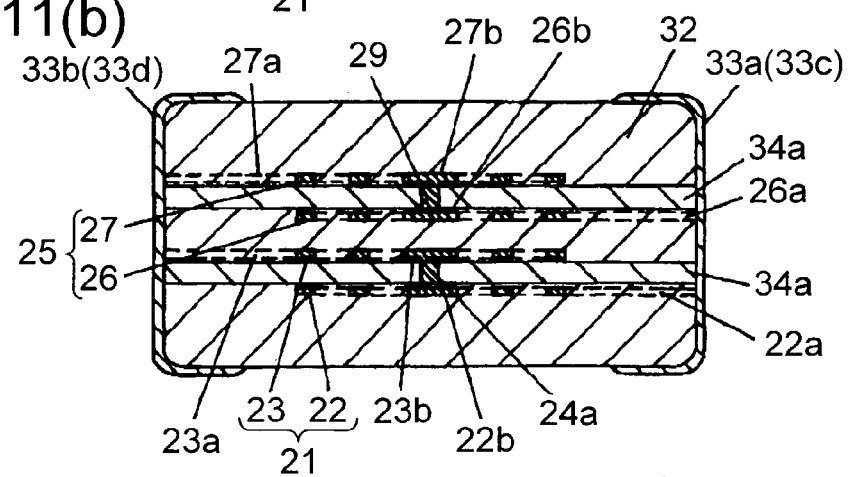
Figure 12A:
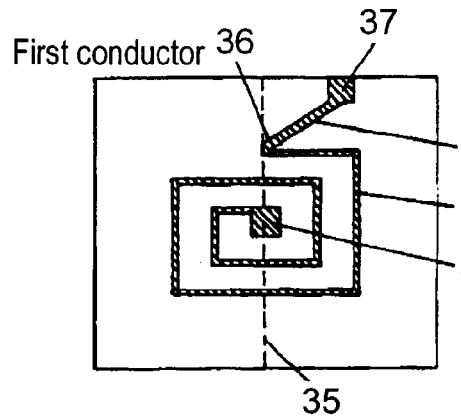
Figure 12B:
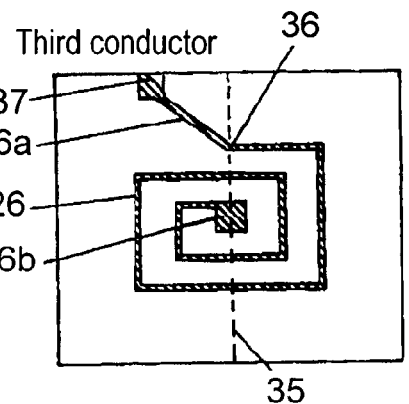
Figure 12B:
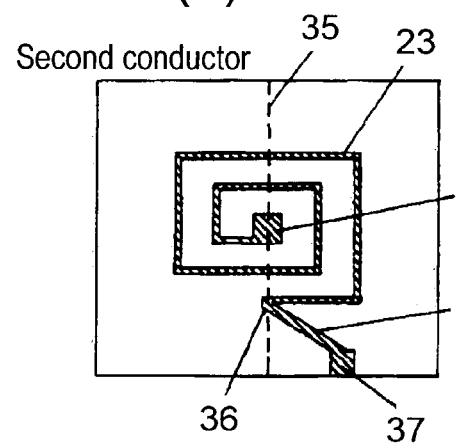
Figure 12D:
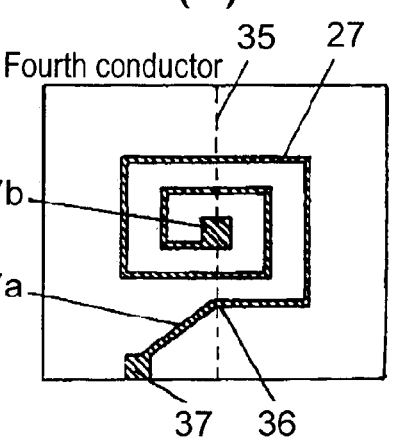

However, instead of forming a material 34a of low permeability in all between the first conductor 22 and second conductor 23, and between the third conductor 26 and fourth conductor 27 as shown in FIG. 11(a), it is more preferable to compose as shown in FIG. 11(b) in which at least a material 34a low in permeability is used together with the material (magnetic member 32) of high permeability disposed between the second conductor 23 and third conductor 26, because the impedance in common mode is higher. This is because the magnetic fluxes generated in the second conductor 23 and third conductor 26 are stronger by forming a material of high permeability between the two.

As shown in FIGS. 12(a) to (d), by setting the conductor length equal between external electrodes in the first and second coils 21, 25, since the total coil length including the leading-out portions 22a, 23a, 26a, 27a is equal, the impedance values in the first and second coils 21, 25 are equal.

As its means, the conductors 22, 23, 26, 27 are formed symmetrically to the line 35 passing through the via electrodes 22b, 23b, 26b, 27b of the conductors. Point 36 is the intersection of the conductors 22, 23, 26, 27 with the line 35. Moreover, the portions 37 of the leading-out portions 22a, 23, 26a, 27a exposed to the end of the magnetic member 32 are formed symmetrically to the line 35. Between the points 36 and 37, the length of the leading-out portions 22a, 23a, 26a, 27a should be equalized.

Figure 13:
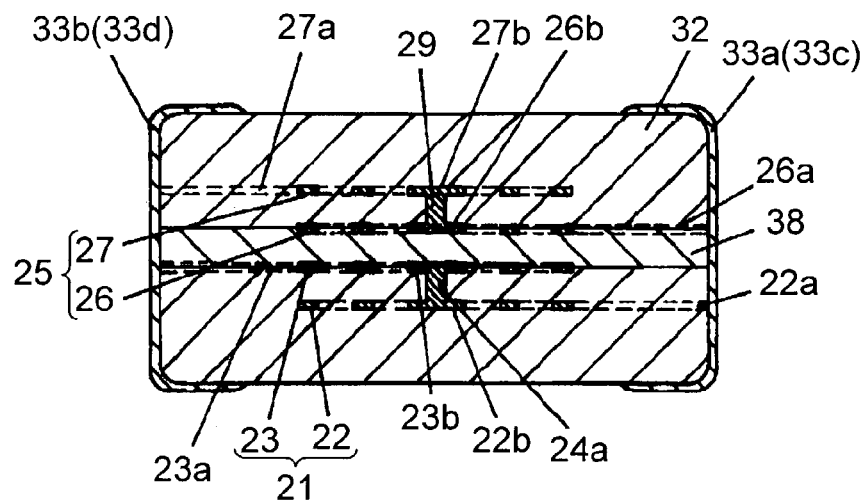
FIG. 13 is a sectional view of other example of the noise filter.

Further, as shown in FIG. 13, between the second conductor 23 and third conductor 26, when the density is set higher than in other parts, the porosity between the second conductor 23 and third conductor 26 can be lowered, so that the withstand voltage between the second conductor 23 and third conductor 26 can be assured.

At this time, a fifth magnetic sheet 38 of higher density than other magnetic sheet (magnetic member 32) in the portion between the second conductor 23 and third conductor 26 may be provided, and as the material for the fifth magnetic sheet 38, the content of sintering aid such as CuO or Bi2O3 may be increased, or the fifth magnetic sheet 38 of higher density than other magnetic sheet (magnetic member 32) may be used.

(Embodiment 2)

A noise filter in embodiment 2 of the invention is explained by referring to the drawings.

The noise filter in embodiment 2 of the invention differs from embodiment 1 of the invention only in that the first conductor 22c and second conductor 23c, and the third conductor 26c and fourth conductor 27c are formed so as not to overlap in a plan view as seen from above the magnetic member 32, and other structure and manufacturing method are same and are not explained herein.

Figure 14A:
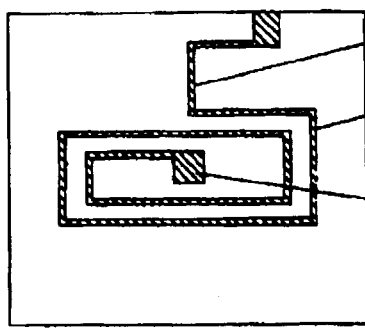
FIGS. 14(a), (b), (d), (e) are top views of conductors of a noise filter in embodiment 2 of the invention.
Figure 14D:
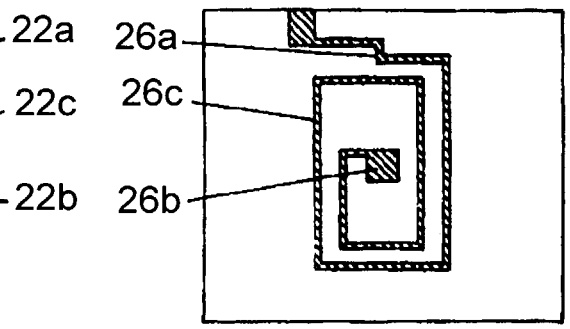
FIGS. 14(c), (f) are pattern see-through diagrams of the noise filter.
Figure 14B:
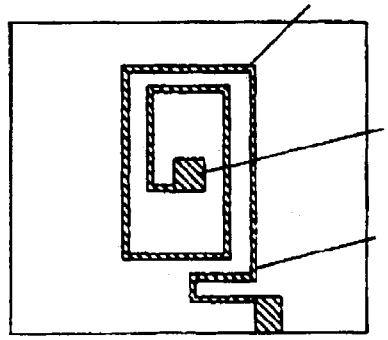
Figure 14E:
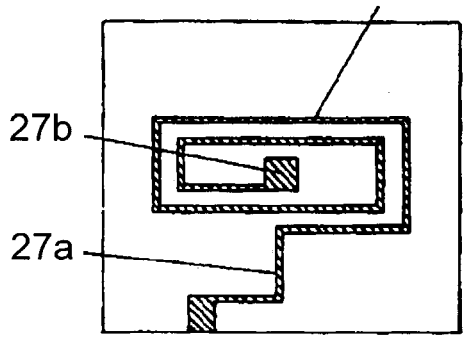
Figure 14C:
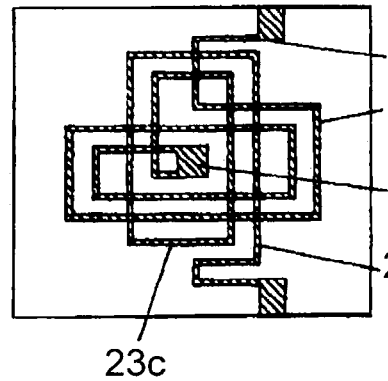
Figure 14F:
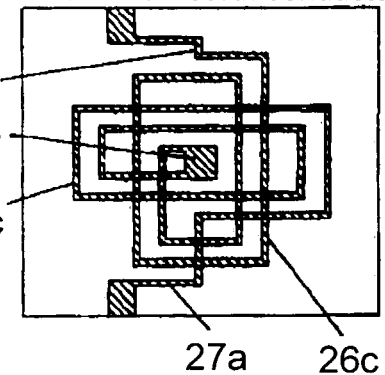

FIGS. 14(a), (b), (d), and (e) are top views of the conductors 22c, 23c, 26c, 27c of the noise filter in embodiment 2 of the invention, and FIGS. 14(c) and (f) are pattern see-through diagrams of the first conductor 22c and second conductor 23c, and the third conductor 26c and fourth conductor 27c of the noise filter, respectively.

In FIG. 14, the first conductor 22c and second conductor 23c, and the third conductor 26c and fourth conductor 27c are orthogonal respectively, and they are formed so as not to overlap except for the orthogonal parts in a plan view as seen from above the magnetic member 32. As a result, the floating capacity generated between the first conductor 22c and second conductor 23c, and between the third conductor 26c and fourth conductor 27c can be decreased, and hence the impedance value is elevated in the high frequency region.

Alternatively, the first conductor 22c and fourth conductor 27c may be formed so as not to overlap with the second conductor 23c and third conductor 26c in a plan view as seen from above the magnetic member 32.

The second conductor 23c and third conductor 26c are formed so that, when a current flows in the leading-out portions 23a, 27a (external electrodes 33b, 33d) from the leading-out portions 22a, 26a (external electrodes 33a, 33c) drawn out in the same direction, the current may flow in the same direction (clockwise or counterclockwise) in a plan view as seen from above the magnetic member 32.

In the noise filter in embodiments 1 and 2 of the invention, two coils 21 and 25 (impedance elements) are stacked up, but same effects are obtained by stacking up in plural layers.

In this case, the conductors adjacent in the vertical direction (common impedance elements) can heighten the impedance value in common mode, and the conductors in the highest position and lowest position (normal impedance elements) can heighten the impedance value in normal mode, and the conductors between the common impedance element and normal impedance element have an intermediate value of the normal mode impedance and common mode impedance.

In this way, the impedance values in both normal mode and common mode, and the coupling coefficient expressing the degree of coupling of coils can be easily adjusted and designed to desired values. Herein, when the coupling coefficient is large, the impedance value in common mode becomes large.

The method of using the noise filter in embodiments 1 and 2 of the invention in a pair of signal lines in the cellular phone or other wireless communication appliance is explained.

For example, signal lines of communication wires in the headset of a cellular phone are usually composed of a pair of cables (signal lines), and since the high frequency signal such as carrier of the cellular phone is superposed as radiation noise on the cables in normal mode and common mode, the effect of noise is likely to occur. For example, this radiation noise may occur as noise in the audio signal.

The audio signal is disturbed by the high frequency noise in common mode because the low frequency component in the signal is detected and superposed by the nonlinear element and electrostatic capacity in the circuit.

Figure 15A:
FIG. 15(a) is a diagram showing a waveform of carrier in a pair of signal lines in a cellular phone.

For example, as shown in FIG. 15(a), when carrier 900 MHz (TDMA carrier) in transmission and reception circuits of a cellular phone of TDMA system is transmitted and received at 217 Hz (burst frequency), 217 Hz is detected, and is superposed on the audio signal of normal mode, and audible noise may be heard. Therefore, if the current in common mode and normal mode to be induced can be suppressed, noise in audio output can be reduced.

Figure 15B:
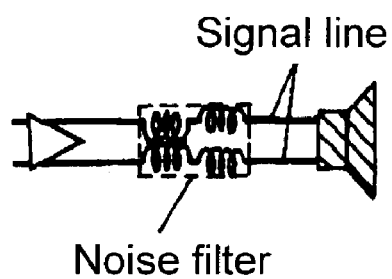
FIG. 15(b) is a diagram showing the manner of use of the noise filter in embodiments 1 and 2 of the invention.
Figure 15C:
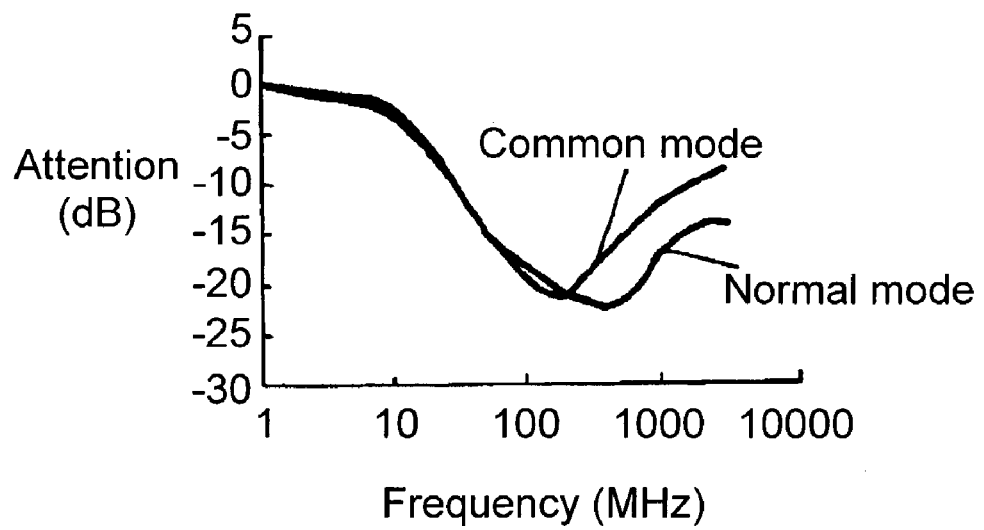
FIG. 15(c) is a diagram showing attenuation characteristics when the noise filter in embodiments 1 and 2 is used in a pair of signal lines in a cellular phone.

As shown in FIG. 15(b), when the noise filters of embodiments 1, 2 of the invention were connected to a pair of signal lines (audio lines), the attenuation characteristics as shown in FIG. 15(c) were obtained.

As clear from FIG. 15(c), also by the carrier 900 MHz of the cellular phone, noise can be attenuated in both common mode and normal mode. Therefore, the signal of repetitive frequency 217 Hz detected together with the carrier 900 MHz can be reduced, so that the audible noise may not be heard.

In this way, when the noise filters in embodiments 1 and 2 of the invention are connected in a pair of signal lines in the cellular phone or wireless communication appliance, respectively to the first coil 21 (first impedance element) and second coil 25 (second impedance element), in the pair of signal lines in which noises in both common mode and normal mode are applied, impedances in both common mode and normal mode can be heightened (signals can be attenuated), so that the audible noise can be reduced in audio lines such as a pair of signal lines.

(Embodiment 3)

A noise filter in embodiment 3 of the invention is explained below by referring to the drawings.

Figure 16:
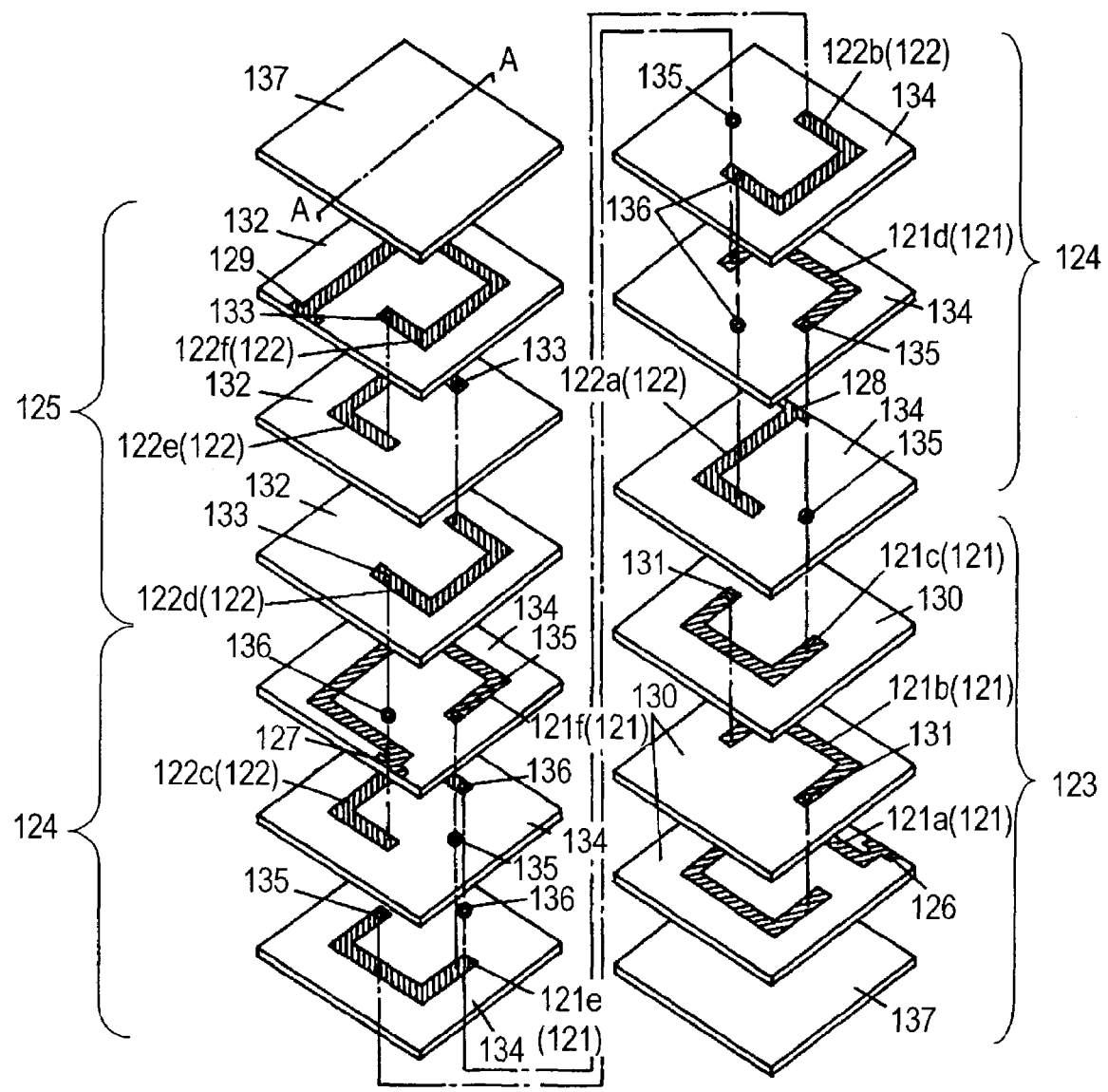
FIG. 16 is a perspective exploded view of a noise filter in embodiment 3 of the invention.
Figure 17A:
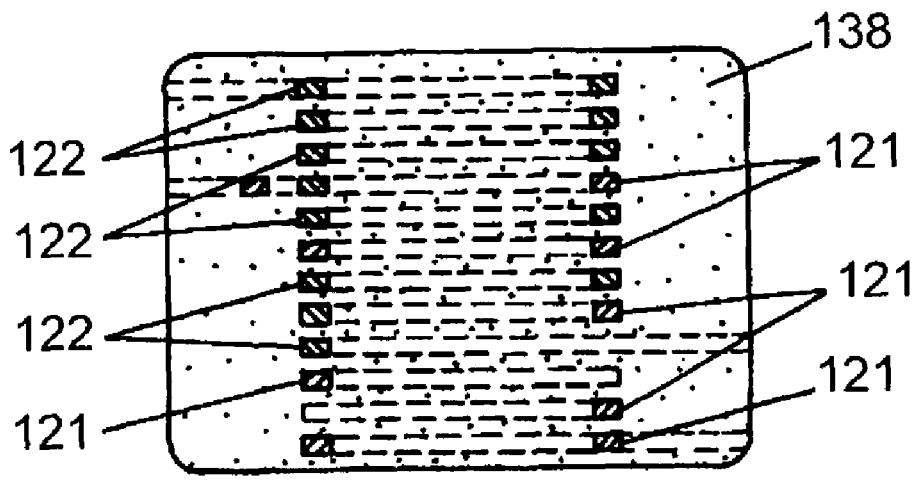
FIG. 17(a) is a sectional view of line A—A of the noise filter.
Figure 17B:
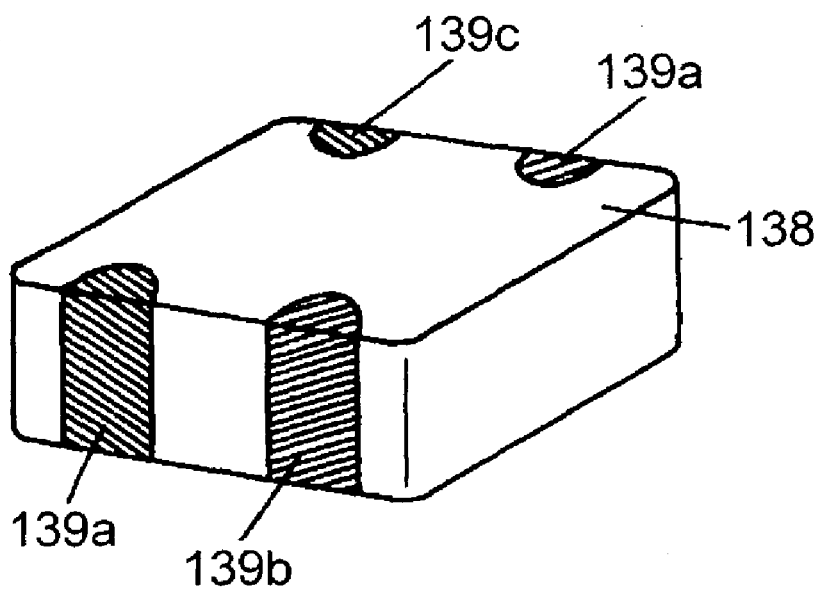
FIG. 17(b) is a perspective view of the noise filter.

FIG. 16 is a perspective exploded view of the noise filter in embodiment 3 of the invention, FIG. 17(a) is a sectional view of line A—A of the noise filter, and FIG. 17(b) is a perspective view of the noise filter.

In FIG. 16 and FIG. 17, a spiral first coil 121 is formed by laminating and connecting first inner conductors 121a to 121f sequentially from the bottom. A spiral second coil 122 is formed by laminating and connecting second inner conductors 122a to 122f sequentially from the bottom. That is, the first and second coils 121, 122 are composed of six layers each. However, the first and second coils 121, 122 are not required to be composed of six layers. The first inner conductors 121a to 121f, and second inner conductors 122a to 122f are made of silver or other conductive material.

The first inner conductors 121a to 121f, and second inner conductors 122a to 122f are formed in U-shape except for the lowest and highest layers thereof 121a, 121f, 122a, 122f. Not limited to U-shape, however, they may be formed in L- or other shape.

At this time, from the bottom sequentially, the first inner conductors 121a to 121c, second inner conductor 122a, first inner conductor 121d, second inner conductor 122b, first inner conductor 121e, second inner conductor 122c, first inner conductor 121f, and second inner conductors 122d to 122f are formed, and the portion composed of the first inner conductors 121 to 121c only is a first laminated body 123, the portion composed alternately of the first inner conductors and second inner conductors (the portion forming the second inner conductor 122a, first inner conductor 121d, second inner conductor 122b, first inner conductor 121e, second inner conductor 122c, and first inner conductor 121f) is a second laminated body 124, and the portion composed of the second inner conductors 122d to 122f only is a third laminated body 125. That is, of the six-layer first and second coils 121, 122, three layers are formed alternately.

Of the first inner conductors 121a to 121f, in the lowest layer and highest layer 121a, 121f, first and second leading-out electrodes 126, 127 are formed as the ends of the first coil 121. Similarly, in the second inner conductors 122a, 122f, third and fourth leading-out electrodes 128, 129 are formed.

The leading-out electrodes 126, 127, 128, 129 may be also formed at four corners of the magnetic member 138 in a top view of the second inner conductor 122f (magnetic member 138 described below).

A plurality of square first magnetic sheets 130 are formed beneath the first inner conductors 121b, 121c in the first laminated body 123, and a first via hole 131 is formed. Through this first via hole 131, the first inner conductors 121a to 121c are connected.

A plurality of square second magnetic sheets 132 are formed beneath the second inner conductors 122d to 122f in the third laminated body 125, and a second via hole 133 is formed. Through this second via hole 133, the second inner conductors 122d to 122f are connected.

A plurality of square third magnetic sheets 134 are formed beneath the second inner conductor 122a, first inner conductor 121d, second inner conductor 122b, first inner conductor 121e, second inner conductor 122c, and first inner conductor 121f forming the second laminated body 124, and a third via hole 135 and a fourth via hole 136 are formed (only the third via hole 135 is provided in the third magnetic sheet 134 formed beneath the second inner conductor 122a).

The first inner conductors 121c and 121d, 121d and 121e, and 121e and 121f are connected through the third via hole 135, respectively, and the second inner conductors 122a and 122b, 122b and 122c, and 122c and 122d are connected through the four via hole 136, respectively.

That is, the fourth via hole 136 is formed in the third magnetic sheet 134 having the third via hole 135 beneath the first inner conductor 121d. The first inner conductor 121d is connected to the first inner conductor 121c through this third via hole 135 and a third via hole 135 provided in the third magnetic sheet 134 formed further beneath (above the first inner conductor 121c), and the second inner conductor 122b is connected to the second inner conductor 122a through this fourth via hole 136 and a fourth via hole 136 provided in the third magnetic sheet 134 formed further above (beneath the second inner conductor 122b).

The third via hole 135 and second inner conductors 122a to 122c, and the fourth via hole 136 and first inner conductors 121d to 121f are electrically insulated from each other.

A plurality of square fourth magnetic sheets 137 are formed by a specific number each beneath the first inner conductor 121a and above the second inner conductor 122f.

Magnetic sheets 130, 132, 134, 137 are composed of a mixture of oxide of ferrite powder and resin, and a flat square magnetic member 138 is formed by laminating them in the vertical direction as described above. The magnetic member 138 may also have a certain thickness, not being limited to be flat. The magnetic member 138 is not always required to be square. The thickness may be adjusted properly depending on the required characteristics (impedance, withstand voltage, etc.), and the thickness may be adjusted by varying the thickness of the magnetic sheet itself, or by changing the number of magnetic sheets to be formed.

The magnetic member 138 is impregnated with fluorine silane coupling agent, and the water-repellent fluorine silane coupling agent permeates into fine pores in the magnetic member 138, so that the humidity resistance of the noise filter can be enhanced.

Of the external electrodes 139a, 139b, 139c, 139d formed at both ends of the magnetic member 138, 139a and 139c are formed at one end of the magnetic member 138, and 139b and 139d are formed at other end of the magnetic member 138. The external electrodes 139a, 139b, 139c, 139d are plated with low melting metal such as nickel, tin or solder on the surface of silver or other conductors.

The external electrodes 139a, 139b, 139c, 139d may be also formed at four corners of the magnetic member 138 in a top view of the magnetic member 138.

Both ends of the first coil 121, that is, the first leading-out portion 126 and second leading-out portion 127 are electrically connected to the external electrode 139a and external electrode 139b, respectively.

Similarly, in the second coil 122, the third leading-out portion 128 is electrically connected to the external electrode 139c, and the fourth leading-out portion 129 to the external electrode 139d.

As described herein, the noise filter in embodiment 3 of the invention has a three-layer structure consisting of the first laminated body 123 composed of the first inner conductors 121a to 121c only, the second laminated body 124 alternately laminating the first inner conductors 121d, 121e, 121f and second inner conductors 122a, 122b, 122c, being formed on the top of the first laminated body 123, and a third laminated body 125 composed of the second inner conductors 122d to 122f only, being formed on the top of the second laminated body 124. Accordingly, when the current flows in a same direction in the first coil 121 and second coil 122 (clockwise or counterclockwise in a top view of the magnetic member 138), since the first inner conductors 121d, 121e, 121f and second inner conductors 122a, 122b, 122c of the second laminated body 124 are formed alternately, the distance is closer between the alternately formed first inner conductors 121d, 121e, 121f and second inner conductors 122a, 122b, 122c, so that the magnetic fluxes generated in the first inner conductors 121d, 121e, 121f and second inner conductors 122a, 122b, 122c in the second laminated body 124 may reinforce each other. As a result, the impedance in common mode is higher, and if current flows in reverse directions in the first coil 121 and second coil 122, since only the first inner conductors 121a to 121c are formed in the first laminated body 123 and only the second inner conductors 122d to 122f are formed in the third laminated body 125, the magnetic fluxes generated in the first inner conductors 121a to 121c formed in the first laminated body 123 and in the second inner conductors 122d to 122f formed in the third laminated body 125 do not cancel each other, so that the impedance in normal mode may be enhanced.

Therefore, if a current flows in a same direction in the first coil 121 and second coil 122 (first inner conductors 121d, 121e, 121f and second inner conductors 122a, 122b, 122c in the second laminated body 124), the impedance in the first inner conductors 121d, 121e, 121f and second inner conductors 122a, 122b, 122c becomes high, and these inner conductors decrease the noise of the common mode. On the other hand, when flowing in opposite directions, the impedance becomes high in the first inner conductors 121a to 121c formed in the first laminated body 123 and the second inner conductors 122d to 122f formed in the third laminated body 125, and these inner conductors decrease the noise in normal mode.

That is, since the impedance can be heightened in both common mode and normal mode, the impedance of the common mode and normal mode can be adjusted to specified values individually.

Figure 18:
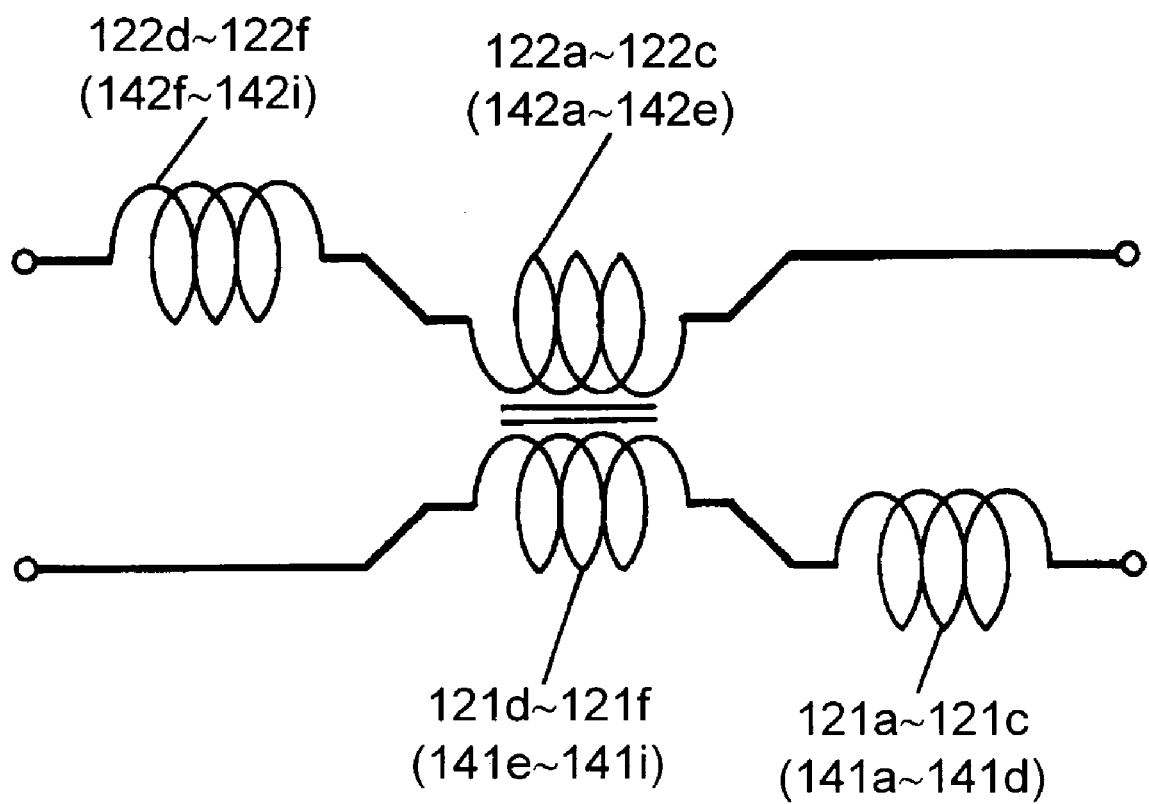
FIG. 18 is an equivalent circuit diagram of the noise filter in embodiments 3 and 4 of the invention.

FIG. 18 is an equivalent circuit diagram of the noise filter in embodiment 3 of the invention.

Incidentally, when the number of first inner conductors formed in the first laminated body 123 and the number of second inner conductors formed in third laminated body 125 are different, if a current flows in reverse directions in the first coil 121 and second coil 122, the intensity of magnetic fluxes generated in the first inner conductors formed in the first laminated body 123 and the second inner conductors formed in the third laminated body 125 is different, so that the impedance in normal mode entered from the first inner conductors may be set different from the impedance in normal mode entered from the second inner conductors.

It is also effective to adjust the magnetic coupling coefficient finely.

That is, in this noise filter, the first and second coils 121, 122 are individually composed of six layers, and three layers thereof, that is, half layers are formed alternately, but by varying the rate of the alternately formed portions (the rate of the inner conductors formed in the second laminated body 24 of the whole inner conductors), the rate of inner conductors capable of mutually reinforcing the generated magnetic fluxes is changed, so that the coupling coefficient changes.

When the coupling coefficient can be thus finely adjusted, the impedance in common mode and impedance in normal mode can be controlled to specified values, and this effect is outstanding.

Further, by maximizing or minimizing the rate of portions formed alternately, the coupling coefficient can be adjusted to a specified value between 0.2 to 0.95, and the impedance in normal mode and common mode can be adjusted.

Figure 19A:
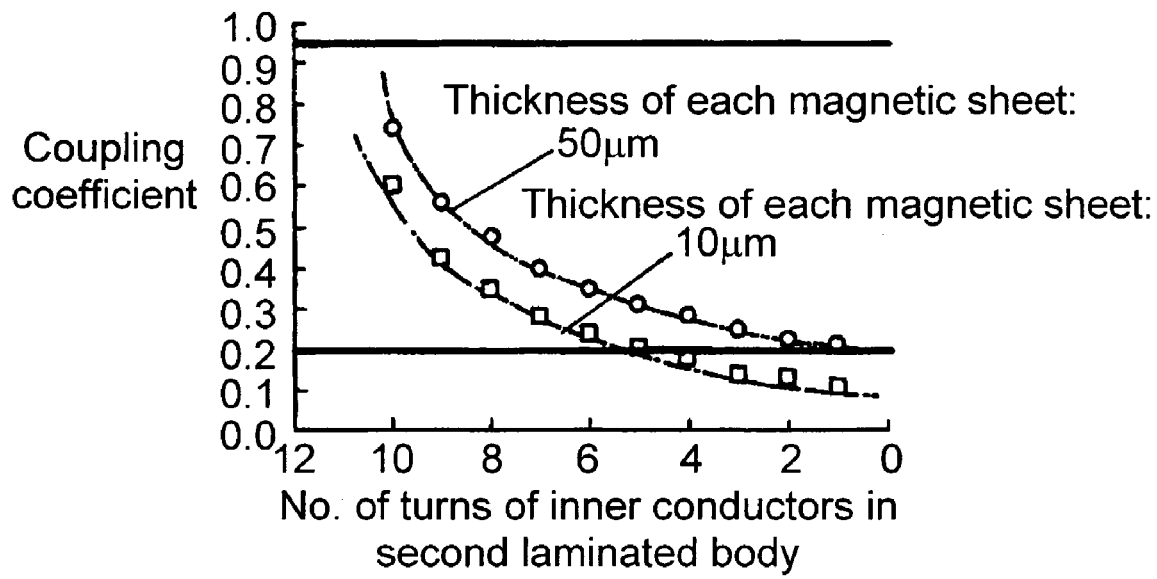
FIG. 19(a) is a diagram showing the relation of the number of turns and coupling coefficient of internal conductors in a second laminated body as the essential part thereof.
Figure 19B:
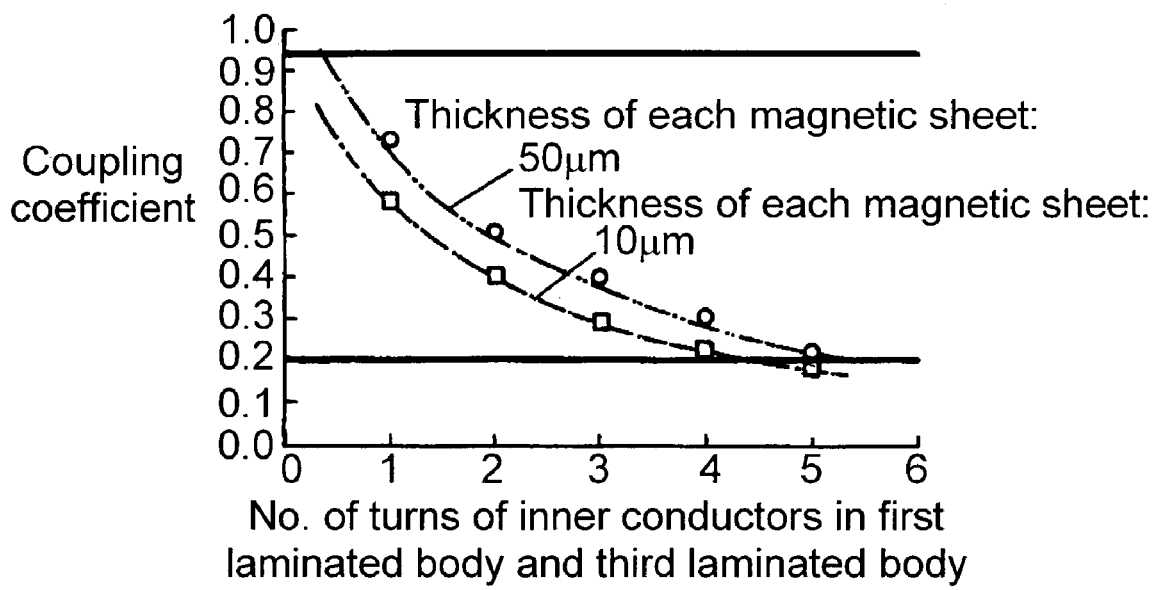
FIG. 19(b) is a diagram showing the relation of the number of turns and coupling coefficient of internal conductors in a first laminated body and a third laminated body as the essential parts thereof.

In the noise filter in embodiment 3 of the invention, FIG. 19(a) is a diagram showing the relation of the number of turns (the number of turns of the first inner conductors 121d to 121f and second inner conductors 122a to 122c) and coupling coefficient of internal conductors in the second laminated body 124, and FIG. 19(b) is a diagram showing the relation of the number of turns (the number of turns of the first inner conductors 121a to 121c and second inner conductors 122d to 122f) and coupling coefficient of internal conductors in the first laminated body 123 and third laminated body 125. Herein, one turn is counted when the inner conductor makes one turn in a top view of the magnetic member 138. That is, when the inner conductor makes a ¼ turn, four layers are laminated to make one turn.

Samples are magnetic members measuring 1.0 mm× 1.0 mm×2.5 mm thick, with the portion surrounded by the spiral first coil 121 and second coil 122 measuring 600 μm×600 μm in a top view of the magnetic member. In FIG. 19(a), the number of turns of the inner conductors is 1 in the first laminated body 123 and third laminated body 125, and in FIG. 19(b), the number of turns of the inner conductors is 10 in the second laminated body 124.

As clear from FIGS. 19(a), (b), the coupling coefficient is larger as the number of turns of the inner conductors in the second laminated body 124 is larger, the number of turns of the inner conductors in the first laminated body and third laminated body is smaller, and the thickness of the magnetic sheets 130, 132, 134 is thinner.

The coupling coefficient is 0.2 to 0.95 when the number of turns of the inner conductors in the second laminated body 124 is 10 or less and the number of turns of the inner conductors in the first laminated body and third laminated body is 5 or more in the case of the thickness of the magnetic sheets 130, 132, 134 of 50 microns, and when the number of turns of the inner conductors in the second laminated body 124 is 5 to 11 and the number of turns of the inner conductors in the first laminated body and third laminated body is 4 or less in the case of the thickness of the magnetic sheets 130, 132, 134 of 100 μm.

As far as possible, meanwhile, when the number of turns of the inner conductors in the first laminated body and third laminated body is smaller and the number of turns of the inner conductors in the second laminated body 124 is larger, the coupling coefficient will be 0.95. Or, as far as possible, when the number of turns of the inner conductors in the first laminated body and third laminated body is larger and the number of turns of the inner conductors in the second laminated body 124 is smaller, the coupling coefficient will be 02.

Further, if the specified impedance in normal mode is obtained, the shape of the first inner conductors 121a to 121c formed in the first laminated body 123, and the shape of the second inner conductors 122d to 122f formed in the third laminated body 125 may not be limited, including the spiral, meandering or other shape formed on one plane. There is no problem if winding direction is reverse.

Incidentally, by bringing the first inner conductors 121d, 121e, 121f and second inner conductors 122a, 122b, 122c in the second laminated body 124 as close-to one turn as possible, the length of each inner conductor may be extended to a maximum extent, and therefore the magnetic fluxes generated in the first inner conductors 121d, 121e, 121f, and the second inner conductors 122a, 122b, 122c can reinforce each other, and if a current flows in a same direction in the first coil 121 and second coil 122 (the first inner conductors 121d, 121e, 121f, and the second inner conductors 122a, 122b, 122c in the second laminated body 124), the impedance in common mode can be further enhanced.

In the noise filter in embodiment 3 of the invention having such configuration, the manufacturing method is explained below by referring to the accompanying drawings.

FIGS. 20(a) to (g) are perspective views showing the manufacturing method of noise filter in embodiment 3 of the invention.

First, from a mixture of oxide of ferrite powder and resin, square first magnetic sheet 130, second magnetic sheet 132, third magnetic sheet 134, and fourth magnetic sheet 137 are fabricated.

Next, as shown in FIG. 20(a), a second via hole 133 is provided at a specified position of the second magnetic sheet 132 by laser, punching or other drilling process.

Further, as shown in FIG. 20(b), the second inner conductor 122f having the fourth leading-out electrode 129 is formed by printing on the second magnetic sheet 132. At the same time, the second via hole 133 is filled with silver or other conductive material. At this time, the end of the second inner conductor 122f is connected to the second via hole 133.

Same as in FIGS. 20(a), (b), the second inner conductors 122d, 122e are formed on the top of the second magnetic sheet 132 having the second via hole 133, the first inner conductors 121d, 121e, 121f and second inner conductors 122a, 122b, 122c are formed on the top of the third magnetic sheet 134 having the third via hole 135 and fourth via hole 136, and the first inner conductors 121a, 121b, 121c are formed on the top of the first magnetic sheet 130 having the first via hole 131.

The inner conductors may be formed not only by printing, but also by other method such as plating, vapor deposition or sputtering.

Consequently, laminating in the configuration as shown in FIG. 20(c), spiral first and second coils 121, 122 are provided, and the first laminated body 123 composed of the first inner conductors 121a to 121c only, the second laminated body 124 formed on the top of the first laminated body 123 composed of the first inner conductors 121d, 121e, 121f and second inner conductors 122a, 122b, 122c alternately, and the third laminated body 125 formed on the top of the second laminated body 124 composed of the second inner conductors 122d to 122f only are formed.

As shown in FIG. 20(d), by cutting so that the first coil 121 and second coil 122 may be incorporated by one each in one noise filter, one laminated body 140 as shown in FIG. 20(e) is obtained. At this time, the first leading-out electrode 126 and third leading-out electrode 128 are exposed from both ends of the laminated body 140, and the second leading-out electrode 127 and fourth leading-out electrode 129 are exposed at other ends.

This laminated body 140 is baked, and a magnetic member 138 is formed.

The magnetic member 138 is chamfered as shown in FIG. 20(f).

Finally, as shown in FIG. 20(g), silver or other conductors are formed in the leading-out electrodes 126, 127, 128, 129 exposed at both ends of the magnetic member 138, and their surfaces are plated with low melting metal such as nickel, tin or solder, and the external electrode 139a is formed in the first leading-out electrode 126, external electrode 139b is formed in the second leading-out electrode 127, external electrode 139c is formed in the third leading-out electrode 128, and external electrode 139d is formed in the fourth leading-out electrode 129, and the noise filter in embodiment 3 of the invention is manufactured.

After forming silver or other conductors, and before nickel plating, the magnetic member 138 is impregnated in fluorine silane coupling agent in decompressed atmosphere.

Herein, by setting the interval of the adjacent first inner conductors 121a to 121c and second inner conductors 122d to 122f in the first laminated body 123 and third laminated body 125 larger than the interval of the adjacent first inner conductors 121d to 121f and second inner conductors 122a to 122c in the second laminated body 124, it is effective to decrease the floating capacity generated in the adjacent first inner conductors 121a to 121c and second inner conductors 122d to 122f in the first laminated body 123 and third laminated body 125, and in the first inner conductors 121a to 121c in the first laminated body 123 and the second inner conductors 122d to 122f in the third laminated body 125. Accordingly, the impedance is enhanced in the high frequency region, and the distance between the first inner conductors 121a to 121c in the first laminated body 123 and the second inner conductors 122d to 122f in the third laminated body 125 can be extended. Therefore, the magnetic fluxes generated in the first inner conductors 121a to 121c in the first laminated body 123 and the second inner conductors 122d to 122f in the third laminated body 125 do not cancel each other, and the impedance in normal mode is enhanced.

Further, by forming a sheet of a lower permeability than that of the magnetic member 138 between the adjacent first inner conductors 121a to 121c and second inner conductors 122d to 122f in the first laminated body 123 and third laminated body 125, the magnetic fluxes generated in the first inner conductors 121a to 121c in the first laminated body 123 and the second inner conductors 122d to 122f in the third laminated body 125 can be weakened, so that the impedance in normal mode can be lowered. Therefore, when the impedance in common mode is constant, by controlling the impedance in normal mode, the coupling coefficient can be adjusted.

Also by equalizing the length among the external electrodes in the first and second coils 121, 122 (between 139a and 139b, and 139c and 139d), the total coil length including the leading-out portions is equal, so that the impedance values may be same in the first and second coils 121, 122.

Moreover, by setting the density of the magnetic member in the first coil 121 (first inner conductors 121d to 121f) and second coil 122 (second inner conductors 122a to 122c) in the second laminated body 124 higher than that of the magnetic member in other parts (first laminated body 123, third laminated body 125), it is effective to lower the porosity between the first coil 121 and second coil 122 (between the first inner conductors 121d to 121f and second inner conductors 122a to 122c in the second laminated body 124), so that the withstand voltage between the first inner conductors 121d to 121f and second inner conductors 122a to 122c in the second laminated body 124 may be maintained.

(Embodiment 4)

A noise filter in embodiment 4 of the invention is explained by referring to the drawings.

Figure 21:
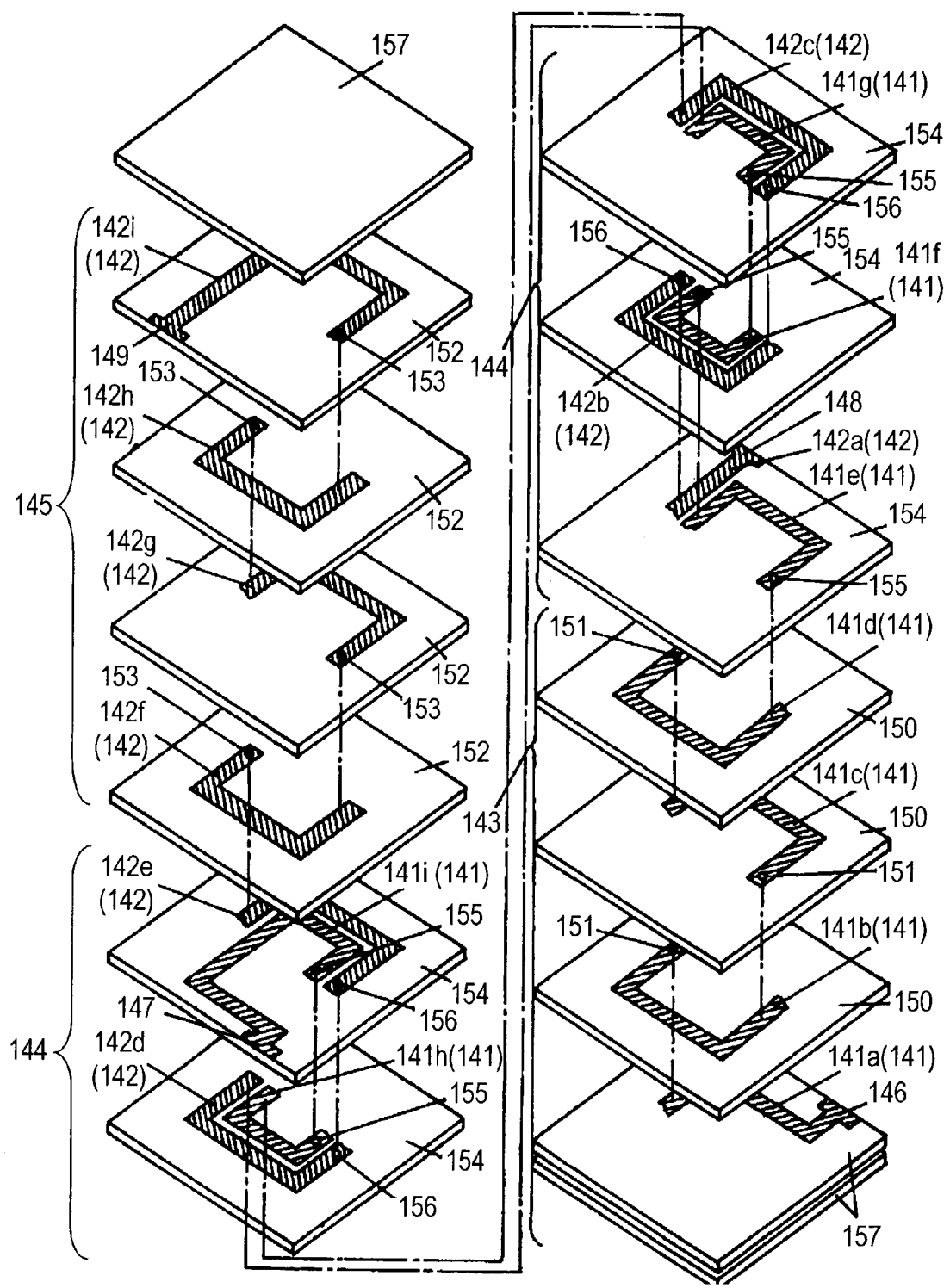
FIG. 21 is a perspective exploded view of the noise filter in embodiment 4 of the invention.

FIG. 21 is a perspective view of the noise filter in embodiment 4 of the invention. In FIG. 21, a spiral first coil 141 is formed by laminating and connecting first inner conductors 141a to 141i sequentially from the bottom. Reference numeral 142 is a spiral second coil, which is formed by laminating and connecting second inner conductors 142a to 142i sequentially from the bottom. That is, the first and second coils 141, 142 are composed of nine layers. The first and second coils 141, 142 are not required to have nine-layer structure. The first inner conductors 141a to 141i and second inner conductors 142a to 142i are made of silver or other conductive material.

The first inner conductors 141a to 141i and second inner conductors 142a to 142i are formed in U-shape except for the lowest and highest layers thereof 141a, 141i, 142a, 142i. Not limited to U-shape, however, they may be formed in L- or other shape.

More specifically, the first inner conductors 141a to 141d, first inner conductor 141e and second inner conductor 142a formed on a same plane, first inner conductor 141f and second inner conductor 142b formed on a same plane, first inner conductor 141g and second inner conductor 142c formed on a same plane, first inner conductor 141h and second inner conductor 142d formed on a same plane, first inner conductor 141i and second inner conductor 142e formed on a same plane, and second inner conductors 142f to 142i are formed sequentially from the bottom, and a portion composed of first inner conductors 141a to 141d only forms a first laminated body 143, a portion composed of first inner conductor and second inner conductor on a same plane (each portion forming the first inner conductor 141e and second inner conductor 142a, first inner conductor 141f and second inner conductor 142b, first inner conductor 141g and second inner conductor 142c, first inner conductor 141h and second inner conductor 142d, and first inner conductor 141i and second inner conductor 142e) forms a second laminated body 144, and a portion composed of second inner conductors 142f to 142i only forms a third laminated body 145. That is, of the nine layers of the first and second coils 141, 142, five layers are formed on a same plane.

In the lowest and highest layers 141a, 141i of the first inner conductors 141a to 141i, first and second leading-out electrodes 146, 147 are formed as the ends of the first coil 141. Similarly, third and fourth leading-out electrodes 148, 149 are formed in the second inner conductors 142a, 142i.

The leading-out electrodes 146, 147, 148, 149 may be also formed at four corners of the magnetic member 158 in a top view of the second inner conductor 142i (magnetic member 158 described below).

A plurality of square first magnetic sheets 150 are formed beneath the first inner conductors 141b to 141d in the first laminated body 143, and a first via hole 151 is formed. Through this first via hole 151, the first inner conductors 141a to 141d are connected.

A plurality of square second magnetic sheets 152 are formed beneath the second inner conductors 142f to 142i in the third laminated body 145, and a second via hole 153 is formed. Through this second via hole 153, the second inner conductors 142e to 142i are connected.

A plurality of square third magnetic sheets 154 are formed beneath the first inner conductor 141e and second inner conductor 142a, first inner conductor 141f and second inner conductor 142b, first inner conductor 141g and second inner conductor 142c, first inner conductor 141h and second inner conductor 142d, and first inner conductor 141i and second inner conductor 142e formed respectively on a same plane of the second laminated body 144, and a third via hole 155 and a fourth via hole 156 are formed (only the third via hole 155 is provided in the magnetic sheet 154 formed beneath the first inner conductor 141e and second inner conductor 142a formed on a same plane).

The first inner conductors 141e and 141f, 141f and 141g, 141g and 141h, and 141h and 141i are connected through the third via hole 155, respectively. The second inner conductors 142a and 142b, 142b and 142c, 142c and 142d, and 142d and 142e are connected through the four via hole 156, respectively.

That is, the fourth via hole 156 is formed in the third magnetic sheet 154 having the third via hole 155 beneath the first inner conductor 141f. The first inner conductor 141f is connected to the first inner conductor 141e through this third via hole 155, and the second inner conductor 142b formed on the same plane as the first inner conductor 141f is connected to the second inner conductor 142a through this fourth via hole 156.

The first inner conductor and second inner conductor formed on a same plane are electrically insulated from each other.

A plurality of square fourth magnetic sheets 157 are formed by a specific number each beneath the first inner conductor 141a and above the second inner conductor 142i.

Magnetic sheets 150, 152, 154, 157 are composed of a mixture of oxide of ferrite powder and resin, and a flat square magnetic member 158 (not shown) is formed by laminating them in the vertical direction as described above. The magnetic member 158 may also have a certain thickness, not being limited to be flat. Or the magnetic member 158 is not always required to be square. The thickness may be adjusted properly depending on the required characteristics (impedance, withstand voltage, etc.), and the thickness may be adjusted by varying the thickness of the magnetic sheet itself, or by changing the number of magnetic sheets to be formed.

The magnetic member 158 is impregnated with fluorine silane coupling agent, and the water-repellent fluorine silane coupling agent permeates into fine pores in the magnetic member 158, so that the humidity resistance of the noise filter can be enhanced.

Of the external electrodes 159a, 159b, 159c, 159d (not shown) formed at both ends of the magnetic member 158, 159a and 159c are formed at one end of the magnetic member 158, and 159b and 159d are formed at other end of the magnetic member 158. The external electrodes 159a, 159b, 159c, 159d are plated with low melting metal such as nickel, tin or solder on the surface of silver or other conductors.

The external electrodes 159a, 159b, 159c, 159d may be also formed at four corners of the magnetic member 158 in a top view of the magnetic member 158.

Both ends of the first coil 141, that is, the first leading-out electrode 146 and second leading-out electrode 147 are electrically connected to the external electrode 159a and external electrode 159b, respectively.

Similarly, in the second coil 142, the third leading-out electrode 148 is electrically connected to the external electrode 159c, and the fourth leading-out electrode 149 to the external electrode 159d.

At this time, of the first inner conductor 141e and second inner conductor 142a, first inner conductor 141f and second inner conductor 142b, first inner conductor 141g and second inner conductor 142c, first inner conductor 141h and second inner conductor 142d, and first inner conductor 141i and second inner conductor 142e respectively formed on a same plane, the first inner conductors 141c, 141d, 141e, 141f, 141g are formed inside of the second inner conductors 142a, 142b, 142c, 142d, 142e.

As described herein, the noise filter in embodiment 4 of the invention comprises three layers, consisting of the first laminated body 143 composed of the first inner conductors 141a to 141d only, the second laminated body 144 formed on the first laminated body 143 composed of the first inner conductor 141e and second inner conductor 142a, first inner conductor 141f and second inner conductor 142b, first inner conductor 141g and second inner conductor 142c, first inner conductor 141h and second inner conductor 142d, and first inner conductor 141i and second inner conductor 142e respectively formed on a same plane, and the third laminated body 145 formed on the second laminated body 144 composed of the second inner conductors 142f to 142i only. Accordingly, when the current flows in a same direction in the first coil 141 and second coil 142 (clockwise or counterclockwise in a top view of the magnetic member 158), since the magnetic fluxes generated in the first inner conductors 141a to 141i and second inner conductors 142a to 142e of the second laminated body 144 reinforce each other, and the impedance in common mode is higher. Further, if current flows in reverse directions in the first coil 141 and second coil 142, since only the first inner conductors 141a to 141d are formed in the first laminated body 143 and only the second inner conductors 142f to 142i are formed in the third laminated body 145, the magnetic fluxes generated in the first inner conductors 141a to 141d formed in the first laminated body 143 and the second inner conductors 142f to 142i formed in the third laminated body 145 do not cancel each other, so that the impedance in normal mode may be enhanced.

Therefore, if a current flows in a same direction in the first coil 141 and second coil 142 (first inner conductors 141e to 141i and second inner conductors 142a to 142e in the second laminated body 144), the impedance in the first inner conductors 141e to 141i and second inner conductors 142a to 142e becomes high, and these inner conductors decrease the noise of the common mode. On the other hand, when flowing in opposite directions, the impedance becomes high in the first inner conductors 141a to 141d formed in the first laminated body 143 and the second inner conductors 142f to 142i formed in the third laminated body 145, and these inner conductors decrease the noise in normal mode.

The equivalent circuit diagram of the noise filter in embodiment 4 of the invention is also shown in FIG. 18.

Incidentally, when the number of inner conductors formed in the first laminated body 143 and the number of second inner conductors formed in third laminated body 145 are different, if a current flows in reverse directions in the first coil 141 and second coil 142, the intensity of magnetic fluxes generated in the first inner conductors formed in the first laminated body 143 and the second inner conductors formed in the third laminated body 145 is different, so that the impedance in normal mode entered from the first inner conductors may be set different from the impedance in normal mode entered from the second inner conductors.

As described above, in the second laminated body 144, since the first inner conductors 141*e*, 141*f*, 141*g*, 141*h*, 141*i* are formed inside of the second inner conductors 142*a*, 142*b*, 142*c*, 142*d*, 142*e*, the length between external electrodes (159*a* and 159*b*, 159*c* and 159*d*) in the first and second coils 141, 142 is different. As a result, the impedance values of the first and second coils 141, 142 differ, but such inconvenience may be eliminated by increasing the number of first inner conductors formed in the first laminated body 143 more than the number of second inner conductors formed in the third laminated body 145, and by equalizing the distance between external electrodes (159*a* and 159*b*, 159*c* and 159*d*) in the first and second coils 141, 142.

It is also effective to adjust the magnetic coupling coefficient finely.

That is, in this noise filter, the first and second coils 141, 142 are individually composed of nine layers, and five layers thereof, that is, about 56% are formed on the same plane, but by varying the rate of the portions formed on the same plane (the rate of the inner conductors formed in the second laminated body 144 of the whole inner conductors), the rate of inner conductors capable of mutually reinforcing the generated magnetic fluxes is changed, so that the coupling coefficient changes.

When the coupling coefficient can be thus finely adjusted, the impedance in common mode and impedance in normal mode can be controlled to specified values, and this effect is outstanding.

Further, by maximizing or minimizing the rate of portions formed on the same plane, the coupling coefficient can be adjusted to a specified value between 0.2 to 0.95, and the impedance in normal mode and common mode can be adjusted.

Further, if the specified impedance in normal mode is obtained, the shape of the first inner conductors 141*a* to 141*d* formed in the first laminated body 143, and the shape of the second inner conductors 142*f* to 142*i* formed in the third laminated body 145 may not be limited, including the spiral, meandering or other shape formed on one plane. There is no problem if winding direction is reverse.

Incidentally, by bringing the first inner conductors 141*e* to 141*i* and second inner conductors 142*a* to 142*e* in the second laminated body 144 as close to one turn as possible, the length of each inner conductor may be extended to a maximum extent, and therefore the magnetic fluxes generated in the first inner conductors 141*e* to 141*i*, and the second inner conductors 142*a* to 142*e* can reinforce each other, and if a current flows in a same direction in the first coil 141 and second coil 142 (the first inner conductors 141*e* to 141*i* and the second inner conductors 142*a* to 142*e* in the second laminated body 144), the impedance in common mode can be further enhanced.

The manufacturing method is same as in embodiment 3 of the invention, basically, except that the forming positions of the inner conductors are different, and the explanation is omitted.

Herein, by setting the interval of the adjacent first inner conductors 141*a* to 141*d* and second inner conductors 142*f* to 142*i* in the first laminated body 143 and third laminated body 145 larger than the interval of the first inner conductors and second inner conductors formed on a same plane in the second laminated body 144 (between the first inner conductor 141*e* and second inner conductor 142*a*, 141*f* and 142*b*, 141*g* and 142*c*, 141*h* and 142*d*, and 141*i* and 142*e*), it is effective to decrease the floating capacity generated in the adjacent first inner conductors 141*a* to 141*d* and second inner conductors 142*f* to 142*i* in the first laminated body 143 and third laminated body 145, and in the first inner conductors 141*a* to 141*d* in the first laminated body 143 and the second inner conductors 142*f* to 142*i* in the third laminated body 145. Accordingly, the impedance is enhanced in the high frequency region, and the distance between the first inner conductors 141*a* to 141*d* in the first laminated body 143 and the second inner conductors 142*f* to 142*i* in the third laminated body 145 can be extended, and therefore, the magnetic fluxes generated in the first inner conductors 141*a* to 141*d* in the first laminated body 143 and the second inner conductors 142*f* to 142*i* in the third laminated body 145 do not cancel each other, and the impedance in normal mode is enhanced.

Further, by forming a sheet of a lower permeability than that of the magnetic member 138 between the adjacent first inner conductors 141*a* to 141*d* and second inner conductors 142*f* to 142*i* in the first laminated body 143 and third laminated body 145, the magnetic fluxes generated in the first inner conductors 141*a* to 141*d* in the first laminated body 143 and the second inner conductors 142*f* to 142*i* in the third laminated body 145 can be weakened, so that the impedance in normal mode can be lowered. Therefore, when the impedance in common mode is constant, by controlling the impedance in normal mode, the coupling coefficient can be adjusted.

Also by equalizing the length among the external electrodes in the first and second coils 141, 142 (between 159*a* and 159*b*, and 159*c* and 159*d*), the total coil length including the leading-out portions is equal, so that the impedance values may be same in the first and second coils 141, 142.

Moreover, by setting the density of the magnetic member in the adjacent first coil 141 and second coil 142 in the second laminated body 144 (the first inner conductor 141*e* and second inner conductor 142*a*, 141*f* and 142*b*, 141*g* and 142*c*, 141*h* and 142*d*, and 141*i* and 142*e*) higher than that of the magnetic member in other parts (first laminated body 143, third laminated body 145), it is effective to lower the porosity between the first coil 141 and second coil 142 in the laminated body 144, so that the withstand-voltage between the first coil 141 and second coil 142 in the second laminated body 144 may be maintained.

In the foregoing embodiments 3 and 4 of the invention, by setting the distance between the first laminated body 123, 143 and the second laminated body 124, 144 (between the first inner conductor 121*c* and second inner conductor 122*a*, between the first inner conductor 141*d* and second inner conductor 142*a*), and between the second laminated body 124, 144 and the third laminated body 125, 145 (between the first inner conductor 121*f* and second inner conductor 122*d*, between the first inner conductor 141*i* and second inner conductor 142*f*) longer than the distance between the adjacent inner conductors in the first laminated body 123, 143, second laminated body 124, 144, and third laminated body 125, 145, it is effective to decrease the floating capacity generated in the first inner conductors 121*a* to 121*c*, 141*a* to 141*d* in the first laminated body 123, 143, and second inner conductors 122*d* to 122*f*, 142*f* to 142*i* in the third laminated body 125, 145 Accordingly, the impedance is enhanced in the high frequency region, and the distance between the first inner conductors 121a to 121c, 141a to 141d in the first laminated body 123, 143 and the second inner conductors 122d to 122f, 142f to 142i in the third laminated body 125, 145 can be extended, and therefore, the magnetic fluxes generated in the first inner conductors 121a to 121c, 141a to 141d in the first laminated body 123, 143 and the second inner conductors 122d to 122f, 142f to 142i in the third laminated body 125, 145 do not cancel each other, and the impedance in normal mode is enhanced.

Further, by forming magnetic sheets of a lower permeability than that of the other magnetic sheets between the first laminated body 123, 143 and second laminated body 124, 144, and between the second laminated body 124, 144 and third laminated body 125, 145, the magnetic fluxes generated in the first inner conductors 121a to 121c, 141a to 141d in the first laminated body 123, 143 and the second inner conductors 122d to 122f, 142f to 142i in the third laminated body 125, 145 do not cancel each other, so that the impedance in normal mode may be enhanced.

(Embodiment 5)

Figure 22:
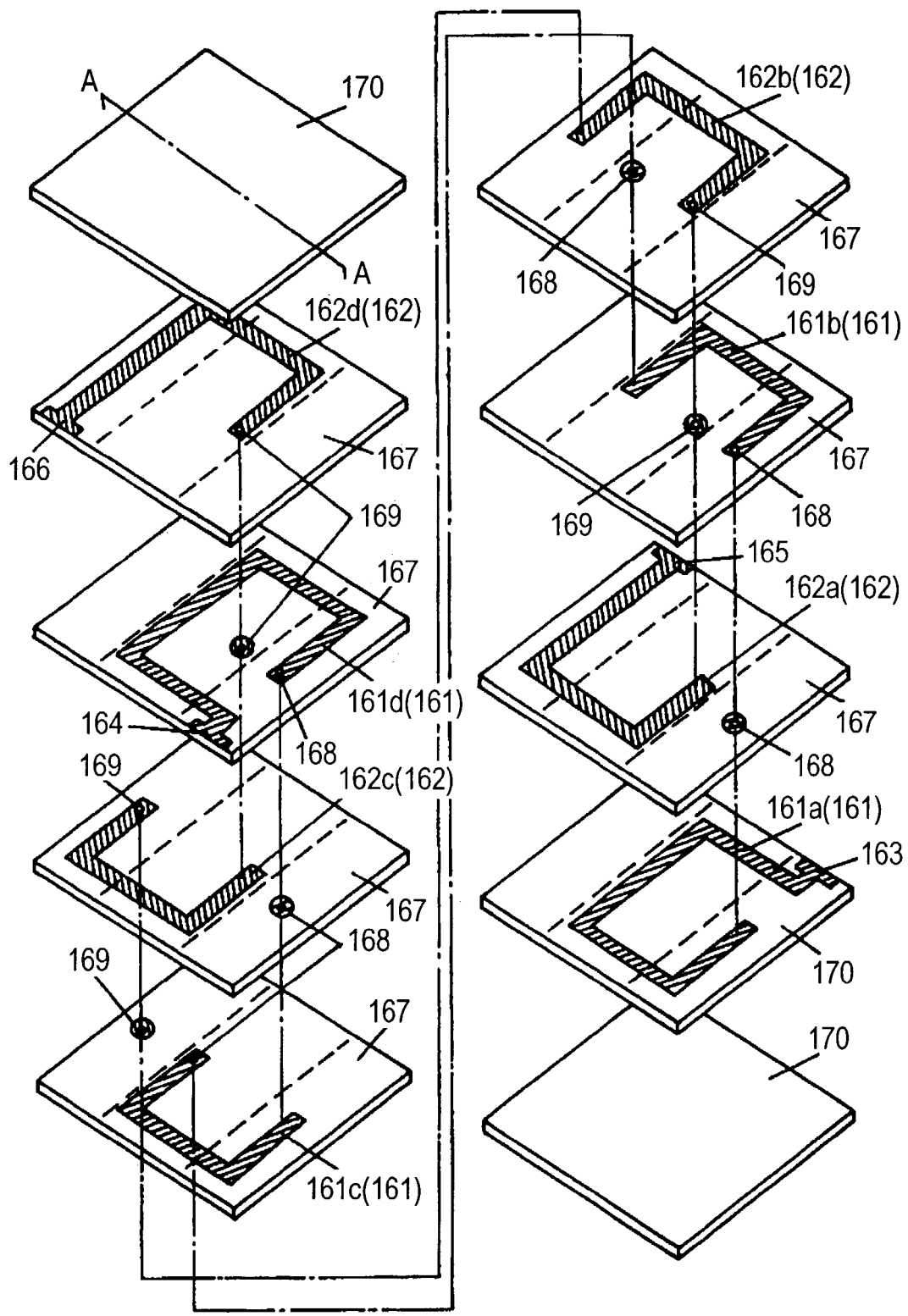
FIG. 22 is a perspective exploded view of a noise filter in embodiment 5 of the invention.
Figure 23A:
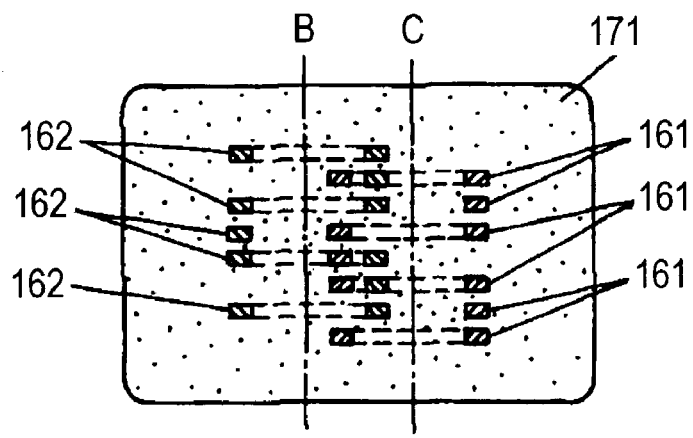
FIG. 23(a) is a sectional view of line A—A in FIG. 22.
Figure 23B:
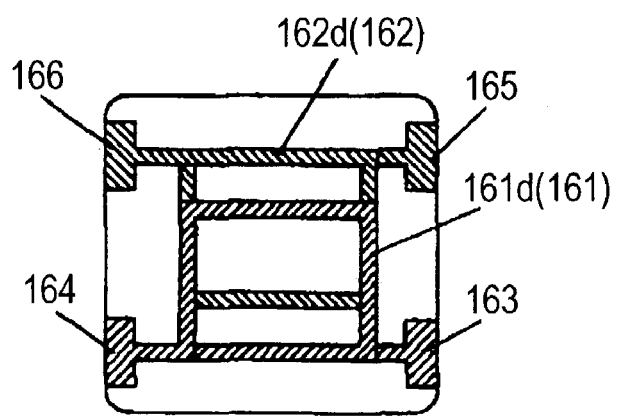
FIG. 23(b) is a top see-through diagram of the noise filter.

FIG. 22 is a perspective exploded view of a noise filter in embodiment 5 of the invention, FIG. 23(a) is a sectional view of line A—A in FIG. 22, and FIG. 23(b) is a top see-through diagram of the noise filter.

A spiral first coil 161 is formed by laminating and connecting first inner conductors 161a to 161d sequentially from the bottom. A spiral second coil 162 is formed by laminating and connecting second inner conductors 162a to 162d sequentially from the bottom. That is, the first and second coils 161, 162 are composed of four layers. The first and second coils 161, 162 are not required to have four-layer structure. The first inner conductors 161a to 161d and second inner conductors 162a to 162d are made of silver or other conductive material.

The first inner conductors 161a to 161d and second inner conductors 162a to 162d are formed in U-shape except for the lowest and highest layers thereof 161a, 161d, 162a, 162d. Not limited to U-shape, they may be formed in L- or other shape.

The first inner conductor 161a, second inner conductor 162a, first inner conductor 161b, second inner conductor 162b, first inner conductor 161c, second inner conductor 162c, and first inner conductor 161d, second inner conductor 162d are sequentially laminated from the bottom, that is, the first inner conductors 161a to 161d and second inner conductors 162a to 162d are formed alternately. Further, as shown in FIG. 23(b), in a top view of the second inner conductor 162d (a top view of a magnetic member 171 mentioned below), the area enclosed by the first coil 161 and the area enclosed by the second coil 162 are formed to overlap only in part individually.

That is, supposing the central axis of the spiral first coil 162 to be B and the central axis of the spiral second coil 161 to be C, B and C are deviated.

Herein, B and C are deviated to such an extent that the area enclosed by the first coil 161 and the area enclosed by the second coil 162 may overlap completely, or may not overlap completely in a top view (a top view of the magnetic member 171 mentioned below) of the second inner conductor 162d of the first and second coils 161, 162.

In the lowest layer and highest layer 161a, 161d of the first inner conductors 161a to 161d, first and second leading-out electrodes 163, 164 are formed as the ends of the first coil 161. Similarly, third and fourth leading-out electrodes 165, 166 are formed in the second inner conductors 162a, 162d.

The leading-out electrodes 163, 164, 165, 166 may be also formed at four corners of the magnetic member 171 in a top view of the second inner conductor 162d (magnetic member 171 described below).

A plurality of square first magnetic sheets 167 are formed beneath the first inner conductors 161b to 161d, and second inner conductors 162a to 162d, and a first via hole 168 and a second via hole 169 are formed (only the first via hole 168 is formed in the first magnetic sheet 167 formed beneath the second inner conductor 162a, and only the second via hole 169 is formed in the first magnetic sheet 167 formed beneath the second inner conductor 162d).

Through the first via hole 168, the first inner conductors 161a and 161b, 161b and 161c, and 161c and 161d are connected. Through the second via hole 169, similarly, the second inner conductors 162a and 162b, 162b and 162c, and 162c and 162d are connected.

That is, the second via hole 169 is formed in the first magnetic sheet 167 having the first via hole 168 beneath the first inner conductor 161b. The first inner conductor 161b is connected to the first via hole 168 and the first inner conductor 161a through the first via hole 168 disposed in the first magnetic sheet 167 formed beneath it (above the first inner conductor 161a), and the second inner conductor 162b is connected to the second via hole 169 and the second inner conductor 162a through the second via hole 169 disposed in the first magnetic sheet 167 formed above it (beneath the inner conductor 162b).

The first via hole 168 and second inner conductors 162a to 162d,and the second via hole 169 and first inner conductors 161a to 161d are electrically insulated from each other.

A plurality of square second magnetic sheets 170 are formed by a specified number of sheets beneath the first inner conductor 161a and above the second inner conductor 162d.

Magnetic sheets 167, 170 are composed of a mixture of oxide of ferrite powder and resin, and a flat square magnetic member 171 is formed by laminating them in the vertical direction as described above. The magnetic member 171 may also have a certain thickness, not being limited to be flat. Or the magnetic member 171 is not always required to be square. The thickness may be adjusted properly depending on the required characteristics (impedance, withstand voltage, etc.), and the thickness may be adjusted by varying the thickness of the magnetic sheet itself, or by changing the number of magnetic sheets to be formed.

The magnetic member 171 is impregnated with fluorine silane coupling agent, and the water-repellent fluorine silane coupling agent permeates into fine pores in the magnetic member 171, so that the humidity resistance of the noise filter can be enhanced.

Of the external electrodes 172a, 172b, 172c, 172d (not shown) formed at both ends of the magnetic member 171, 172a and 172c are formed at one end of the magnetic member 171, and 172b and 172d are formed at other end of the magnetic member 171. The external electrodes 172a, 172b, 172c, 172d are plated with low melting metal such as nickel, tin or solder on the surface of silver or other conductors.

The external electrodes 172a, 172b, 172c, 172d may be also formed at four corners of the magnetic member 171 in a top view of the magnetic member 171.

Both ends of the first coil 161, that is, the first leading-out electrode 163 and second leading-out electrode 164 are electrically connected to the external electrode 172a and external electrode 172b, respectively.

Similarly, in the second coil 162, the third leading-out electrode 165 is electrically connected to the external electrode 172c, and the fourth leading-out electrode 166 to the external electrode 172d.

Figure 24:
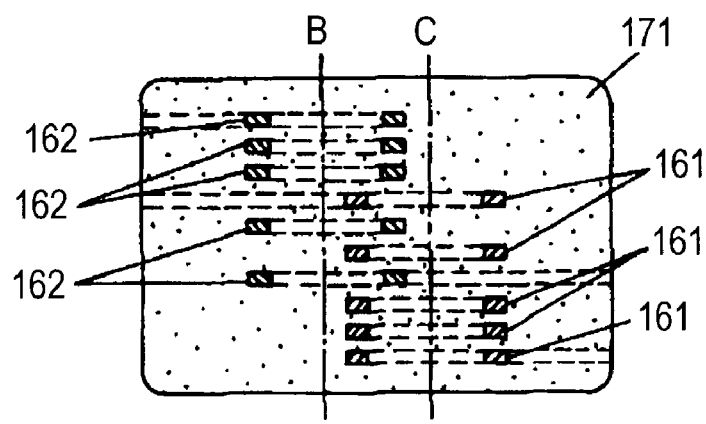
FIG. 24 is a sectional view of other example of the noise filter.

As shown in FIG. 24, meanwhile, the central axis B of the spiral first coil 161 and the central axis C of the spiral second coil 162 may be deviated as explained in embodiment 5 of the invention, and it may be designed to comprise, as in embodiment 3 of the invention, a first laminated body composed of the first inner conductors only, a second laminated body formed on the top of the first laminated body, alternately laminating the first inner conductors and second inner conductors, and a third laminated body formed on the top of the second laminated body, composed of the second inner conductors only.

Figure 5B:
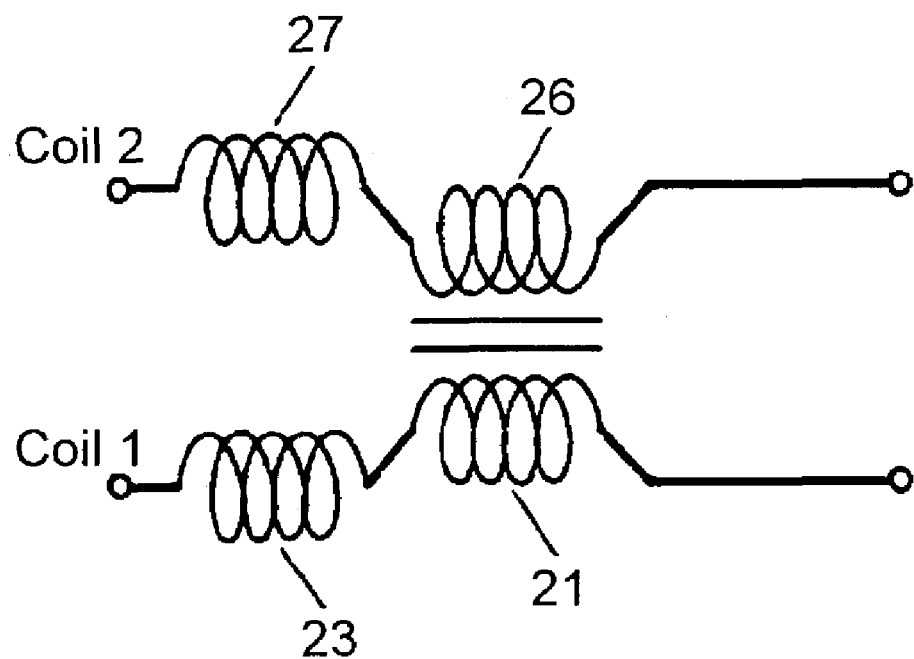
FIG. 5(b) is an equivalent circuit diagram of the noise filter (pattern B)
Figure 25A:
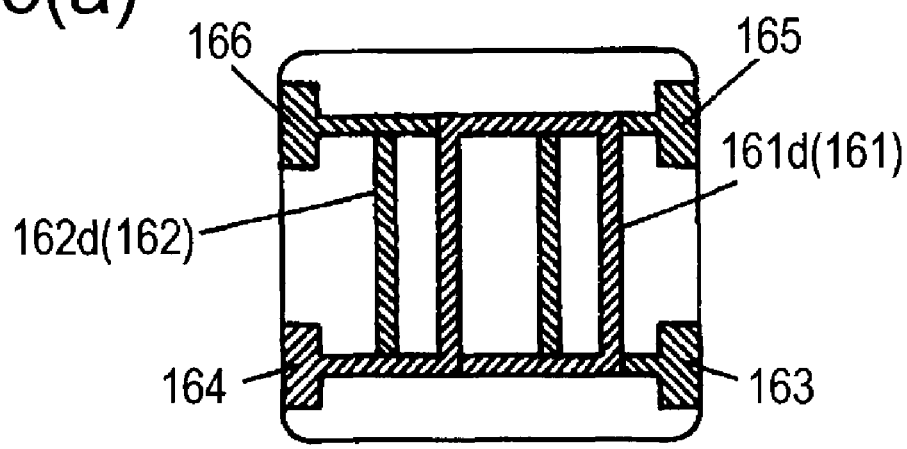
FIGS. 25(a), (b) are top see-through diagrams of other example of the noise filter.
Figure 25B:
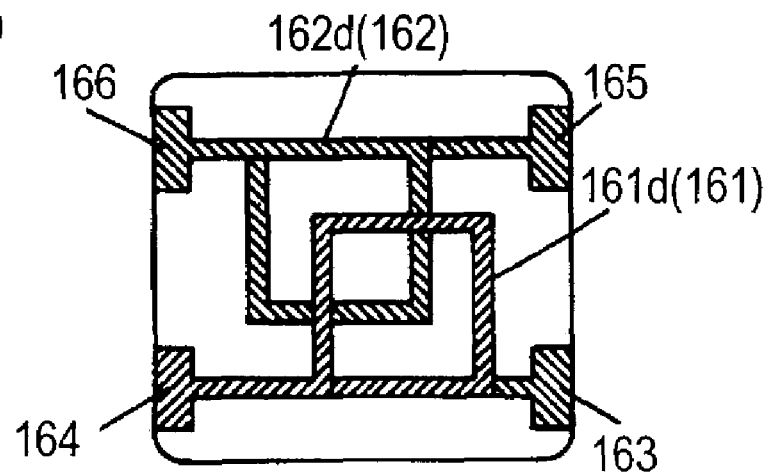

Or, as shown in FIG. 25(a), in a top view of the magnetic member 171, the area enclosed by the first coil 161 and the area enclosed by the second coil 162 may cross orthogonally in the portion shown in FIG. 23(b), or as shown in FIG. 5(b), in a top view of the magnetic member 171, the overlapping portion of the area enclosed by the first coil 161 and the area enclosed by the second coil 162 may be diagonal.

Figure 26A:
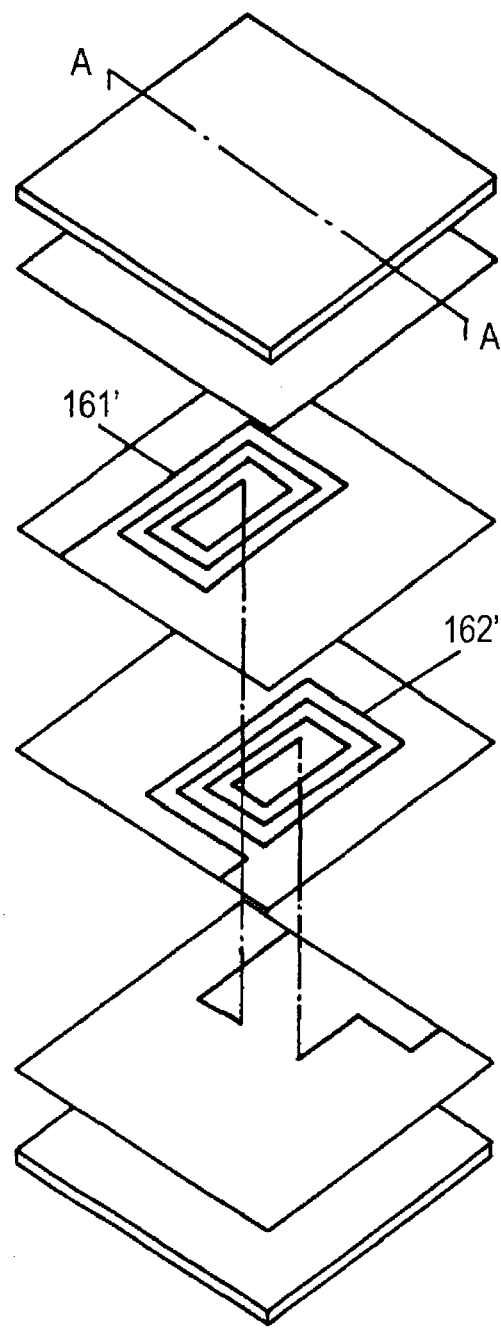
FIG. 26(a) is a perspective exploded view of other example of the noise filter.
Figure 26B:
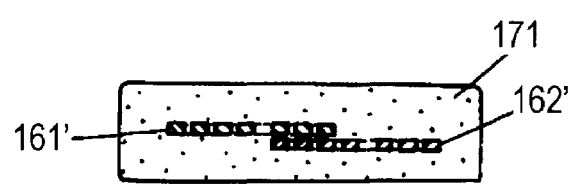
FIG. 26(b) is a sectional view of line A—A in other example of the noise filter.

Further, as shown in FIGS. 26(a), (b), spiral first and second coils 161', 162' may overlap in part in a top view of the magnetic member.

As described herein, in the noise filter in embodiment 5 of the invention, the spiral first coil 161 composed of first inner conductors 161a to 161d and spiral second coil 162 composed of second inner conductors 162a to 162d are formed to overlap only in part, in the area enclosed by the first coil 161 and the area enclosed by the second coil 162, in a top view of the magnetic member 171. When a current flows in a same direction in the first coil 161 and second coil 162 (clockwise or counterclockwise in a top view of the magnetic member 171), since the first inner conductors 161a to 161d and second inner conductors 162a to 162d are formed alternately, the distance of the alternately formed mutually adjacent first inner conductors 161a to 161d and second inner conductors 162a to 162d is closer. As a result, in a top view of the magnetic member 171 in the first coil 161 and second coil 162, the magnetic fluxes generated in the overlapped portions of area enclosed by the first coil 161 and the area enclosed by the second coil 162 can reinforced with each other, and the impedance in common mode is enhanced, and if a current flows in opposite directions in the first coil 161 and second coil 162, in a top view of the magnetic member 171 in the first coil 161 and second coil 162, the magnetic fluxes generated in the non-overlapped portions of area enclosed by the first coil 161 and the area enclosed by the second coil 162 do not cancel each other, so that the impedance in normal mode may be enhanced.

Therefore, when a current flows in a same direction in the first coil 161 (first inner conductors 161a to 161d) and second coil 162 (second inner conductors 162a to 162d), the impedance becomes higher in the overlapped portion in a top view of the magnetic member 171 in the first coil 161 and second coil 162, and this portion lowers the noise in common mode. If flowing in opposite directions, to the contrary, the impedance becomes high in the non-overlapped portion in a top view of the magnetic member 171 in the first coil 161 and second coil 162, and this portion lowers the noise in normal mode.

Figure 27:
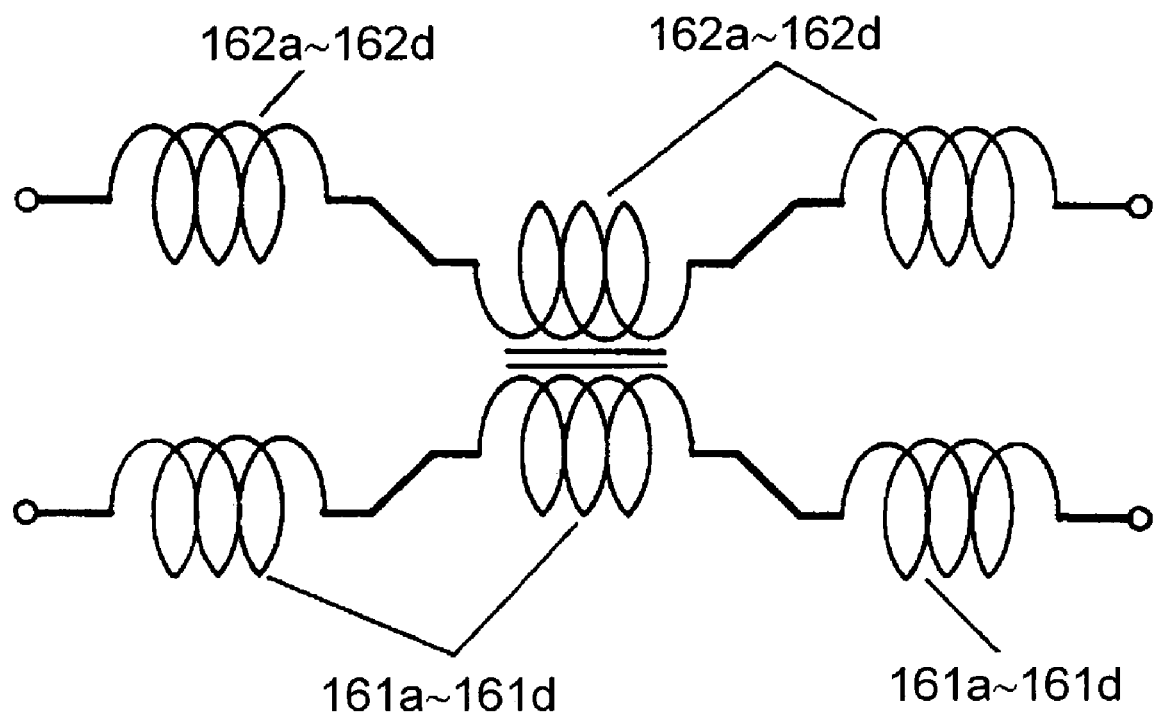
FIG. 27 is an equivalent circuit diagram of the noise filter.

FIG. 27 is an equivalent circuit diagram of the noise filter in embodiment 5 of the invention. In the first coil 161 and second coil 162 for heightening the impedance in normal mode, when the area is equal in the non-overlapped portion in a top view of the magnetic member 171 in the enclosed portion of the first coil 161 and enclosed portion of the second coil 162, the impedance in normal mode is equal, so that there is no directivity.

If the area is not equal in the non-overlapped portion in a top view of the magnetic member 171 in the enclosed portion of the first coil 161 and enclosed portion of the second coil 162, when a current flows in opposite directions in the first coil 161 and second coil 162, the intensity of magnetic fluxes generated in the first coil 161 and second coil 162 is different. As a result, the impedance in normal mode entered from the first coil 161 is different from the impedance in normal mode entered from the second coil 162.

Further, the magnetic coupling coefficient can be adjusted finely. That is, in this noise filter, by varying the overlapped portion area of the first and second coils 161, 162 in a top view of the magnetic member 171, the rate of the inner conductors for reinforcing the generated magnetic fluxes mutually varies, so that the coupling coefficient is changed.

When the coupling coefficient can be thus finely adjusted, the impedance in common mode and impedance in normal mode can be individually set to desired values, and this effect is outstanding.

Further, by maximizing or minimizing the area of overlapped portions of the first and second coils 161, 162 in a top view of the magnetic member 171, the coupling coefficient can be adjusted to a specified value between 0.2 to 0.95, and the impedance in normal mode and common mode can be adjusted.

Further, if the specified impedance in normal mode is obtained, the shape of the first inner conductors 161a to 161d and second inner conductors 162a to 162d may not be limited, including the spiral, meandering or other shape. There is no problem if winding direction is reverse.

Incidentally, by bringing the first inner conductors 161a to 161d and second inner conductors 162a to 162d as close to one turn as possible, the length of each inner conductor may be extended to a maximum extent, and therefore the magnetic fluxes generated in the first inner conductors 161a to 161d and second inner conductors 162a to 162d can reinforce each other, and if a current flows in a same direction in the first coil 161 and second coil 162, the impedance in common mode can be further enhanced.

The manufacturing method is same as in embodiment 3 of the invention, basically, except that the forming positions of the inner conductors are different, and the explanation is omitted.

Herein, by equalizing the length among the external electrodes in the first and second coils 161, 162 (between 172a and 172b, and 172c and 172d), the total coil length including the leading-out portions is equal, so that the impedance values may be same in the first and second coils 161, 162.

Moreover, by setting the density of the magnetic member in the adjacent first inner conductors of the first coil 161 and second inner conductors of the second coil 162 (the inner conductor 161a and second inner conductor 162a, 162a and 161b, 161b and 162b, etc.) higher than that of the magnetic member in other inner conductors, it is effective to lower the porosity between the first coil 161 and second coil 162 (between the adjacent first inner conductor and second inner conductor each), so that the withstand voltage may be maintained between the first inner conductor 161a and second inner conductor 162a, 162a and 161b, 161b and 162b (between the first coil 161 and second coil 162).

In the noise filters in the foregoing embodiments 3 to 5 of the invention, the junctions of a pair of external electrodes formed at one end of the magnetic member and the first coil and second coil electrically connected to the external electrodes are formed above or beneath, in a side view of the magnetic member, the junctions of a pair of external electrodes formed at other end of the magnetic member and the first coil and second coil electrically connected to the external electrodes, and therefore if the direction is different when mounting on the board, the attenuation characteristics are not changed.

Figure 28A:
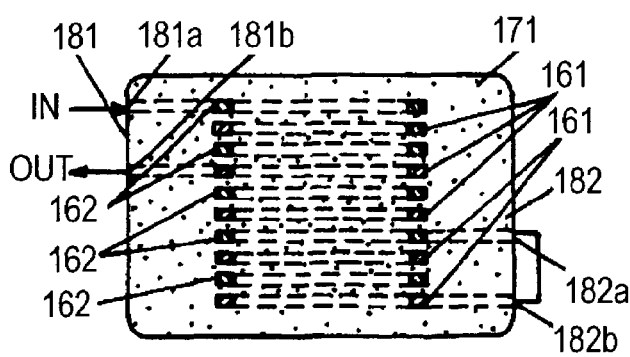
FIG. 28(a) is a sectional view of the noise filter (pattern A) in embodiments 3 to 5.

In the noise filters in the foregoing embodiments 3 to 5 of the invention, further as shown in FIG. 28(a) (which shows a sectional view of the noise filter in embodiment 5 of the invention as an example), the junctions 181a, 181b of a pair of external electrodes 181 formed at one end of the magnetic member 171 and the first coil 161 and second coil 162 electrically connected thereto are formed above, in a side view of the magnetic member 171, the junctions 182a, 182b of a pair of external electrodes 182 formed at other end of the magnetic member 171 and the first coil 161 and second coil 162 electrically connected thereto (pattern A). The equivalent circuit diagram of pattern A is shown in FIG. 18.

At this time, in a side view of the magnetic member 171, the junction 181a of the external electrode 181 formed at one end of the magnetic member 171 and the first coil 161, the junction 181b of the external electrode 181 formed at one end of the magnetic member 171 and the second coil 162, the junction 182a of the external electrode 182 formed at other end of the magnetic member 171 and the first coil 161, and the junction 182b of the external electrode 182 formed at other end of the magnetic member 171 and the second coil 162 are formed sequentially from the top. It is same if the first coil 161 and second coil 162 are exchanged.

Figure 28B:
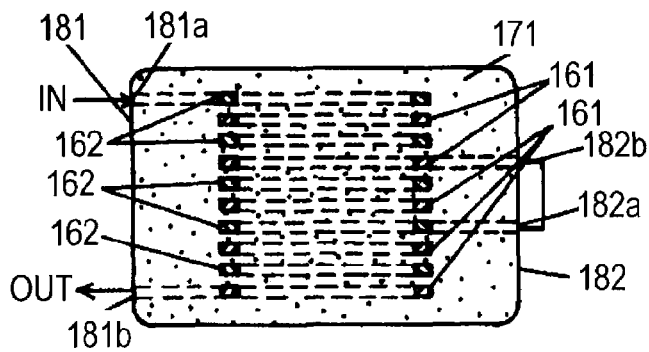
FIGS. 28(b), (c) are sectional views of the noise filter of pattern B.
Figure 28C:
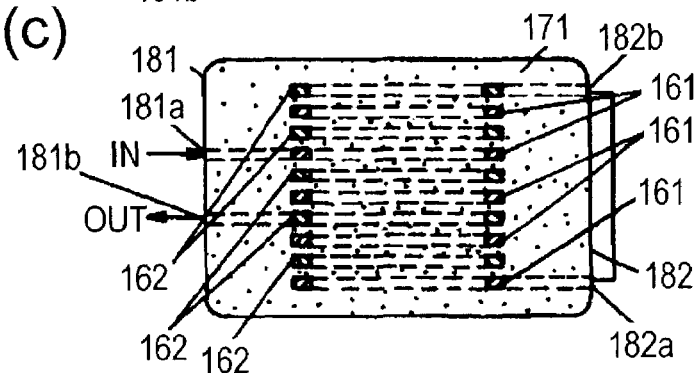
FIG. 28(d) is a diagram showing the relation of frequency and attenuation of noise filters of pattern A and pattern B in embodiments 3 to 5.

By contrast, the junctions 181a, 181b of a pair of external electrodes 181 formed at one end of the magnetic member 171 and the first coil 161 and second coil 162 electrically connected thereto may be formed, as shown in FIG. 28(b), either above or beneath, in a side view of the magnetic member 171, the junctions 182a, 182b of a pair of external electrodes 182 formed at other end of the magnetic member 171 and the first coil 161 and second coil 162 electrically connected thereto, or, as shown in FIG. 28(c), may be formed between the junctions 182a and 182b (pattern B). FIG. 28(c) shows the mounting direction is changed (inverted) from the configuration in FIG. 28(b).

Figure 28D:
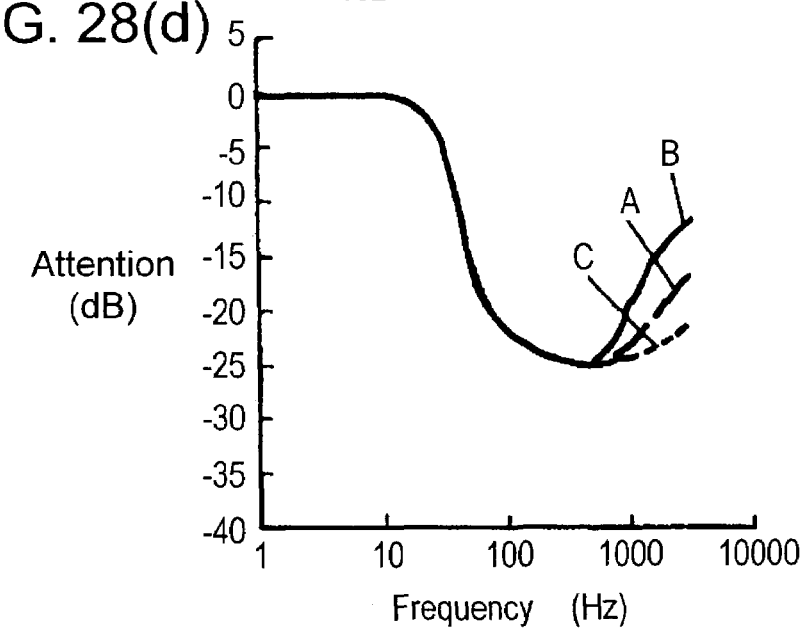

FIG. 28(d) shows the relation (attenuation characteristics) of frequency and attenuation of noise filters of pattern A and pattern B in embodiments 3 to 5 of the invention. The same samples as in FIG. 19 were used. In the diagram, A, B, C correspond to FIGS. 28(a), (b), (c).

Figure 29:
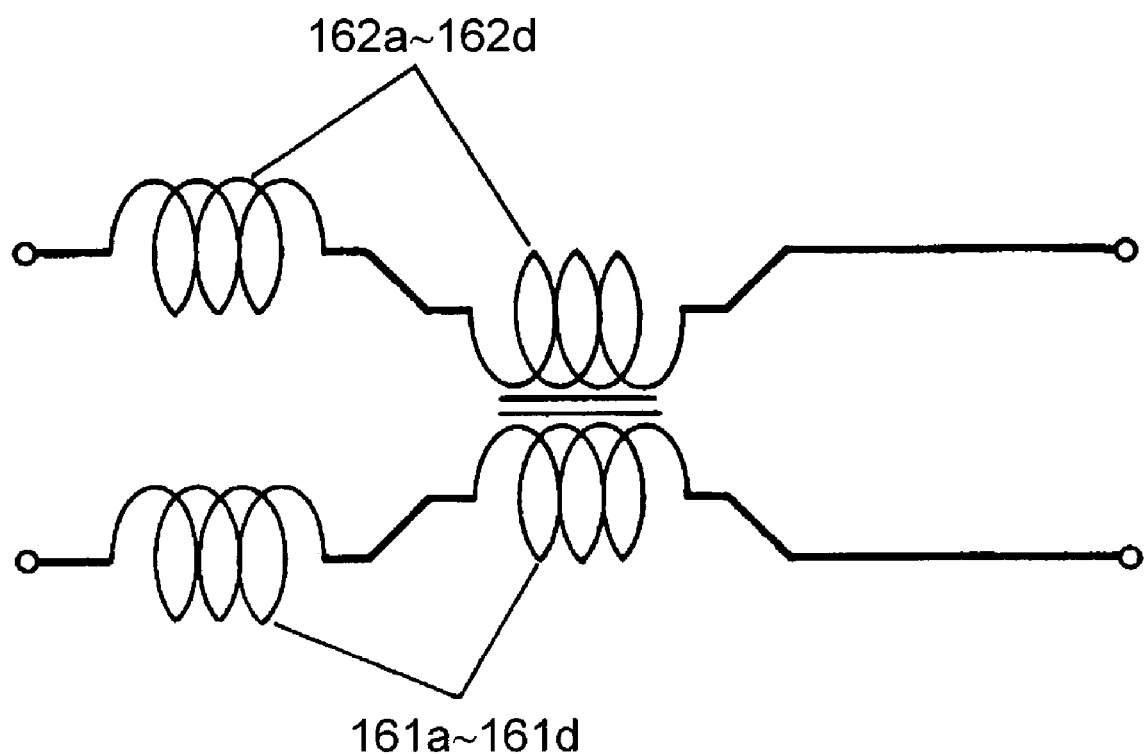
FIG. 29 is an equivalent circuit diagram of the noise filter of pattern B in a comparative example.

As clear from FIG. 28(d), in embodiments 3 to 5 of the invention, the noise filter of pattern A is free from fluctuation in the attenuation characteristics, but pattern B fluctuates (when the current direction is changed). The equivalent circuit diagram of pattern B is shown in FIG. 29.

This is because, in the noise filters of pattern A in embodiments 3 to 5 of the invention, the distance between the junctions 181a and 181b of a pair of external electrodes 181 formed at one end of the magnetic member 171 and the first coil 161 and second coil 162, and the distance between the junctions 182a and 182b of a pair of external electrodes 182 formed at other end of the magnetic member 171 and the first coil 161 and second coil 162 are equal to each other, and therefore if the applied direction of the normal mode current is different (the current entering from 181a and leaving from 182a further enters from 182b and leaves from 181a, or the current entering from 182a and leaving from 181a further enters from 181b and leaves from 182a), the floating capacity generated in the magnetic member 171 (the floating capacity between the vicinity of input and vicinity of output) is not changed. As a result, if the direction of mounting on the board is different, the attenuation characteristics are invariable.

In embodiments 3 and 4, if the number of inner conductors for composing the first and second coils is equal, the impedance values in normal mode are equal, so that directivity does not exist.

When the noise filter in embodiments 3 to 5 of the invention is applied in a pair of signal lines in cellular phone or other wireless communication appliance, the same effects as in embodiment 1 and 2 shown in FIGS. 15(a), (b), (c) are obtained.

(Embodiment 6)

A common mode noise filter in embodiment 6 of the invention is explained by referring to the drawings.

Figure 30:
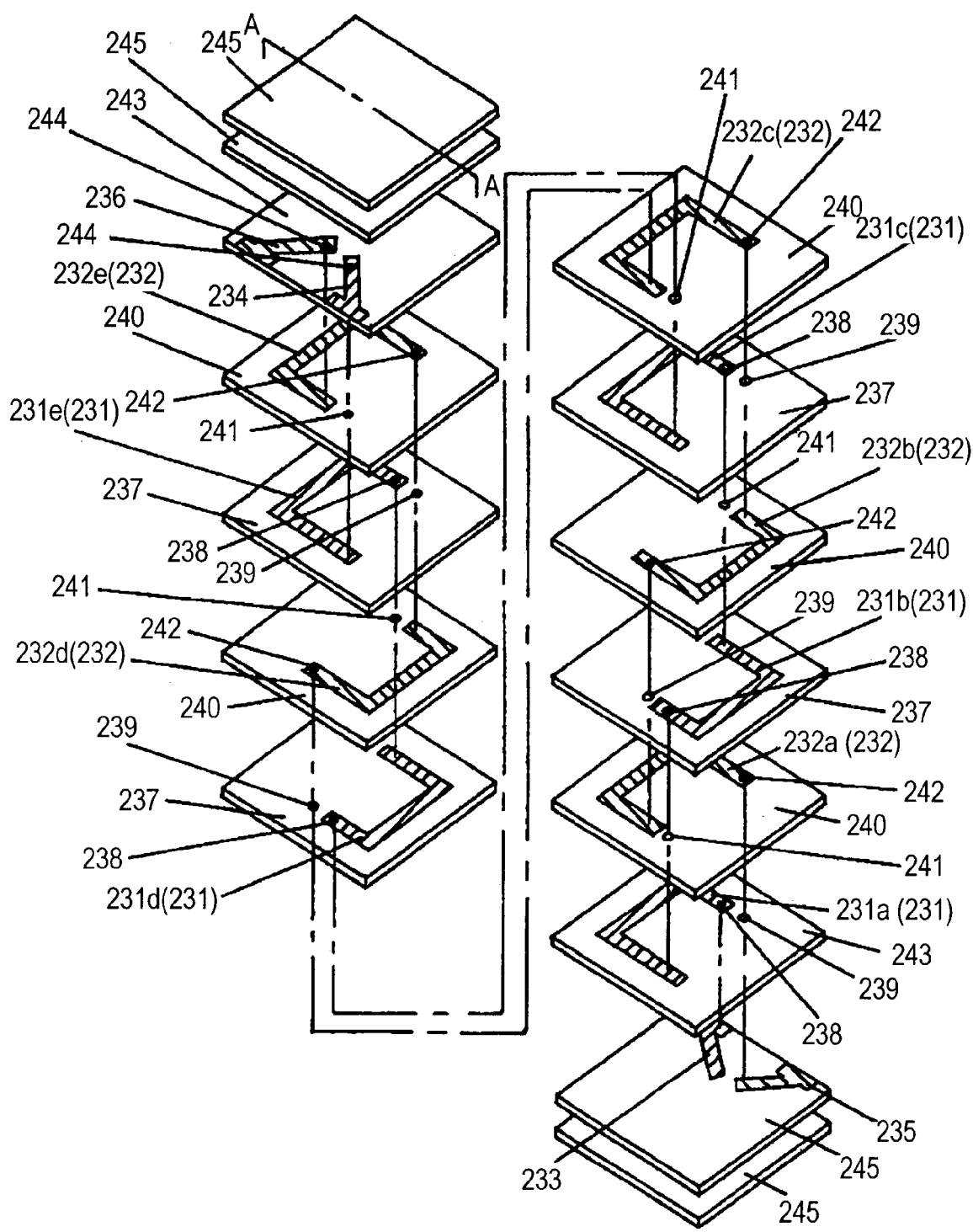
FIG. 30 is a perspective exploded view of common mode noise filter in embodiment 6 of the invention.
Figure 31A:
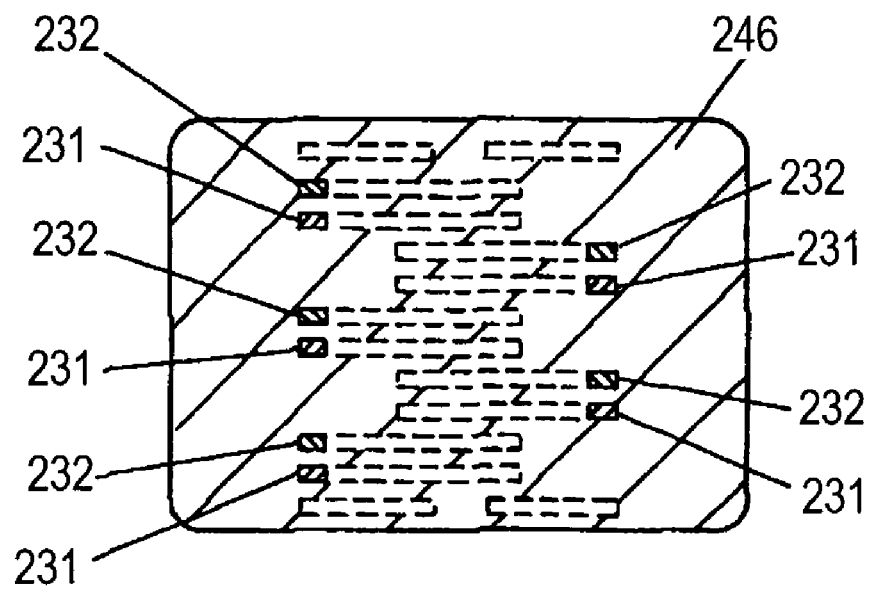
FIG. 31(a) is a sectional view of line A—A.
Figure 31B:
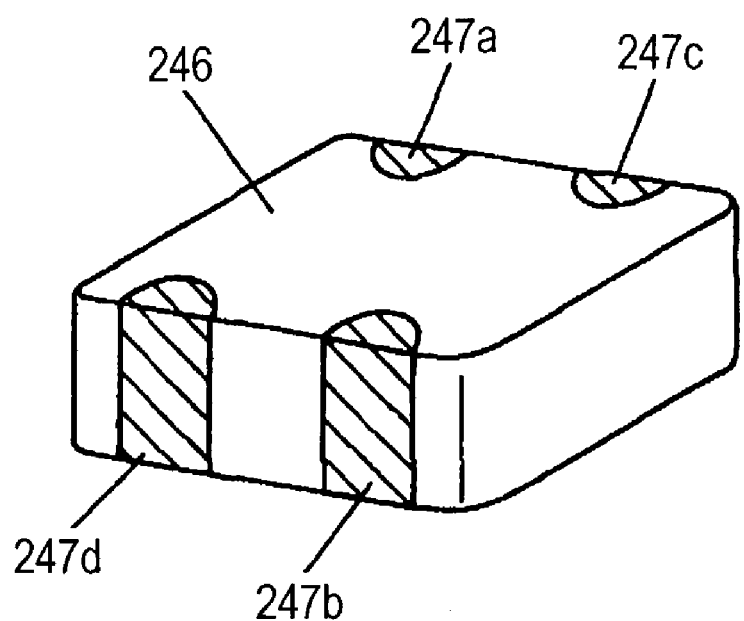
FIG. 31(b) is a perspective view thereof.

FIG. 30 is a perspective exploded view of the common mode noise filter in embodiment 6 of the invention, FIG. 31(a) is a sectional view of line A—A of the same, and FIG. 31(b) is a perspective view thereof.

In FIG. 30 and FIG. 31, a spiral first coil 231 is formed by laminating and connecting first inner conductors 231a to 231e sequentially from the bottom. A spiral second coil 232 is formed by laminating and connecting second inner conductors 232a to 232e sequentially from the bottom. That is, the first and second coils 231, 232 are composed of five layers. However, the first and second coils 231, 232 are not limited to five-layer structure. The first inner conductors 231a to 231e and second inner conductor 232a to 232e are made of silver or other conductive material.

Herein, the first inner conductors 231a to 231e and second inner conductors 232a to 232e are formed alternately.

That is, the first inner conductor 231a, second inner conductor 232a, first inner conductor 231b, second inner conductor 232b, first inner conductor 231c, second inner conductor 232c, first inner conductor 231d, second inner conductor 232d, first inner conductor 231e, and second inner conductor 232e are sequentially formed from the bottom.

The spiral first coil 231 formed by laminating the first inner conductors 231a to 231e and the spiral second coil 232 formed by laminating the second inner conductors 232a to 232e are formed to overlap with each other in a top view of a magnetic member 246 described below.

The first inner conductors 231a to 231e and second inner conductors 232a to 232e are formed in a nearly U-shape.

By forming in a nearly U-shape, a coil of one turn is formed by laminating the inner conductors by two layers only, and the number of layers may be smaller. As a result, the size is reduced, and the distance of adjacent inner conductors is closer in each inner conductor for forming the coil, so that the magnetic fluxes generated in the first and second coils 231, 232 can reinforce each other.

Beneath the lowest layer 231a of the first inner conductors 231a to 231e, a first leading-out electrode 233 for connecting with the end of the first coil 231 is formed, and above the highest layer 231e, a second leading-out electrode 234 for connecting with the other end of the first coil 231 is formed. Similarly, in the second inner conductors 232a, 232e, third and fourth leading-out electrodes 235, 236 are formed.

The leading-out electrodes 233, 234, 235, 236 may be also formed at four corners of the magnetic member 246 in a top view of the magnetic member 246.

A plurality of square first magnetic sheets 237 are formed beneath the first inner conductors 231b to 231e, and are provided with a first via hole 238 and a second via hole 239. The first via hole 238 is connected to each end of the first inner conductors 231a to 231e, and is electrically insulated from the second via hole 239.

The second via hole 239 is formed to overlap with the first and second coils 231, 231 in a top view of the magnetic member 246.

A plurality of square second magnetic sheets 240 are formed beneath the second inner conductors 232a to 232e, and are provided with a third via hole 241 and a fourth via hole 242. The fourth via hole 242 is connected to each end of the second inner conductors 232a to 232e, and is electrically insulated from the third via hole 241.

The third via hole 241 is formed to overlap with the first and second coils 231, 232 in a top view of the magnetic member 246.

At this time, the first inner conductors 231a to 231e are connected through the first via hole 238 and third via hole 241, and the spiral first coil 231 is obtained. Similarly, the second inner conductors 232a to 232e are connected through the second via hole 239 and fourth via hole 242, and the spiral second coil 232 is obtained.

That is, the second via hole 239 is formed in the first magnetic sheet 237 having the first via hole 238 beneath the first inner conductor 231b. The first inner conductor 231b is connected to the first inner conductor 231a through the first via hole 238 and third via hole 241 provided in the second magnetic sheet 240 further beneath it (above the first inner conductor 231a), and the second inner conductor 232b is connected to the second inner conductor 232a through the second via hole 239 and fourth via hole 242 provided in the second magnetic sheet 240 further above it (beneath the second inner conductor 232b).

The first inner conductors 231a to 231e and at least one of the second inner conductors 232a to 232e adjacent to the first inner conductors 231a to 231e are formed to nearly overlap in a top view of the magnetic member 246.

That is, each pair of first inner conductor 231a and second inner conductor 232a, first inner conductor 231b and second inner conductor 232b, first inner conductor 231c and second inner conductor 232c, first inner conductor 231d and second inner conductor 232d, and first inner conductor 231e and second inner conductor 232e are provided to overlap in a top view of the magnetic member 246 (except for the formed portions of the via holes 238, 239, 241, 242).

A plurality of square third magnetic sheets 243 are formed beneath the first inner conductor 231a and above the second inner conductors 232e. Beneath the third magnetic sheet 243 formed beneath the first inner conductor 231a, first and third leading-out electrodes 233, 235 are provided, and above the third magnetic sheet 243 formed above the second inner conductor 231e, second and fourth leading-out electrodes 234, 236 are provided.

A fifth via hole 244 is provided in the third magnetic sheet 243 formed on the top of the second inner conductor 232e, and the second inner conductor 232e and fourth leading-out electrode 236, and the first inner conductor 231e and (through the third via hole 241) second leading-out electrode 234 are connected with each other respectively through the fifth via hole 244.

Further, first and second via holes 238, 239 are provided in the third magnetic sheet 243 formed beneath the first inner conductor 231a, and the first inner conductor 231a and first leading-out electrode 233, and the second inner conductor 232a and (through the second via hole 239) third leading-out electrode 235 are connected with each other respectively through the first and second via holes 238, 239.

A specified number of fourth magnetic sheets 245 are formed beneath the first and third leading-out electrodes 233, 235, and above the second and fourth leading-out electrodes 234, 236.

Magnetic sheets 237, 240, 243, 245 are composed of a mixture of oxide of ferrite powder and resin, and a flat square magnetic member 246 is formed by laminating them in the vertical direction as described above. The magnetic member 246 may also have a certain thickness, not being limited to be flat. Or the magnetic member 246 is not always required to be square. The thickness may be adjusted properly depending on the required characteristics (impedance, withstand voltage, etc.), and the thickness may be adjusted by varying the thickness of the magnetic sheet itself, or by changing the number of magnetic sheets to be formed.

The magnetic member 246 is impregnated with fluorine silane coupling agent, and the water-repellent fluorine silane coupling agent permeates into fine pores in the magnetic member 246, so that the humidity resistance of the noise filter can be enhanced.

Of the external electrodes 247a, 247b, 247c, 247d formed at both ends of the magnetic member 246, 247a and 247c are formed at one end of the magnetic member 246, and 247b and 247d are formed at other end of the magnetic member 246. The external electrodes 247a, 247b, 247c, 247d are plated with low melting metal such as nickel, tin or solder on the surface of the conductors of silver or the like.

The external electrodes 247a, 247b, 247c, 247d may be also formed at four corners of the magnetic member 246 in a top view of the magnetic member 246.

The first leading-out electrode 233 and second leading-out electrode 234 connected to both ends of the first coil 231 are electrically connected to the external electrode 247a and external electrode 247b, respectively.

Similarly, in the second coil 232, the third leading-out electrode 235 is electrically connected to the external electrode 247c, and the fourth leading-out electrode 236 to the external electrode 247d.

In the common mode noise filter in embodiment 6 of the invention having such configuration, the manufacturing method is explained below by referring to the drawings.

FIGS. 32(a) to (c), and FIGS. 33(a) to (d) are perspective views showing the manufacturing method of the common mode noise filter in embodiment 6 of the invention.

First, from a mixture of oxide of ferrite powder and resin, square first magnetic sheet 237, second magnetic sheet 240, third magnetic sheet 243, and fourth magnetic sheet 245 are fabricated.

Figure 32A:
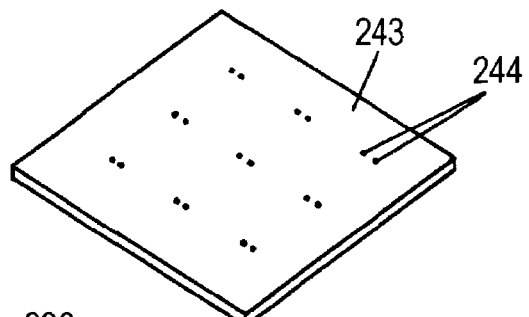
FIGS. 32(a) to (c) are perspective views showing the manufacturing method.

Next, as shown in FIG. 32(a), a fifth via hole 244 is opened in a specified position of the third magnetic sheet 243 by laser, punching or other drilling process.

Similarly, first and second via holes 238, 239 are provided at specified positions of the first magnetic sheet 237. Third and fourth via holes 241, 242 are provided at specified positions of the second magnetic sheet 240, and first and second via holes 238, 239 are provided at specified positions of the third magnetic sheet 243.

Figure 32B:
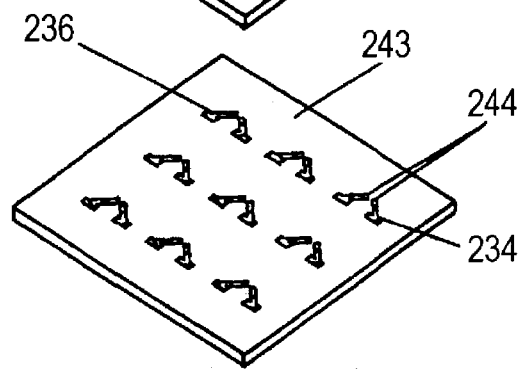

As shown in FIG. 32(b), second leading-out electrode 234 and fourth leading-out electrode 236 are formed on the third magnetic sheet 243 having the fifth via hole 244. At the same time, the fifth via hole 244 is filled with silver or other conductive material.

The first inner conductor 231a is printed on the third magnetic sheet 243 having the first via hole 238 and second via hole 239. The first via hole 238 and first leading-out electrode 233 are connected to the second via hole 239 and third leading-out electrode 235. At the same time, the first via hole 238 and second via hole 239 are filled with silver or other conductive material.

The second inner conductor 232a is printed on the second magnetic sheet 240. The end of the second inner conductor 232a and the fourth via hole 242 are connected. At the same time, the third via hole 241 and fourth via hole 242 are filled with silver or other conductive material.

The first inner conductor 231b is printed on the first magnetic sheet 237. The end of the first inner conductor 231b and the first via hole 238 are connected. At the same time, the first via hole 238 and second via hole 239 are filled with silver or other conductive material.

The first and third leading-out electrodes 233, 235 are printed on the fourth magnetic sheet 245.

Figure 32C:
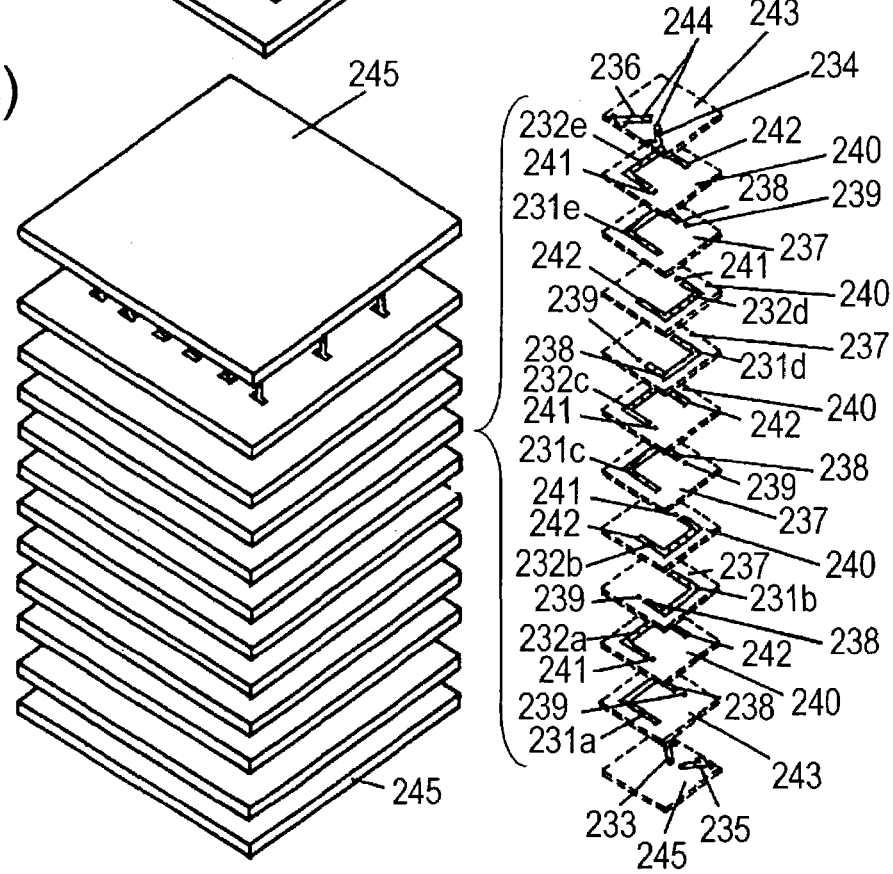

Same as above, the plurality of first magnetic sheets 237 and second magnetic sheets 240 are alternately laminated, and set in configuration as shown in FIG. 32(c). A specified number of fourth magnetic sheets 245 are formed beneath the first and third leading-out electrodes 233, 235, and above the second and fourth leading-out electrodes 234, 236.

At this time, by the first via hole 238 formed in the first magnetic sheet 237 and the third via hole 241 formed in the second magnetic sheet 240, the first inner conductors 231a to 231e are connected, and the first coil 231 is obtained. By the second via hole 239 formed in the first magnetic sheet 237 and the fourth via hole 242 formed in the second magnetic sheet 240, the second inner conductors 232a to 232e are connected, and the second coil 232 is obtained.

Through the fifth via hole 244 formed in the third magnetic sheet 243, the second inner conductor 232e and fourth leading-out electrode 236, and the first inner conductor 231e and (through the third via hole 241) second leading-out electrode 234 are connected respectively.

Further, through the first via hole 238 formed in the third magnetic sheet 243, the first inner conductor 231a and first leading-out electrode 233 are connected with each other, and the through the fourth via hole 242 formed beneath the second magnetic sheet 240, the second inner conductor 232a and (through the second via hole 239) third leading-out electrode 235 are connected with each other.

The inner conductors and leading-out electrodes may be formed not only by printing, but also by plating, vapor deposition, sputtering or other method.

Figure 33A:
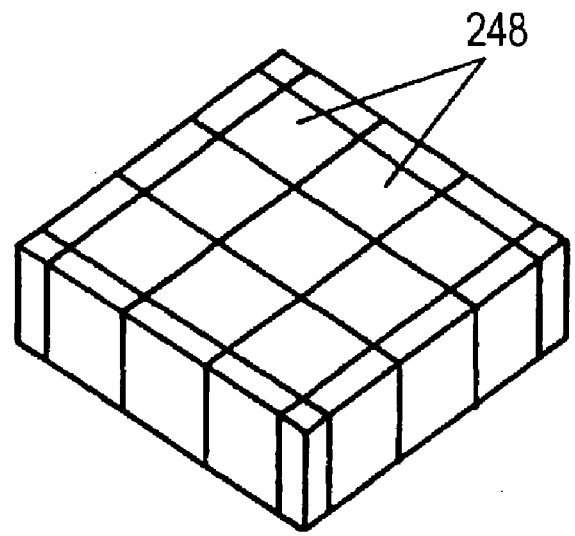
FIGS. 33(a) to (d) are perspective views showing the manufacturing method.
Figure 33B:
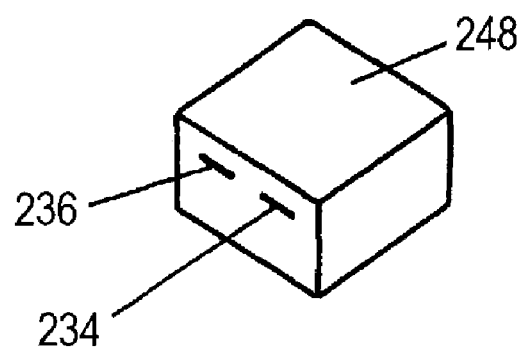

Next, as shown in FIG. 33(a), by cutting off so that the first coil 231 and second coil 232 may be incorporated by one piece each in one common mode noise filter, one laminated body 248 is obtained as shown in FIG. 33(b). At this time, the first leading-out electrode 233 and third leading-out electrode 235 are exposed from both ends of the laminated body 248, and the second leading-out electrode 234 and fourth leading-out electrode 236 are exposed at other ends.

This laminated body 248 is baked, and a magnetic member 246 is formed.

Figure 33C:
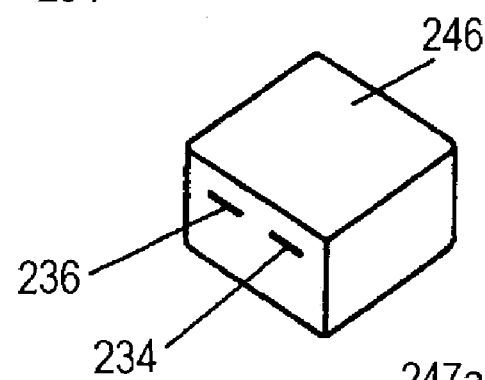

The magnetic member 246 is chamfered as shown in FIG. 33(c).

Figure 33D:
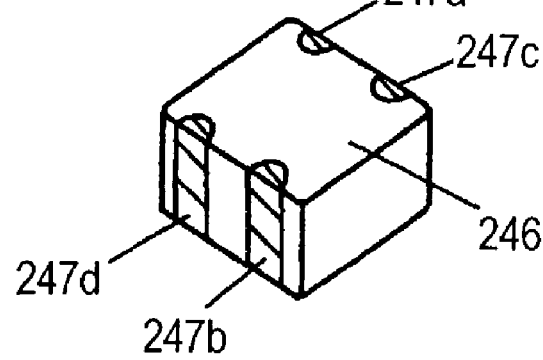

Finally, as shown in FIG. 33(d), silver or other conductors are formed in the leading-out electrodes 233, 234, 235, 236 exposed at both ends of the magnetic member 246, and their surfaces are plated with low melting metal such as nickel, tin or solder, and the external electrode 247a is formed in the first leading-out electrode 233, external electrode 247b is formed in the second leading-out electrode 234, external electrode 247c is formed in the third leading-out electrode 235, and external electrode 247d is formed in the fourth leading-out electrode 236, so that the common mode noise filter in embodiment 6 of the invention is manufactured.

After forming silver or other conductors, and before nickel plating, the magnetic member 246 is impregnated in fluorine silane coupling agent in decompressed atmosphere.

In the common mode noise filter in embodiment 6 of the invention, since the first coil 231 and second coil 232 overlap in a top view of the magnetic member 246, and the first inner conductors 231a to 231e and at least one of the second inner conductors 232a to 232e adjacent to these first inner conductors 231a to 231e are designed to overlap nearly in a top view of the magnetic member 246, if a current flows in a same direction in the first coil 231 and second coil 232 (clockwise or counterclockwise in a top view of the magnetic member), the magnetic fluxes generated in the first inner conductors 231a to 231e and second inner conductors 232a to 232e reinforce each other, and further the magnetic fluxes generated in the adjacent first inner conductors 231a to 231e and second inner conductors 232a to 232e reinforce each other, in particular. As a result, the impedance in common mode can be further enhanced.

Therefore, when a current flows in a same direction in the first coil 231 and second coil 232, the impedance in first inner conductors 231a to 231e and second inner conductors 232a to 232e becomes higher, and these inner conductors decrease the noise in common mode.

Further, since the second via hole 239 and third via hole 241 are formed to overlap with the first and second coils 231, 232 in a top view of the magnetic member 246, the second via hole 239 and (vertically) connected second inner conductors 232a to 232e can overlap with the first coil 231 composed of the first inner conductors 231a to 231e in a top view of the magnetic member 246. Similarly, the third via hole 241 and (vertically) connected first inner conductors 231a to 231e can overlap with the second coil 232 composed of the second inner conductors 232a to 232e in a top view of the magnetic member 246. Thus, the first and second coils 231, 232 always overlap in a top view of the magnetic member 246, so that the impedance in common mode may be effectively enhanced. On the other hand, if the second via hole 239 and third via hole 241 do not overlap with the first and second coils 231, 232 in a top view of the magnetic member 246, the second via hole 239 and (vertically) connected second inner conductors 232a to 232e, and the third via hole 241 and (vertically) connected first inner conductors 231a to 231e do not overlap with the first and second coils 231, 232 in a top view of the magnetic member 246, near the connection area of the second via hole 239 and third via hole 241 in the inner conductors 231a to 231e, 232a to 232e.

Of course, since the first via hole 238 and fourth via hole 242 are connected to the ends of the inner conductors 231a to 231e, 232a to 232e, they overlap with the first and second coils 231, 232 in a top view of the magnetic member 246.

By equalizing the length of the first and second coils 231, 232 including the leading-out electrodes 233 to 236, the impedance values in the first and second coils 231, 232 may be equalized.

A method of using the common mode noise filter in embodiment 6 of the invention in a pair of signal lines in a cellular phone or other wireless communication device as an example of electronic appliance is explained below.

Signal lines of communication wires such as a headset of a cellular phone, for example, are usually composed of a pair of cables (signal lines), and since the high frequency signal such as carrier of cellular phone is superposed on the cable as radiation noise in normal mode and common mode, the effect of noise is likely to appear. For example, the radiation noise superposed in common mode may appear as noise of audio signal.

Audio and other signals are disturbed by high frequency noise of common mode because the low frequency components in the signal are detected and superposed by the nonlinear element and electrostatic capacity in the circuit.

Figure 34A:
FIG. 34(a) is a diagram showing a waveform of carrier in a pair of signal lines in a cellular phone.

For example, as shown in FIG. 34(a), when the carrier 900 MHz (TDMA carrier) in the transmission and reception circuit of a cellular phone of TDMA system is transmitted and received at 217 Hz (burst frequency), 217 Hz is detected, and is superposed on the audio signal in normal mode, and audible noise is heard. Therefore, if the induced current in common mode can be suppressed, noise of audio output or the like can be lowered.

Figure 34B:
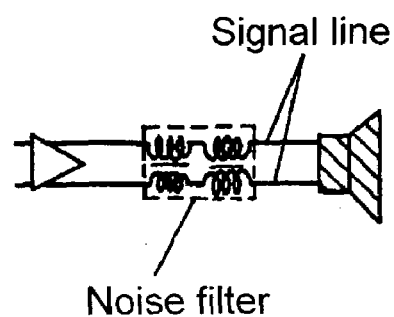
FIG. 34(b) is a diagram showing an example of the manner of use of the common mode noise filter in embodiment 6 of the invention.

An example of use of the common mode noise filter in embodiment 6 of the invention is shown in FIG. 34(b).

Figure 34C:
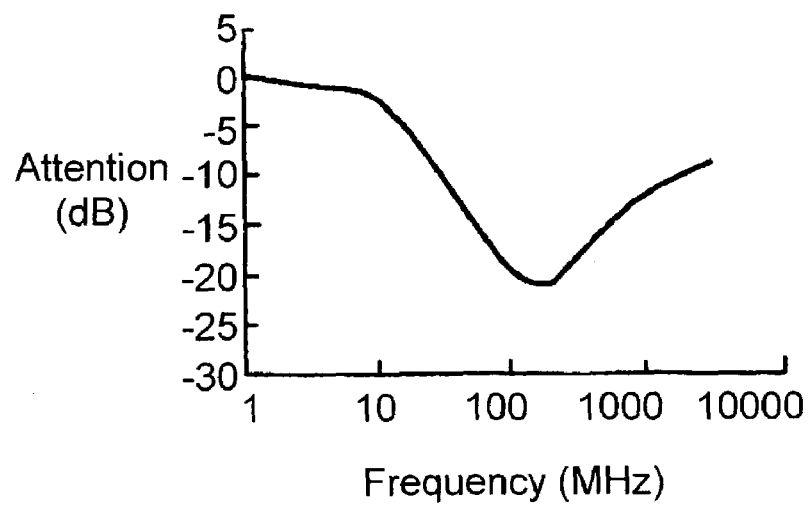
FIG. 34(c) is a diagram showing the relation of frequency and attenuation amount when the common mode noise filter in embodiment 6 is used in a pair of signal lines in a cellular phone.
Figure 35:
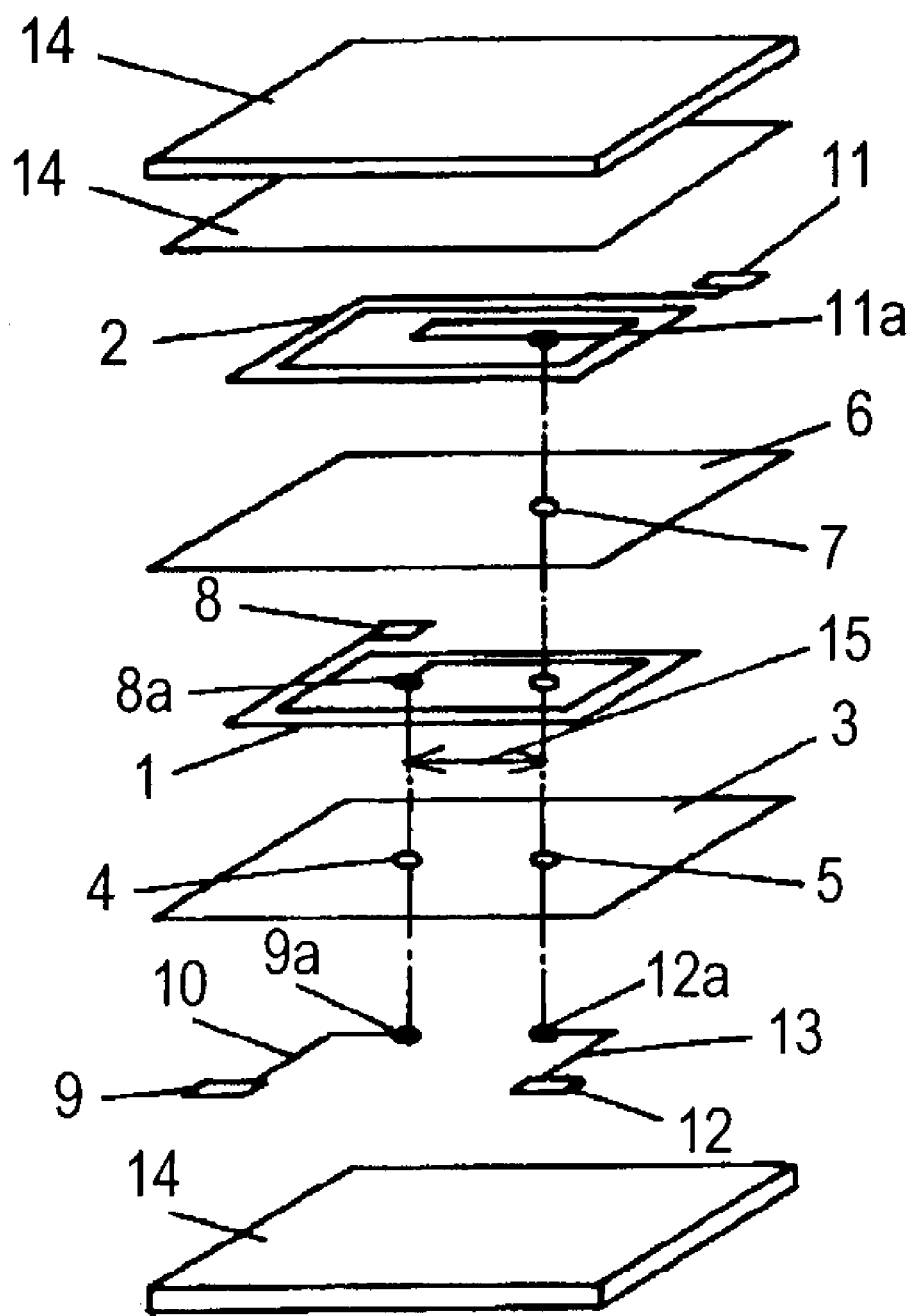
FIG. 35 is a perspective exploded view of a conventional noise filter.
Figure 36:
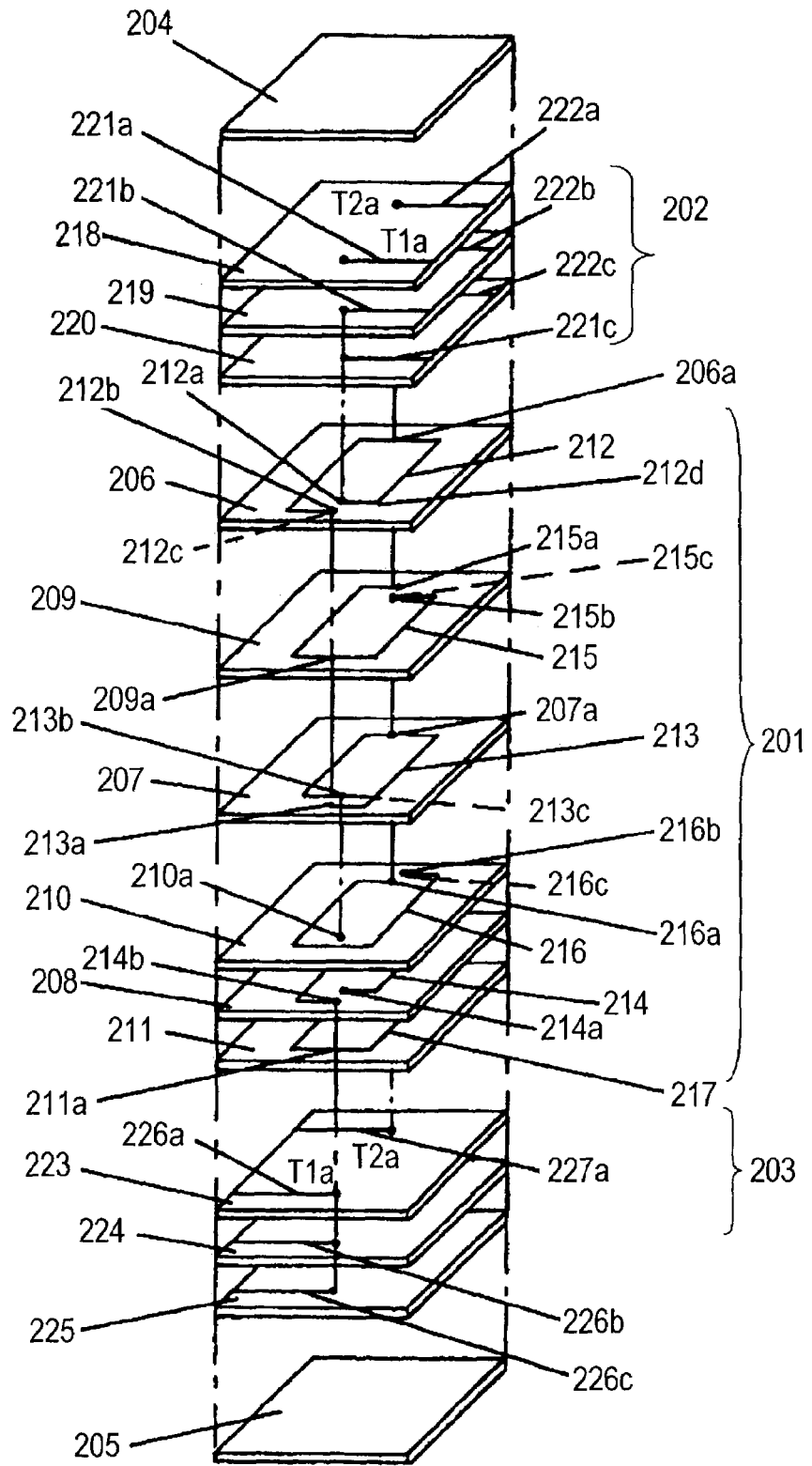
FIG. 36 is a perspective exploded view of a conventional common mode noise filter.

FIG. 34(c) is a diagram showing the attenuation characteristic (relation between frequency and attenuation) of the common mode noise filter in embodiment 6 of the invention.

As clear from FIG. 34(c), even at the carrier 900 MHz of the cellular phone, the common mode noise is attenuated. Therefore, the signal of repetitive frequency 217 Hz detected together with the carrier 900 MHz can be lowered, so that the audible noise may not be heard.

INDUSTRIAL APPLICABILITY

As described herein, according to the invention, a noise filter high in impedance in common mode and normal mode, and a common mode noise filter high in impedance in common mode can be realized. When they are applied in signal lines in cellular phone or other wireless communication devices, noise can be attenuated. For example, in audio lines as a pair of signal lines, the audible noise can be reduced.

What is claimed is:

1. A noise filter comprising a magnetic member formed by laminating magnetic sheets in a vertical direction, a first impedance element formed in said magnetic member, a second impedance element formed above said first impedance element, and external electrodes formed at both ends of said magnetic member and connected electrically to each end of said first and second impedance elements, wherein said first impedance element includes a first normal impedance element and a first common impedance element connected electrically to said first normal impedance element above said first normal impedance element, said second impedance element includes a second common impedance element and a second normal impedance element connected electrically to said second common impedance element above said second common impedance element, and said first common impedance element and second common impedance element are opposite to each other, and are insulated from each other.

2. A noise filter comprising a magnetic member formed by laminating magnetic sheets in a vertical direction, plural impedance elements formed in said magnetic member, and external electrodes formed at both ends of said magnetic member and connected electrically to each end of said plural impedance elements, wherein each impedance element is formed in vertical direction, the impedance element formed in the lowest layer includes a normal impedance element and a common impedance element connected electrically to said normal impedance element above said normal impedance element, the impedance element formed in the highest layer includes a common impedance element and a normal impedance element connected electrically to said common impedance element above said common impedance element, and other impedance elements have two common impedance elements mutually connected electrically and disposed in vertical direction, and the common impedance elements are opposite to each other and insulated from each other.

3. The noise filter of claim 1, wherein:
said first normal impedance element is a spiral first conductor;
said first common impedance element is a spiral second conductor;
said second coming impedance element is a spiral third conductor;
said second normal impedance element is a spiral fourth conductor;
said second conductor is laminated above said first conductor; and
said fourth conductor is laminated above said third conductor.

4. The noise filter of claim 2, further comprising:
laminated conductors;
the normal impedance element and the common impedance element of the lowest layer are spiral conductors;
the normal impedance element and the common impedance element of the highest layer are spiral conductors; and
the two common impedance elements of the each of the other impedance elements are spiral conductors.

5. The noise filter of claim 3, wherein a distance between the second conductor and the third conductor is longer than 50 µm and shorter than 200 µm.

6. The noise filter of claim 4, wherein a distance between the adjacent conductors not electrically connected is longer than 50 µm and shorter than 200 µm.

7. The noise filter of claim 3, wherein a distance between the first conductor and the second conductor and the distance between the third conductor and the fourth conductor are longer than the distance between the second conductor and the third conductor.

8. The noise filter of claim 3, wherein a material of low permeability is disposed between the first conductor and the second conductor, and between the third conductor and the fourth conductor.

9. The noise filter of claim 1, wherein a length of the conductor between the external electrodes of the first impedance element is the same as a length of the conductor between the external electrodes of the second impedance element.

10. The noise filter of claim 3, wherein a length of the conductor between the external electrodes of the first coil is the same as the length of the conductor between the external electrodes of the second coil.

11. The noise filter of claim 1, wherein a density of the magnetic member between the first common impedance element and the second common impedance element is higher than a density of a remainder of the noise filter.

12. The noise filter of claim 3, wherein a density of the magnetic member between the second conductor and the third conductor is higher than a density in a remainder of the noise filter.

13. The noise filter of claim 1, wherein at least the first common impedance element and the second common impedance element are formed by electrocasting.

14. The noise filter of claim 3, wherein at least the second conductor and the third conductor are formed by electrocasting.

15. The noise filter of claim 1, wherein the first normal impedance element and the first common impedance element, and the second common impedance element and the second normal impedance element are formed so as not to overlap each other in a top view of the magnetic member.

16. The noise filter of claim 3, wherein the first conductor and the second conductor, and the third conductor and the fourth conductor are formed so as not to overlap each other in a top view of the magnetic member.

17. The noise filter of claim 1, wherein the first normal impedance element and the second common impedance element are connected to the external electrode formed at one end of the magnetic member, and the first common impedance element and the second normal impedance element are connected to the external electrode formed at the other end of the magnetic member.

18. The noise filter of claim 3, wherein the first conductor and the third conductor are connected to the external electrode formed at one end of the magnetic member, and the second conductor and the fourth conductor are connected to the external electrode formed at the other end of the magnetic member.

19. An electronic device, wherein the first impedance element and the second impedance element of the noise filter in claim 1 are connected to a pair of signal lines in a wireless communication device.

20. The noise filter of claim 3, wherein a coupling coefficient between the second and third conductor is 0.2 to 0.95.

21. An electronic device, wherein the first conductor, the second conductor, the third conductor and the fourth conductor of the noise filter of claim 3 are connected to a pair of signal lines in a wireless communication device.

22. The noise filter of claim 1, wherein the magnetic member is impregnated with fluorine silane coupling agent.

23. The noise filter of claim 4, wherein a coupling coefficient between the second and third conductor is 0.2 to 0.95.

24. The noise filter of claim 2, wherein the magnetic member comprises a fluorine silane coupling agent.

25. The noise filter of claim 3, wherein the magnetic member comprises a fluorine silane coupling agent.

* * * * *

UNITED STATES PATENT AND TRADEMARK OFFICE
CERTIFICATE OF CORRECTION

PATENT NO. : 6,998,939 B2  Page 1 of 1
APPLICATION NO. : 10/220700
DATED : February 14, 2006
INVENTOR(S) : Nakayama et al.

It is certified that error appears in the above-identified patent and that said Letters Patent is hereby corrected as shown below:

in claim 3, column 38, line 12: replace "coming" with --common--.

Signed and Sealed this

First Day of August, 2006

JON W. DUDAS
*Director of the United States Patent and Trademark Office*